(12) United States Patent
Miyanaga et al.

(10) Patent No.: US 9,443,987 B2
(45) Date of Patent: Sep. 13, 2016

(54) SEMICONDUCTOR DEVICE

(71) Applicant: SEMICONDUCTOR ENERGY LABORATORY CO., LTD., Atsugi-shi, Kanagawa-ken (JP)

(72) Inventors: Akiharu Miyanaga, Kanagawa (JP); Yasuharu Hosaka, Tochigi (JP); Toshimitsu Obonai, Tochigi (JP); Junichi Koezuka, Tochigi (JP); Motoki Nakashima, Kanagawa (JP); Masahiro Takahashi, Kanagawa (JP); Shunsuke Adachi, Kanagawa (JP); Takuya Hirohashi, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 18 days.

(21) Appl. No.: 14/456,069

(22) Filed: Aug. 11, 2014

(65) Prior Publication Data
US 2015/0053971 A1 Feb. 26, 2015

(30) Foreign Application Priority Data
Aug. 23, 2013 (JP) ................. 2013-173958

(51) Int. Cl.
*H01L 29/66* (2006.01)
*H01L 29/10* (2006.01)
(Continued)

(52) U.S. Cl.
CPC .......... *H01L 29/7869* (2013.01); *H01L 29/24* (2013.01); *H01L 29/4908* (2013.01); *H01L 29/78606* (2013.01)

(58) Field of Classification Search
CPC ............... H01L 29/7869; H01L 29/24; H01L 29/4908; H01L 29/78606; H01L 29/66969; H01L 27/3262

USPC ................................................ 257/43, 108
See application file for complete search history.

(56) References Cited

U.S. PATENT DOCUMENTS 5,528,032 A   6/1996 Uchiyama
5,731,856 A   3/1998 Kim et al.
(Continued)

FOREIGN PATENT DOCUMENTS

EP   1737044 A   12/2006
EP   2226847 A   9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Calvin Choi
(74) *Attorney, Agent, or Firm* — Nixon Peabody LLP; Jeffrey L. Costellia

(57) ABSTRACT

In a semiconductor device using a transistor including an oxide semiconductor, a change in electrical characteristics is suppressed and reliability is improved. The semiconductor device includes a gate electrode over an insulating surface; an oxide semiconductor film overlapping with the gate electrode; a gate insulating film that is between the gate electrode and the oxide semiconductor film and in contact with the oxide semiconductor film; a protective film in contact with a surface of the oxide semiconductor film that is an opposite side of a surface in contact with the gate insulating film; and a pair of electrodes in contact with the oxide semiconductor film. The spin density of the gate insulating film or the protective film measured by electron spin resonance spectroscopy is lower than $1\times10^{18}$ spins/cm$^3$, preferably higher than or equal to $1\times10^{17}$ spins/cm$^3$ and lower than $1\times10^{18}$ spins/cm$^3$.

20 Claims, 54 Drawing Sheets

(51) Int. Cl.
*H01L 29/12* (2006.01)
*H01L 29/786* (2006.01)
*H01L 29/24* (2006.01)
*H01L 29/49* (2006.01)

(56) References Cited

U.S. PATENT DOCUMENTS

| | | | |
|---|---|---|---|
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2012/0064665 A1* | 3/2012 | Yamazaki | H01L 21/02422 438/104 |
| 2012/0138922 A1* | 6/2012 | Yamazaki | H01L 29/7869 257/43 |
| 2013/0264563 A1 | 10/2013 | Okazaki et al. | |
| 2013/0270549 A1 | 10/2013 | Okazaki et al. | |
| 2013/0270550 A1 | 10/2013 | Okazaki et al. | |
| 2014/0030845 A1 | 1/2014 | Koezuka et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2009-224479 A | 10/2009 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

(56) References Cited

OTHER PUBLICATIONS

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Display", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H at al., "Temperature Dependence of Characteristics and Electronics Structure for Amorphous In—Ga—Zn-Oxide TFT", AM-FPD '09 Digest of Technical Papers, Jul. 1, 2009, pp. 41-44.

Hayashi.R et al., "42.1: Invited Papers: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects In ZnO", Phys. Rev. B (Physical Review. B), Oct. 4, 2007, vol. 76, No. 16, pp. 165202-1-165202-22.

Janotti.A et al., "Oxygen Vacancies In ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 As a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDE '6 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008,vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In, Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

(56) References Cited

OTHER PUBLICATIONS

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Supressed Voltage Loss for White TANDEM OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of GIZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

|  | charge : +1 | charge:neutral | charge : −1 |
|---|---|---|---|
| d(N-O) [Å] | 1.109(1.154) | 1.178(1.197) | 1.241(1.236) |
| ∠O-N-O [°] | 178.81(180) | 133.65(134) | 110.34(115) |

※ ( ) is the reference value of NO₂ molecule in a gaseous state.

|  | charge:+1 | charge:neutral | charge:−1 |
|---|---|---|---|
| d(N-N)[Å] | 1.191 | 1.105(1.126) | 1.163 |
| d(N-O)[Å] | 1.154 | 1.175(1.186) | 1.310 |
| ∠N-N-O[°] | 174.52 | 172.81(180) | 130.71 |

※ ( ) is the reference value of $NO_2$ molecule in a gaseous state.

● In  ○ Ga  ○ Zn  ● O  ● H

- : In
- : Ga
- : Zn
- : O
- : C $(CO)_O$ defect

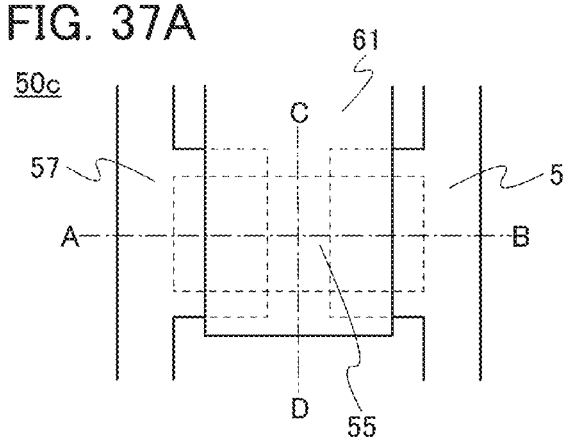
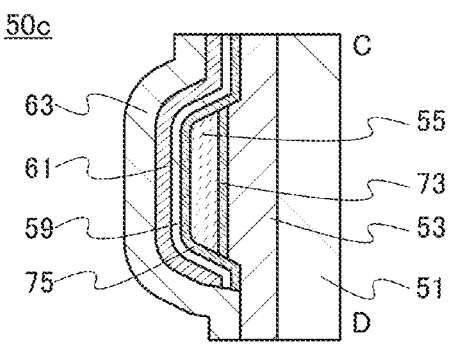
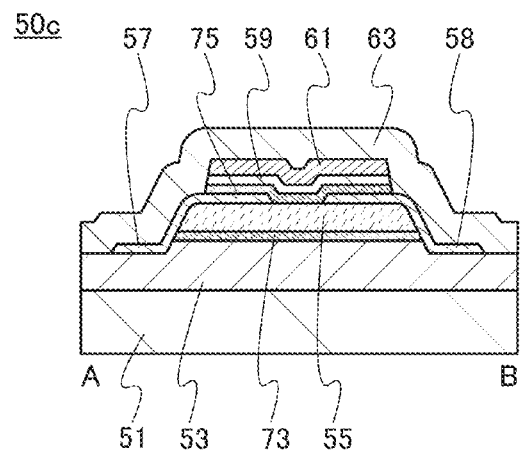

FIG. 44A sample A1
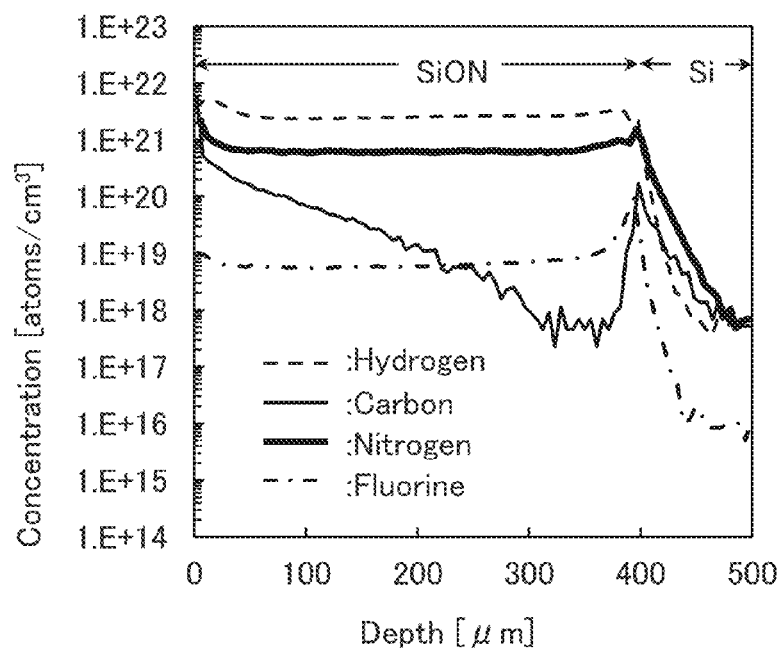
FIG. 44B sample A2
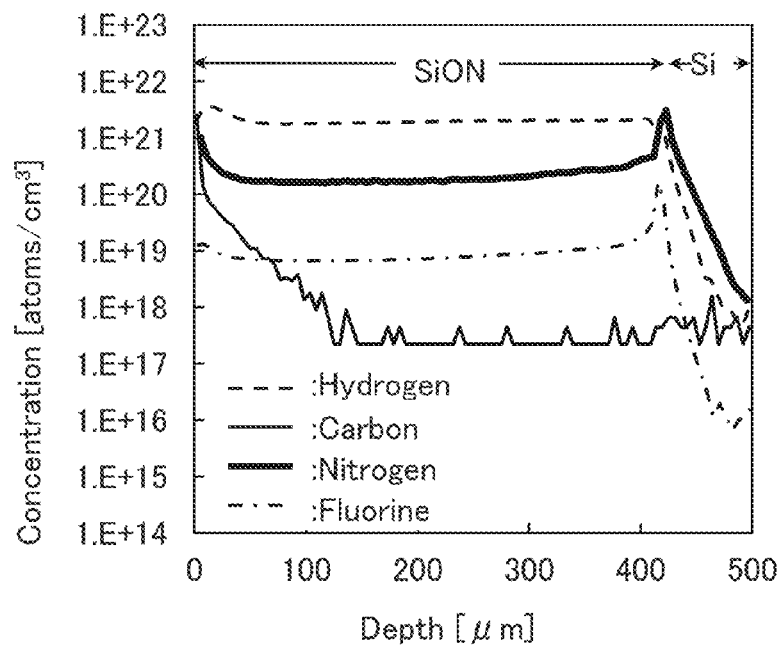

SEMICONDUCTOR DEVICE

BACKGROUND OF THE INVENTION

1. Field of the Invention

The present invention relates to an object, a method, or a manufacturing method. In addition, the present invention relates to a process, a machine, manufacture, or a composition of matter. In particular, the present invention relates to a semiconductor device, a display device, a light-emitting device, a power storage device, a driving method thereof, or a manufacturing method thereof. Furthermore in particular, the present invention relates to a semiconductor device including a field-effect transistor.

In this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

2. Description of the Related Art

Transistors used for most flat panel displays typified by a liquid crystal display device and a light-emitting display device are formed using silicon semiconductors such as amorphous silicon, single crystal silicon, and polycrystalline silicon provided over glass substrates. Further, such a transistor employing such a silicon semiconductor is used in integrated circuits (ICs) and the like.

In recent years, attention has been drawn to a technique in which, instead of a silicon semiconductor, a metal oxide exhibiting semiconductor characteristics is used in transistors. Note that in this specification, a metal oxide exhibiting semiconductor characteristics is referred to as an oxide semiconductor.

For example, a technique is disclosed in which a transistor is manufactured using zinc oxide or an In—Ga—Zn-based oxide as an oxide semiconductor and the transistor is used as a switching element or the like of a pixel of a display device (see Patent Documents 1 and 2).

It has been pointed out that hydrogen is a supply source of carriers particularly in an oxide semiconductor. Therefore, some measures need to be taken to prevent hydrogen from entering the oxide semiconductor at the time of forming the oxide semiconductor. Further, variation in a threshold voltage is suppressed by reducing the amount of hydrogen contained in the oxide semiconductor film or a gate insulating film in contact with the oxide semiconductor (see Patent Document 3).

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2009-224479

SUMMARY OF THE INVENTION

However, nitrogen becomes a source for supplying carriers in a similar manner to hydrogen. Thus, when a large amount of nitrogen is contained in a film in contact with an oxide semiconductor film, the electrical characteristics, typically the threshold voltage, of a transistor including the oxide semiconductor film is changed. Further, there is a problem in that electrical characteristics vary among the transistors.

It is one object of one embodiment of the present invention to suppress a change in electrical characteristics and to improve reliability in a semiconductor device using a transistor including an oxide semiconductor. It is another object of one embodiment of the present invention to provide a semiconductor device with low power consumption. A yet still further object of one embodiment of the present invention is to provide a novel semiconductor device.

One embodiment of the present invention is a semiconductor device including a gate electrode over an insulating surface; an oxide semiconductor film overlapping with the gate electrode; a gate insulating film that is between the gate electrode and the oxide semiconductor film and in contact with the oxide semiconductor film; a protective film in contact with a surface of the oxide semiconductor film that is an opposite side of a surface in contact with the gate insulating film; and a pair of electrodes in contact with the oxide semiconductor film. The spin density of the gate insulating film or the protective film measured by electron spin resonance (ESR) spectroscopy is lower than $1 \times 10^{18}$ spins/cm$^3$, preferably higher than or equal to $1 \times 10^{17}$ spins/cm$^3$ and lower than $1 \times 10^{18}$ spins/cm$^3$.

In an electron spin resonance spectrum of the gate insulating film or the protective film, a first signal that appears at a g-factor of greater than or equal to 2.037 and smaller than or equal to 2.039, a second signal that appears at a g-factor of greater than or equal to 2.001 and smaller than or equal to 2.003, and a third signal that appears at a g-factor of greater than or equal to 1.964 and smaller than or equal to 1.966 are observed. The split width of the first and second signals and the split width of the second and third signals that are obtained by measurement using an X-band are each approximately 5 mT.

In the electron spin resonance spectrum of the gate insulating film or the protective film, a signal attributed to nitrogen oxide is observed. The nitrogen oxide contains nitrogen monoxide or nitrogen dioxide.

The protective film, the oxide semiconductor film, and the gate insulating film may be provided between the insulating surface and the gate electrode. Alternatively, the gate electrode and the gate insulating film may be provided between the insulating surface and the oxide semiconductor film.

The pair of electrodes may be provided between the oxide semiconductor film and the protective film. Alternatively, the pair of electrodes may be provided between the oxide semiconductor film and the gate insulating film.

With one embodiment of the present invention, a change in the electrical characteristics of a transistor including an oxide semiconductor film is suppressed and reliability can be improved. Further, according to one embodiment of the present invention, a semiconductor device with less power consumption can be provided. According to one embodiment of the present invention, a novel semiconductor device can be provided.

BRIEF DESCRIPTION OF THE DRAWINGS

FIGS. 37A to 37C are a top view and cross-sectional views illustrating one embodiment of a transistor.

FIGS. 44A and 44B show results of SIMS analysis.

DETAILED DESCRIPTION OF THE INVENTION

Figure 1A:
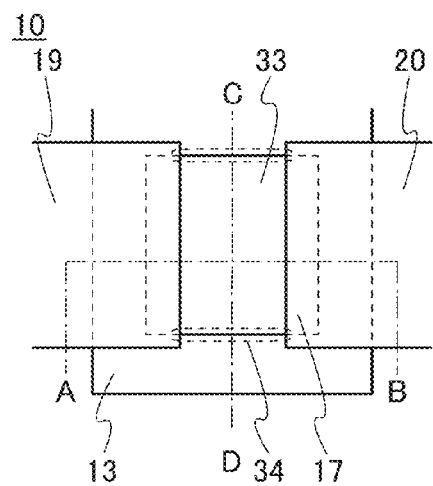
FIGS. 1A to 1C are a top view and cross-sectional views illustrating one embodiment of a transistor.

Embodiments of the present invention are described below in detail with reference to the drawings. Note that the present invention is not limited to the following description, and it is easily understood by those skilled in the art that the mode and details can be variously changed without departing from the spirit and scope of the present invention. Therefore, the present invention should not be construed as being limited to the description in the following embodiments and examples. In addition, in the following embodiments and examples, the same portions or portions having similar functions are denoted by the same reference numerals or the same hatching patterns in different drawings, and description thereof is not repeated.

Note that in each drawing described in this specification, the size, the film thickness, or the region of each component is exaggerated for clarity in some cases. Therefore, embodiments of the present invention are not limited to such a scale.

In addition, terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" are sometimes replaced with each other when the direction of current flow is changed in circuit operation, for example. Therefore, the terms "source" and "drain" can be used to denote the drain and the source, respectively, in this specification.

Note that a voltage refers to a difference between potentials of two points, and a potential refers to electrostatic energy (electric potential energy) of a unit charge at a given point in an electrostatic field. Note that in general, a difference between a potential of one point and a reference potential (e.g., a ground potential) is merely called a potential or a voltage, and a potential and a voltage are used as synonymous words in many cases. Thus, in this specification, a potential may be rephrased as a voltage and a voltage may be rephrased as a potential unless otherwise specified.

Note that a transistor including an oxide semiconductor film is an n-channel transistor; therefore, in this specification, a transistor that can be regarded as having no drain current flowing therein when a gate voltage is 0 V is defined as a transistor having normally-off characteristics. In contrast, a transistor that can be regarded as having a drain current flowing therein when the gate voltage is 0 V is defined as a transistor having normally-on characteristics.

Embodiment 1

In this embodiment, a semiconductor device of one embodiment of the present invention and a method for manufacturing the semiconductor device are described with reference to drawings. A transistor 10 described in this embodiment has a bottom-gate structure.

<1. Structure of Transistor>

Figure 1C:
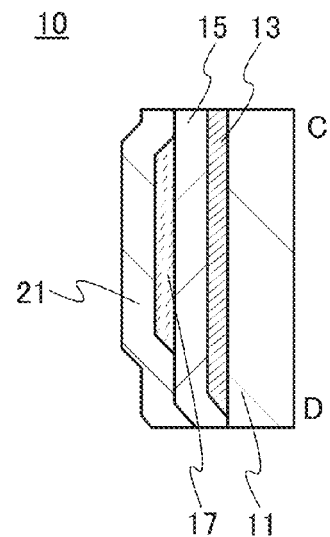
Figure 1B:
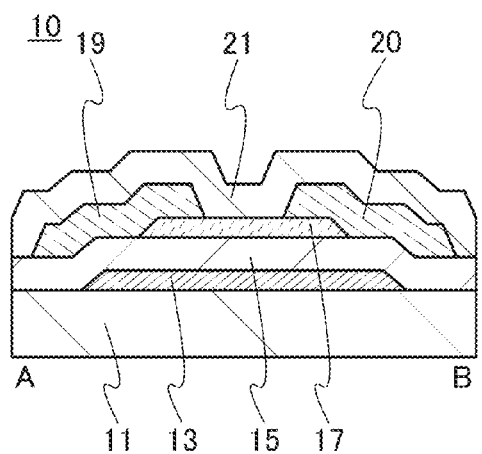

FIGS. 1A to 1C are a top view and cross-sectional views of the transistor 10 included in a semiconductor device. FIG. 1A is a top view of the transistor 10, FIG. 1B is a cross-sectional view taken along dashed-dotted line A-B in FIG. 1A, and FIG. 1C is a cross-sectional view taken along dashed-dotted line C-D in FIG. 1A. Note that in FIG. 1A, a substrate 11, a gate insulating film 15, a protective film 21, and the like are omitted for simplicity.

The transistor 10 illustrated in FIGS. 1A to 1C includes a gate electrode 13 over the substrate 11, the gate insulating film 15 over the substrate 11 and the gate electrode 13, an oxide semiconductor film 17 overlapping with the gate electrode 13 with the gate insulating film 15 therebetween, and a pair of electrodes 19 and 20 in contact with the oxide semiconductor film 17. The protective film 21 is formed over the gate insulating film 15, the oxide semiconductor film 17, and the pair of electrodes 19 and 20.

The protective film 21 is in contact with a surface of the oxide semiconductor film 17 that is an opposite side of a surface in contact with the gate insulating film 15. In other words, the protective film 21 has a function of protecting a region (hereinafter referred to as a back channel region) of the oxide semiconductor film 17 that is on the opposite side of a region where a channel is formed.

In this embodiment, a film in contact with the oxide semiconductor film 17, typically, at least one of the gate insulating film 15 and the protective film 21 is an oxide insulating film containing nitrogen and having a small number of defects.

Typical examples of the oxide insulating film containing nitrogen and having a small number of defects include a silicon oxynitride film and an aluminum oxynitride film. Note that a "silicon oxynitride film" or an "aluminum oxynitride film" refers to a film that contains more oxygen than nitrogen, and a "silicon nitride oxide film" or an "aluminum nitride oxide film" refers to a film that contains more nitrogen than oxygen.

In an ESR spectrum at 100 K or lower of the oxide insulating film with a small number of defects, a first signal that appears at a g-factor of greater than or equal to 2.037 and smaller than or equal to 2.039, a second signal that appears at a g-factor of greater than or equal to 2.001 and smaller than or equal to 2.003, and a third signal that appears at a g-factor of greater than or equal to 1.964 and smaller than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and smaller than or equal to 2.039, the second signal that appears at a g-factor of greater than or equal to 2.001 and smaller than or equal to 2.003, and the third signal that appears at a g-factor of greater than or equal to 1.964 and smaller than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

In the ESR spectrum at 100 K or lower, the first signal that appears at a g-factor of greater than or equal to 2.037 and smaller than or equal to 2.039, the second signal that appears at a g-factor of greater than or equal to 2.001 and smaller than or equal to 2.003, and the third signal that appears at a g-factor of greater than or equal to 1.964 and smaller than or equal to 1.966 correspond to signals attributed to nitrogen oxide (NO$_x$; x is greater than or equal to 0 and smaller than or equal to 2, preferably greater than or equal to 1 and smaller than or equal to 2). Typical examples of nitrogen oxide include nitrogen monoxide and nitrogen dioxide. In other words, when the spin densities of signals that appear at a g-factor of greater than or equal to 1.964 and smaller than or equal to 1.966 to a g-factor of greater than or equal to 2.037 and smaller than or equal to 2.039 are lower, the nitrogen oxide content in an oxide insulating film is lower.

When at least one of the gate insulating film 15 and the protective film 21 in contact with the oxide semiconductor film 17 contains a small amount of nitrogen oxide as described above, the carrier trap at the interface between the oxide semiconductor film 17 and the gate insulating film 15 or the interface between the oxide semiconductor film 17 and the protective film 21 can be inhibited. As a result, a change in the threshold voltage of the transistor included in the semiconductor device can be reduced, which leads to a reduced change in the electrical characteristics of the transistor.

At least one of the gate insulating film 15 and the protective film 21 preferably has a nitrogen concentration measured by secondary ion mass spectrometry (SIMS) of lower than or equal to $6 \times 10^{20}$ atoms/cm$^3$. In that case, nitrogen oxide is unlikely to be generated in at least one of the gate insulating film 15 and the protective film 21, so that the carrier trap at the interface between the oxide semiconductor film 17 and the gate insulating film 15 or the interface between the oxide semiconductor film 17 and the protective film 21 can be inhibited. Furthermore, a change in the threshold voltage of the transistor included in the semiconductor device can be reduced, which leads to a reduced change in the electrical characteristics of the transistor.

The details of other components of the transistor 10 are described below.

There is no particular limitation on the property of a material and the like of the substrate 11 as long as the material has heat resistance enough to withstand at least later heat treatment. For example, a glass substrate, a ceramic substrate, a quartz substrate, or a sapphire substrate may be used as the substrate 11. Alternatively, a single crystal semiconductor substrate or a polycrystalline semiconductor substrate made of silicon, silicon carbide, or the like, a compound semiconductor substrate made of silicon germanium or the like, a silicon on insulator (SOI) substrate, or the like may be used as the substrate 11. Furthermore, any of these substrates further provided with a semiconductor element may be used as the substrate 11.

Alternatively, a flexible substrate may be used as the substrate 11, and the transistor 10 may be provided directly on the flexible substrate. Further alternatively, a separation layer may be provided between the substrate 11 and the transistor 10. The separation layer can be used when part or the whole of a semiconductor device formed over the separation layer is separated from the substrate 11 and transferred onto another substrate. In such a case, the transistor 10 can be transferred to a substrate having low heat resistance or a flexible substrate as well.

A base insulating film may be provided between the substrate 11 and the gate electrode 13. Examples of the base insulating film include a silicon oxide film, a silicon oxynitride film, a silicon nitride film, a silicon nitride oxide film, a gallium oxide film, a hafnium oxide film, an yttrium oxide film, an aluminum oxide film, and an aluminum oxynitride film. Note that when silicon nitride, gallium oxide, hafnium oxide, yttrium oxide, aluminum oxide, or the like is used for the base insulating film, it is possible to suppress diffusion of impurities such as alkali metal, water, and hydrogen from the substrate 11 into the oxide semiconductor film 17.

The gate electrode 13 can be formed using a metal element selected from aluminum, chromium, copper, tantalum, titanium, molybdenum, and tungsten; an alloy containing any of these metal elements as a component; an alloy containing these metal elements in combination; or the like. Further, one or more metal elements selected from manganese and zirconium may be used. The gate electrode 13 may have a single-layer structure or a layered structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, a film, an alloy film, or a nitride film that contains aluminum and one or more elements selected from titanium, tantalum, tungsten, molybdenum, chromium, neodymium, and scandium may be used.

The gate electrode 13 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide containing silicon oxide. It is also possible to have a layered structure formed using the above light-transmitting conductive material and the above metal element.

In the case where the protective film 21 is formed using an oxide insulating film containing nitrogen and having a small number of defects, the gate insulating film 15 can be formed to have a single-layer structure or a stacked-layer structure using, for example, any of silicon oxide, silicon oxynitride, silicon nitride oxide, silicon nitride, aluminum oxide, hafnium oxide, gallium oxide, Ga—Zn-based metal oxide, and the like. Note that an oxide insulating film is preferably used for at least a region of the gate insulating film 15, which is in contact with the oxide semiconductor film 17, in order to improve characteristics of the interface with the oxide semiconductor film 17.

Further, it is possible to prevent outward diffusion of oxygen from the oxide semiconductor film 17 and entry of hydrogen, water, or the like into the oxide semiconductor film 17 from the outside by providing an insulating film having a blocking effect against oxygen, hydrogen, water, and the like for the gate insulating film 15. As the insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and a silicon nitride film can be given as examples.

The gate insulating film 15 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

The thickness of the gate insulating film 15 is greater than or equal to 5 nm and less than or equal to 400 nm, preferably greater than or equal to 10 nm and less than or equal to 300 nm, more preferably greater than or equal to 50 nm and less than or equal to 250 nm.

The oxide semiconductor film 17 is formed using a metal oxide film containing at least In or Zn; as a typical example, an In—Ga oxide film, an In—Zn oxide film, or an In-M-Zn oxide film (M is Al, Ga, Y, Zr, La, Ce, or Nd) can be given.

Note that in the case where the oxide semiconductor film 17 contains an In-M-Zn oxide, the proportion of in and the proportion of M, not taking Zn and O into consideration, are greater than 25 atomic % and less than 75 atomic %, respectively, preferably greater than 34 atomic % and less than 66 atomic %, respectively.

The energy gap of the oxide semiconductor film 17 is 2 eV or more, preferably 2.5 eV or more, further preferably 3 eV or more. With the use of an oxide semiconductor having such a wide energy gap, the off-state current of the transistor 10 can be reduced.

The thickness of the oxide semiconductor film 17 is greater than or equal to 3 nm and less than or equal to 200 nm, preferably greater than or equal to 3 nm and less than or equal to 100 nm, further preferably greater than or equal to 3 nm and less than or equal to 50 nm.

In the case where the oxide semiconductor film 17 contains an In-M-Zn oxide (M represents Al, Ga, Y, Zr, La, Ce, or Nd), it is preferable that the atomic ratio of metal elements of a sputtering target used for forming a film of the In-M-Zn oxide satisfy In≥M and Zn≥M. As the atomic ratio of metal elements of such a sputtering target, In:M:Zn=1:1:1, In:M:Zn=1:1:1.2, and In:M:Zn=3:1:2 are preferable. Note that the atomic ratios of metal elements in the formed oxide semiconductor film 17 vary from the above atomic ratio of metal elements of the sputtering target within a range of ±40% as an error.

Hydrogen contained in the oxide semiconductor reacts with oxygen bonded to a metal atom to be water, and also causes oxygen vacancies in a lattice from which oxygen is released (or a portion from which oxygen is released). Due to entry of hydrogen into the oxygen vacancy, an electron serving as a carrier is generated. Further, in some cases, bonding of part of hydrogen to oxygen bonded to a metal element causes generation of an electron serving as a carrier. Thus, a transistor including an oxide semiconductor that contains hydrogen is likely to be normally on.

Accordingly, it is preferable that hydrogen be reduced as much as possible as well as the oxygen vacancies in the oxide semiconductor film 17. Specifically, in the oxide semiconductor film 17, the hydrogen concentration that is measured by secondary ion mass spectrometry (SIMS) is set to $2\times10^{20}$ atoms/cm$^3$ or lower, preferably $5\times10^{19}$ atoms/cm$^3$ or lower, more preferably $1\times10^{19}$ atoms/cm$^3$ or lower, more preferably $5\times10^{18}$ atoms/cm$^3$ or lower, more preferably $1\times10^{18}$ atoms/cm$^3$ or lower, more preferably $5\times10^{17}$ atoms/cm$^3$ or lower, more preferably $1\times10^{16}$ atoms/cm$^3$ or lower. As a result, the transistor 10 has positive threshold voltage (normally-off characteristics).

When silicon or carbon that is one of elements belonging to Group 14 is contained in the oxide semiconductor film 17, oxygen vacancies are increased in the oxide semiconductor film 17, and the oxide semiconductor film 17 becomes an n-type film. Thus, the concentration of silicon or carbon (the concentration is measured by SIMS) of the oxide semiconductor film 17 is lower than or equal to $2\times10^{18}$ atoms/cm$^3$, preferably lower than or equal to $2\times10^{17}$ atoms/cm$^3$. As a result, the transistor 10 has positive threshold voltage (normally-off characteristics).

Further, the concentration of alkali metal or alkaline earth metal of the oxide semiconductor film 17, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Thus, it is preferable to reduce the concentration of alkali metal or alkaline earth metal of the oxide semiconductor film 17. As a result, the transistor 10 has positive threshold voltage (normally-off characteristics).

Furthermore, when containing nitrogen, the oxide semiconductor film 17 easily becomes an n-type film by generation of electrons serving as carriers and an increase of carrier density. Thus, a transistor including an oxide semiconductor that contains nitrogen is likely to be normally on. For this reason, nitrogen in the oxide semiconductor film is preferably reduced as much as possible; the concentration of nitrogen that is measured by SIMS is preferably set to, for example, lower than or equal to $5\times10^{18}$ atoms/cm$^3$.

When impurities in the oxide semiconductor film 17 are reduced, the carrier density of the oxide semiconductor film 17 can be lowered. The oxide semiconductor preferably has a carrier density of $1\times10^{17}$/cm$^3$ or less, more preferably $1\times10^{15}$/cm$^3$ or less, still more preferably $1\times10^{13}$/cm$^3$ or less, yet more preferably $1\times10^{11}$/cm$^3$ or less.

Note that it is preferable to use, as the oxide semiconductor film 17, an oxide semiconductor film in which the impurity concentration is low and density of defect states is low, in which case the transistor can have more excellent electrical characteristics. Here, the state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, a transistor including the oxide semiconductor film in which a channel region is formed is likely to have positive threshold voltage (normally-off characteristics). A highly purified intrinsic or substantially highly purified intrinsic oxide semiconductor film has a low density of defect states and accordingly has a low trap state in some cases. Further, a highly purified intrinsic or substantially highly purified intrinsic oxide semiconductor film has an extremely low off-state current; the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Thus, the transistor whose channel region is formed in the oxide semiconductor film has a small variation in electrical characteristics and high reliability in some cases.

The oxide semiconductor film 17 may have a non-single-crystal structure, for example. The non-single crystal structure includes a c-axis aligned crystalline oxide semiconductor (CAAC-OS) that is described later, a polycrystalline structure, a microcrystalline structure described later, or an amorphous structure, for example. Among the non-single crystal structure, the amorphous structure has the highest density of defect levels, whereas CAAC-OS has the lowest density of defect levels.

Note that the oxide semiconductor film 17 may be a mixed film including two or more of the following: a region having an amorphous structure, a region having a microcrystalline structure, a region having a polycrystalline structure, a region of CAAC-OS described later, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Further, the mixed film has a stacked-layer structure of two or more of a region having an amorphous structure, a region having a microcrystalline structure, a region having a polycrystalline structure, a CAAC-OS region, and a region having a single-crystal structure in some cases.

The pair of electrodes 19 and 20 is formed with a single-layer structure or a layered structure using any of metals such as aluminum, titanium, chromium, nickel, copper, yttrium, zirconium, molybdenum, silver, tantalum, and tungsten and an alloy containing any of these metals as a main component. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

Note that although the pair of electrodes 19 and 20 is provided between the oxide semiconductor film 17 and the protective film 21 in this embodiment, the pair of electrodes 19 and 20 may be provided between the gate insulating film 15 and the oxide semiconductor film 17.

When the gate insulating film 15 is formed of an oxide insulating film containing nitrogen and having a small number of defects, the protective film 21 can be formed using silicon oxide, silicon oxynitride, Ga—Zn-based metal oxide, or the like.

Further, it is possible to prevent outward diffusion of oxygen from the oxide semiconductor film 17 and entry of hydrogen, water, or the like into the oxide semiconductor film 17 from the outside by providing an insulating film having a blocking effect against oxygen, hydrogen, water, and the like for the protective film 21. As for the insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and a silicon nitride film, can be given as examples.

The thickness of the protective film 21 is preferably greater than or equal to 150 nm and less than or equal to 400 nm.

<2. Method for Manufacturing Transistor>

Next, a method for manufacturing the transistor 10 in FIGS. 1A to 1C is described with reference to FIGS. 2A to 2D. A cross-section in the channel length direction along dot-dashed line A-B in FIG. 1A and a cross-section in the channel width direction along dot-dashed line C-D in FIG. 1A are used in FIGS. 2A to 2D to describe the method for manufacturing the transistor 10.

Figure 2A:
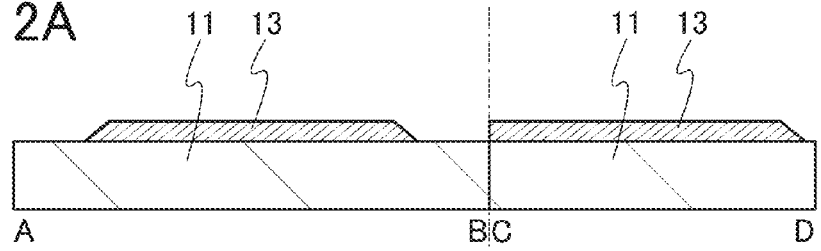
FIGS. 2A to 2D are cross-sectional views illustrating one embodiment of a method for manufacturing a transistor.

As illustrated in FIG. 2A, the gate electrode 13 is formed over the substrate 11.

A formation method of the gate electrode 13 is described below. First, a conductive film is formed by a sputtering method, a CVD method, an evaporation method, or the like and then a mask is formed over the conductive film by a photolithography process. Next, the conductive film is partly etched using the mask to form the gate electrode 13. After that, the mask is removed.

Note that the gate electrode 13 may be formed by an electrolytic plating method, a printing method, an ink jet method, or the like instead of the above formation method.

Here, a 100-nm-thick tungsten film is formed by a sputtering method. Next, a mask is formed by a photolithography process, and the tungsten film is subjected to dry etching with the use of the mask to form the gate electrode 13.

Then, the gate insulating film 15 is formed over the substrate 11 and the gate electrode 13, and the oxide semiconductor film 17 is formed in a region that is over the gate insulating film 15 and overlaps with the gate electrode 13.

The gate insulating film 15 is formed by a sputtering method, a CVD method, an evaporation method, or the like.

In the case of forming a silicon oxide film or a silicon oxynitride film as the gate insulating film 15, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

In the case where a gallium oxide film is formed as the gate insulating film 15, a metal organic chemical vapor deposition (MOCVD) method can be used.

Here, a silicon oxynitride film is formed as the gate insulating film 15 by a plasma CVD method.

Figure 2B:
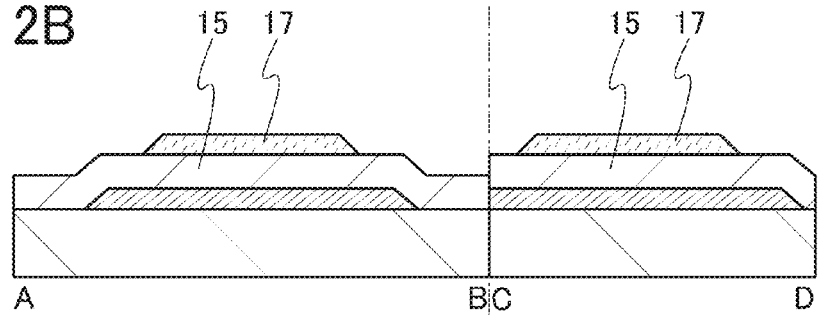

A formation method of the oxide semiconductor film 17 is described below. An oxide semiconductor film is formed over the gate insulating film 15 by a sputtering method, a coating method, a pulsed laser deposition method, a laser ablation method, or the like. Then, after a mask is formed over the oxide semiconductor film by a photolithography process, the oxide semiconductor film is partly etched using the mask. Accordingly, the oxide semiconductor film 17 that is over the gate insulating film 15 and subjected to element isolation so as to partly overlap with the gate electrode 13 is formed as illustrated in FIG. 2B. After that, the mask is removed.

Alternatively, by using a printing method for forming the oxide semiconductor film 17, the oxide semiconductor film 17 subjected to element isolation can be formed directly.

As a power supply device for generating plasma in the case of forming the oxide semiconductor film by a sputtering method, an RF power supply device, an AC power supply device, a DC power supply device, or the like can be used as appropriate.

As a sputtering gas, a rare gas (typically argon), an oxygen gas, or a mixed gas of a rare gas and oxygen is used as appropriate. In the case of the mixed gas of a rare gas and oxygen, the proportion of oxygen to a rare gas is preferably increased.

Further, a target may be appropriately selected in accordance with the composition of the oxide semiconductor film to be formed.

For example, in the case where the oxide semiconductor film is formed by a sputtering method at a substrate temperature higher than or equal to 150° C. and lower than or equal to 750° C., preferably higher than or equal to 150° C. and lower than or equal to 450° C., more preferably higher than or equal to 200° C. and lower than or equal to 350° C., the oxide semiconductor film can be a CAAC-OS film.

For the deposition of the CAAC-OS film, the following conditions are preferably used.

By suppressing entry of impurities into the CAAC-OS film during the deposition, the crystal state can be prevented from being broken by the impurities. For example, the concentration of impurities (e.g., hydrogen, water, carbon dioxide, or nitrogen) that exist in the deposition chamber may be reduced. Furthermore, the concentration of impurities in a deposition gas may be reduced. Specifically, a deposition gas whose dew point is −80° C. or lower, preferably −100° C. or lower is used.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

After the oxide semiconductor film is formed, dehydrogenation or dehydration may be performed by heat treatment. The temperature of the heat treatment is typically higher than or equal to 150° C. and lower than the strain point of the substrate, preferably higher than or equal to 250° C. and lower than or equal to 450° C., more preferably higher than or equal to 300° C. and lower than or equal to 450° C.

The heat treatment is performed under an inert gas atmosphere containing nitrogen or a rare gas such as helium, neon, argon, xenon, or krypton. Further, the heat treatment may be performed under an inert gas atmosphere first, and then under an oxygen atmosphere. It is preferable that the above inert gas atmosphere and the above oxygen atmosphere do not contain hydrogen, water, and the like. The treatment time is 3 minutes to 24 hours.

An electric furnace, an RTA apparatus, or the like can be used for the heat treatment. With the use of an RTA apparatus, the heat treatment can be performed at a temperature of higher than or equal to the strain point of the substrate if the heating time is short. Therefore, the heat treatment time can be shortened.

By forming the oxide semiconductor film while it is heated or performing heat treatment after the formation of the oxide semiconductor film, the hydrogen concentration can be $5\times10^{19}$ atoms/cm$^3$ or lower, preferably $1\times10^{19}$ atoms/cm$^3$ or lower, preferably $5\times10^{18}$ atoms/cm$^3$ or lower, more preferably $1\times10^{18}$ atoms/cm$^3$ or lower, more preferably $5\times10^{17}$ atoms/cm$^3$ or lower, more preferably $1\times10^{16}$ atoms/cm$^3$ or lower.

Here, a 35-nm-thick oxide semiconductor film is formed by a sputtering method, a mask is formed over the oxide semiconductor film, and then part of the oxide semiconductor film is selectively etched. Then, after the mask is removed, heat treatment is performed in a mixed atmosphere containing nitrogen and oxygen, whereby the oxide semiconductor film 17 is formed.

Figure 2C:
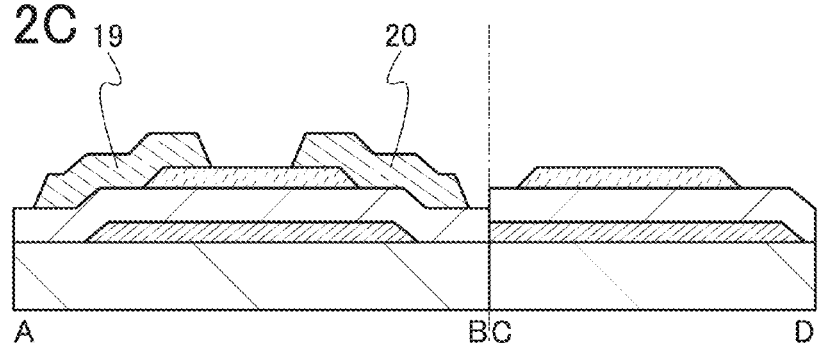
Figure 2D:
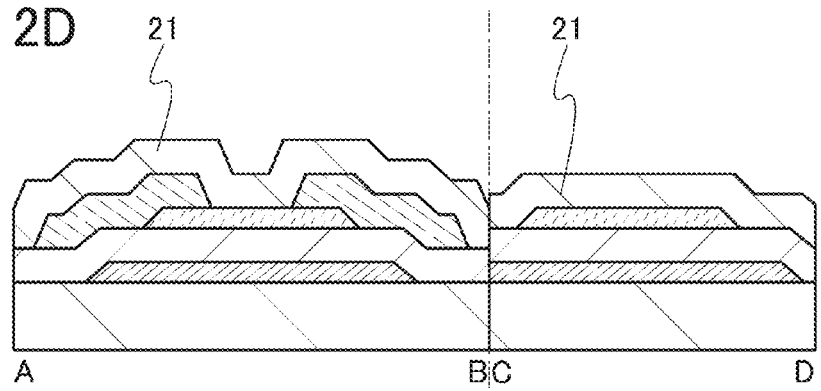

Next, as illustrated in FIG. 2C, the pair of electrodes 19 and 20 are formed.

A method for forming the pair of electrodes 19 and 20 is described below. First, a conductive film is formed by a sputtering method, a CVD method, an evaporation method, or the like. Then, a mask is formed over the conductive film by a photolithography process. After that, the conductive film is etched using the mask to form the pair of electrodes 19 and 20. After that, the mask is removed.

Here, a 50-nm-thick tungsten film, a 400-nm-thick aluminum film, and a 100-nm-thick titanium film are sequentially stacked by a sputtering method. Next, a mask is formed over the titanium film by a photolithography process and the tungsten film, the aluminum film, and the titanium film are dry-etched with use of the mask to form the pair of electrodes 19 and 20.

Note that heat treatment may be performed after the pair of electrodes 19 and 20 are formed. For example, this heat treatment can be performed in a manner similar to that of the heat treatment performed after the oxide semiconductor film 17 is formed.

After the pair of electrodes 19 and 20 are formed, cleaning treatment is preferably performed to remove an etching residue. A short circuit of the pair of electrodes 19 and 20 can be suppressed by this cleaning treatment. The cleaning treatment can be performed using an alkaline solution such as a tetramethylammonium hydroxide (TMAH) solution; an acidic solution such as a hydrofluoric acid, an oxalic acid solution, or a phosphoric acid solution; or water.

Next, the protective film 21 is formed over the oxide semiconductor film 17 and the pair of electrodes 19 and 20. The protective film 21 can be formed by a sputtering method, a CVD method, an evaporation method, or the like.

In the case where an oxide insulating film containing nitrogen and having a small number of defects is formed as the protective film 21, a silicon oxynitride film can be formed by a CVD method as an example of the oxide insulating film. In this case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide.

The oxide insulating film containing nitrogen and having a small number of defects can be formed by a CVD method under the conditions where the ratio of an oxidizing gas to a deposition gas is higher than 20 times and lower than 100 times, preferably higher than or equal to 40 times and lower than or equal to 80 times and the pressure in a treatment chamber is lower than 100 Pa, preferably lower than or equal to 50 Pa.

Here, a silicon oxynitride film is formed by a plasma CVD method under the conditions where the substrate 11 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6\times10^{-2}$ W/cm$^2$ as the power density) is supplied to parallel-plate electrodes.

Next, heat treatment may be performed. The temperature of the heat treatment is typically higher than or equal to 150° C. and lower than the strain point of the substrate, preferably higher than or equal to 200° C. and lower than or equal to 450° C., further preferably higher than or equal to 300° C. and lower than or equal to 450° C. By the heat treatment, water, hydrogen, and the like contained in the protective film 21 can be released.

Here, heat treatment is performed at 350° C. in a mixed atmosphere containing nitrogen and oxygen for one hour.

Through the above steps, a transistor in which a change in threshold voltage is reduced can be manufactured. Further, a transistor in which a change in electrical characteristics is reduced can be manufactured.

Modification Example 1

Modification examples of the transistor 10 described in Embodiment 1 are described with reference to FIGS. 3A and 3B. In each of the transistors described in this modification example, a gate insulating film or a protective film has a stacked-layer structure.

In a transistor using an oxide semiconductor, oxygen vacancies in an oxide semiconductor film cause defects of electrical characteristics of the transistor. For example, the threshold voltage of a transistor including an oxide semiconductor film that contains oxygen vacancies in the film easily shifts in the negative direction, and such a transistor tends to have normally-on characteristics. This is because charge is generated owing to the oxygen vacancies in the oxide semiconductor film, resulting in reduction of the resistance of the oxide semiconductor film.

Further, when an oxide semiconductor film includes oxygen vacancies, there is a problem in that the amount of change in electrical characteristics, typically change of the threshold voltage of the transistor is increased due to change over time or a bias-temperature stress test (hereinafter also referred to as a BT stress test).

Thus, by forming an oxide insulating film containing oxygen at a higher proportion than oxygen in the stoichiometric composition as a part of the protective film, a transistor in which a shift of the threshold voltage in the negative direction is suppressed and that has excellent electrical characteristics can be manufactured. In addition, a highly reliable transistor in which a variation in electrical characteristics with time or a variation in electrical characteristics due to a gate BT photostress test is small can be manufactured.

Figure 3A:
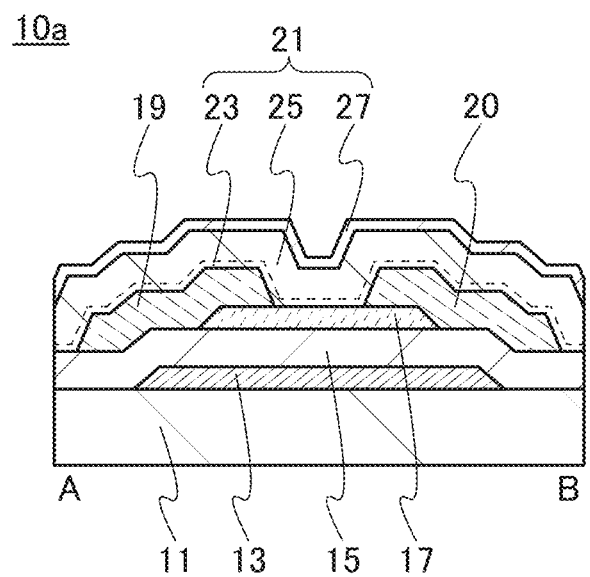
FIGS. 3A and 3B are each a cross-sectional view illustrating one embodiment of a transistor.

In a transistor 10a illustrated in FIG. 3A, the protective film 21 has a multi-layer structure. Specifically, the protective film 21 includes an oxide insulating film 23, an oxide insulating film 25 containing oxygen at a higher proportion than oxygen in the stoichiometric composition, and a nitride insulating film 27. The oxide insulating film 23 in contact with the oxide semiconductor film 17 is an oxide insulating film containing nitrogen and having a small number of defects that can be used as at least one of the gate insulating film 15 and the protective film 21 of the transistor 10.

The oxide insulating film 25 is formed using an oxide insulating film that contains oxygen at a higher proportion than oxygen in the stoichiometric composition. Part of oxygen is released by heating from the oxide insulating film containing oxygen at a higher proportion than oxygen in the stoichiometric composition. The oxide insulating film containing oxygen at a higher proportion than oxygen in the stoichiometric composition is an oxide insulating film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the substrate temperature in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, or greater than or equal to 50 nm and less than or equal to 400 nm can be used for the oxide insulating film 25.

As the oxide insulating film 25, a silicon oxide film or a silicon oxynitride film is formed under the following conditions: the substrate placed in a treatment chamber of the plasma CVD apparatus that is vacuum-evacuated is held at a temperature higher than or equal to 180° C. and lower than or equal to 280° C., preferably higher than or equal to 200° C. and lower than or equal to 240° C., the pressure is greater than or equal to 100 Pa and less than or equal to 250 Pa, preferably greater than or equal to 100 Pa and less than or equal to 200 Pa with introduction of a source gas into the treatment chamber, and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

As a source gas of the oxide insulating film 25, a deposition gas containing silicon and an oxidizing gas is preferably used. Typical examples of the deposition gas containing silicon include silane, disilane, trisilane, and silane fluoride. As the oxidizing gas, oxygen, ozone, dinitrogen monoxide, and nitrogen dioxide can be given as examples.

As the film formation conditions of the oxide insulating film 25, the high-frequency power having the above power density is supplied to a treatment chamber having the above pressure, whereby the degradation efficiency of the source gas in plasma is increased, oxygen radicals are increased, and oxidation of the source gas is promoted; thus, the oxygen content in the oxide insulating film 25 becomes higher than that in the stoichiometric composition. On the other hand, in the film formed at a substrate temperature within the above temperature range, the bond between silicon and oxygen is weak, and accordingly, part of oxygen in the film is released by heat treatment in a later step. Thus, it is possible to form an oxide insulating film which contains oxygen at a higher proportion than oxygen in the stoichiometric composition and from which part of oxygen is released by heating. Further, the oxide insulating film 23 is provided over the oxide semiconductor film 17. Accordingly, in the step of forming the oxide insulating film 25, the oxide insulating film 23 serves as a protective film of the oxide semiconductor film 17. Consequently, the oxide insulating film 25 can be formed using the high-frequency power having a high power density while damage to the oxide semiconductor film 17 is reduced. By the later heat treatment step, part of oxygen contained in the oxide insulating film 25 can be moved to the oxide semiconductor film 17, so that oxygen vacancies contained in the oxide semiconductor film 17 can be further reduced.

As the nitride insulating film 27, a film having an effect of blocking at least hydrogen and oxygen is used. Preferably, the nitride insulating film 27 has an effect of blocking oxygen, hydrogen, water, an alkali metal, an alkaline earth metal, or the like. It is possible to prevent outward diffusion of oxygen from the oxide semiconductor film 17 and entry of hydrogen, water, or the like into the oxide semiconductor film 17 from the outside by providing the nitride insulating film 27.

The nitride insulating film 27 is formed using a silicon nitride film, a silicon nitride oxide film, an aluminum nitride film, an aluminum nitride oxide film, or the like having a thickness greater than or equal to 50 nm and less than or equal to 300 nm, preferably greater than or equal to 100 nm and less than or equal to 200 nm.

Note that instead of the nitride insulating film 27, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

The nitride insulating film 27 can be formed by a sputtering method, a CVD method, or the like.

In the case where a silicon nitride film is formed by the plasma CVD method as the nitride insulating film 27, a deposition gas containing silicon, nitrogen, and ammonia is used as the source gas. As the source gas, ammonia whose amount is smaller than the amount of nitrogen is used, whereby ammonia is dissociated in the plasma and activated species are generated. The activated species break a bond between silicon and hydrogen that are contained in a deposition gas containing silicon and a triple bond between nitrogen molecules. As a result, a dense silicon nitride film having few defects, in which bonds between silicon and nitrogen are promoted and bonds between silicon and hydrogen is few, can be formed. On the other hand, when the amount of ammonia is larger than the amount of nitrogen in a source gas, dissociation of a deposition gas containing silicon and decomposition of nitrogen are not promoted, so that a sparse silicon nitride film in which bonds between silicon and hydrogen remain and defects are increased is formed. Therefore, in a source gas, the flow ratio of the nitrogen to the ammonia is set to be preferably greater than or equal to 5 and less than or equal to 50, more preferably greater than or equal to 10 and less than or equal to 50.

Figure 3B:
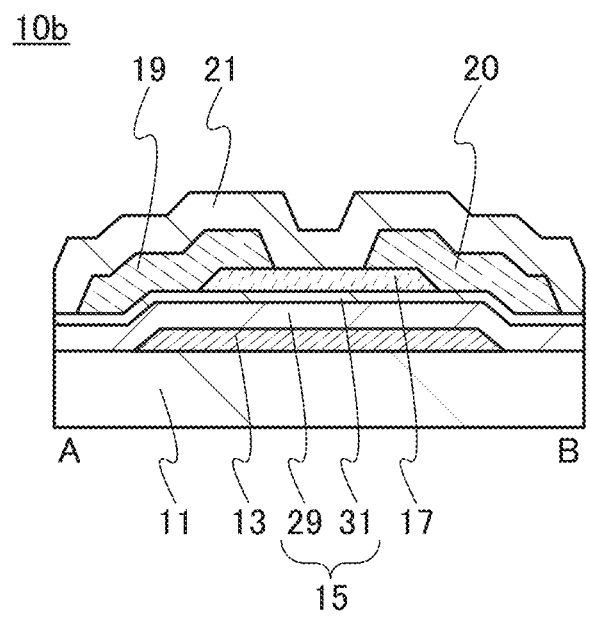

In a transistor 10b illustrated in FIG. 3B, the gate insulating film 15 has a stacked structure of a nitride insulating film 29 and an oxide insulating film 31 containing nitrogen, and the oxide insulating film 31 in contact with the oxide semiconductor film 17 is an oxide insulating film containing nitrogen and having a small number of defects.

As the nitride insulating film 29, a film having an effect of blocking water, hydrogen, or the like is preferably used. Alternatively, as the nitride insulating film 29, a film with a small number of defects is preferably used. Typical examples of the nitride insulating film 29 include films of silicon nitride, silicon nitride oxide, aluminum nitride, aluminum nitride oxide, and the like.

The use of a silicon nitride film as the nitride insulating film 29 has the following effect. In addition, a silicon nitride film has a higher dielectric constant than a silicon oxide film and needs a larger thickness for capacitance equivalent to that of the silicon oxide. Thus, the physical thickness of the gate insulating film 15 can be increased. This makes it possible to reduce a decrease in withstand voltage of the transistor 10b and furthermore increase the withstand voltage, thereby reducing electrostatic discharge damage to a semiconductor device.

In the transistor including the oxide semiconductor film, when trap states (also referred to as interface states) are included in the gate insulating film 15, the trap states can cause a change in electrical characteristics, typically, a change in the threshold voltage, of the transistor. As a result, there is a problem in that electrical characteristics vary among transistors. Therefore, with the use of a silicon nitride film having few defects as the nitride insulating film 29, the shift of the threshold voltage and the variation in the electrical characteristics among transistors can be reduced.

The nitride insulating film 29 may have a stacked-layer structure. For example, the nitride insulating film 29 has a stacked structure in which a first silicon nitride film is formed using a silicon nitride film having fewer defects, and a second silicon nitride film using a silicon nitride film that releases a small number of hydrogen molecules and ammonia molecules is formed over the first silicon nitride film, whereby the gate insulating film 15 can be formed using a gate insulating film that has fewer defects and releases a small number of hydrogen molecules and ammonia molecules. As a result, movement of hydrogen and nitrogen contained in the gate insulating film 15 to the oxide semiconductor film 17 can be suppressed.

The nitride insulating film 29 is preferably formed by stacking silicon nitride films by a two-step formation method. First, a first silicon nitride film with a small number of defects is formed by a plasma CVD method in which a mixed gas of silane, nitrogen, and ammonia is used as a source gas. Then, by using a source gas at a flow ratio that is similar to that of a source gas used for the nitride insulating film 27, a silicon nitride film that releases a small number of hydrogen molecules and ammonia molecules can be formed as the second silicon nitride film.

Modification Example 2

Modification examples of the transistor 10 described in Embodiment 1 are described with reference to FIGS. 4A and 4B. The transistor 10 described in Embodiment 1 is a channel-etched transistor; in contrast, a transistor 10c described in this modification example is a channel-protective transistor.

Figure 4A:
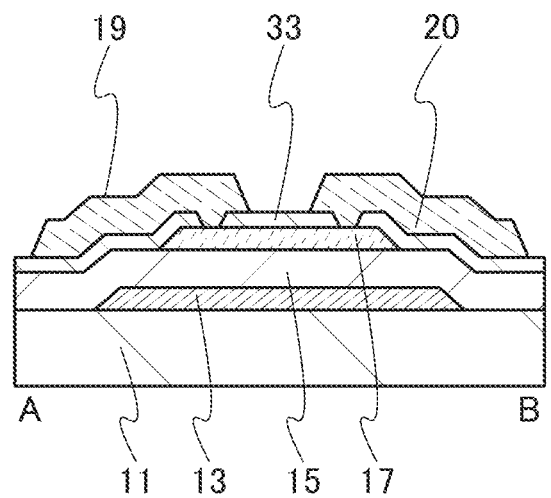
FIGS. 4A and 4B are each a cross-sectional view illustrating one embodiment of a transistor.

The transistor 10c illustrated in FIG. 4A includes the gate electrode 13 over the substrate 11; the gate insulating film 15 over the substrate 11 and the gate electrode 13; the oxide semiconductor film 17 overlapping with the gate electrode 13 with the gate insulating film 15 therebetween; an insulating film 33 over the gate insulating film 15 and the oxide semiconductor film 17; and the pair of electrodes 19 and 20 in contact with the oxide semiconductor film 17 in openings of the insulating film 33.

Figure 4B:
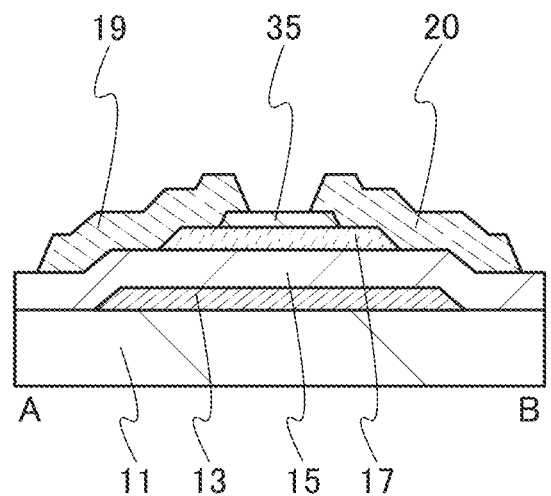

A transistor 10d illustrated in FIG. 4B includes an insulating film 35 over the oxide semiconductor film 17 and the pair of electrodes 19 and 20 in contact with the oxide semiconductor film 17.

In the transistor 10c or 10d, part of the oxide semiconductor film 17, typically, a back channel region is covered with the insulating film 33 or 35; accordingly, the back channel region of the oxide semiconductor film 17 is not damaged by etching for forming the pair of electrodes 19 and 20. In addition, when the insulating film 33 or 35 is an oxide insulating film containing nitrogen and having a small number of defects, a change in electrical characteristics is suppressed, whereby the transistor can have improved reliability.

Modification Example 3

Modification examples of the transistor 10 described in Embodiment 1 are described with reference to FIGS. 5A to 5C. The transistor 10 described in Embodiment 1 includes one gate electrode; in contrast, a transistor 10e described in this modification example includes two gate electrodes with an oxide semiconductor film interposed between the gate electrodes.

Figure 5A:
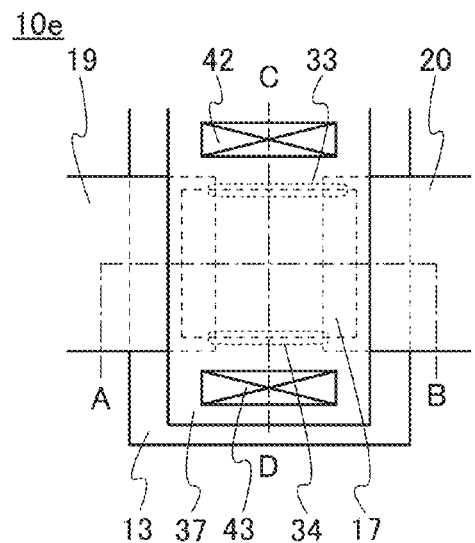
FIGS. 5A to 5C are a top view and cross-sectional views illustrating one embodiment of a transistor.
Figure 5C:
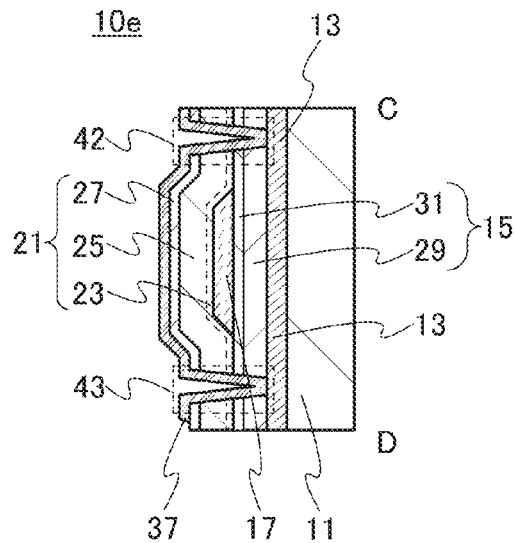
Figure 5B:
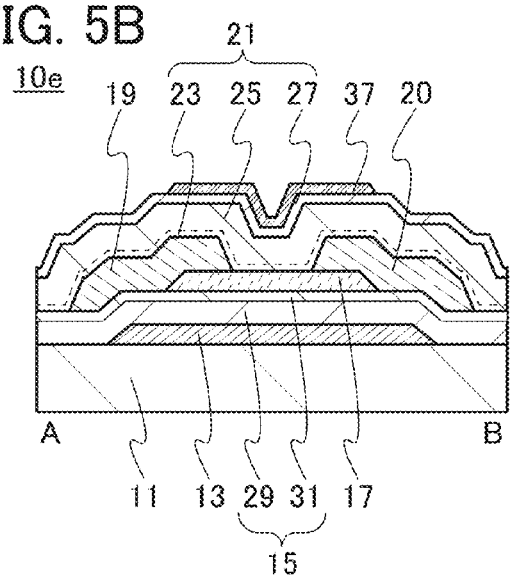

A top view and cross-sectional views of the transistor 10e included in a semiconductor device are illustrated in FIGS. 5A to 5C. FIG. 5A is a top view of the transistor 10e, FIG. 5B is a cross-sectional view taken along dashed-dotted line A-B in FIG. 5A, and FIG. 5C is a cross-sectional view taken along dashed-dotted line C-D in FIG. 5A. Note that in FIG. 5A, the substrate 11, the gate insulating film 15, the protective film 21, and the like are omitted for simplicity.

The transistor 10e illustrated in FIGS. 5B and 5C is a channel-etched transistor including the gate electrode 13 over the substrate 11; the gate insulating film 15 formed over the substrate 11 and the gate electrode 13; the oxide semiconductor film 17 overlapping with the gate electrode 13 with the gate insulating film 15 provided therebetween; and the pair of electrodes 19 and 20 in contact with the oxide semiconductor film 17. The transistor 10e further includes the protective film 21 including the oxide insulating film 23, the oxide insulating film 25, and the nitride insulating film 27 over the gate insulating film 15, the oxide semiconductor film 17, and the pair of electrodes 19 and 20; and a gate electrode 37 over the protective film 21. The gate electrode 37 is connected to the gate electrode 13 through openings 42 and 43 provided in the gate insulating film 15 and the protective film 21. Here, the gate insulating film 15 is a stack of the nitride insulating film 29 and oxide insulating film 31. The protective film 21 is a stack of the oxide insulating film 23, the oxide insulating film 25, and the nitride insulating film 27.

A plurality of openings are provided in the gate insulating film 15 and the protective film 21. Typically, the openings 42 and 43 are provided with the oxide semiconductor film 17 provided therebetween in the channel width direction as illustrated in FIG. 5C. In other words, the openings 42 and 43 are provided on outer sides of the side surfaces of the oxide semiconductor film 17. In addition, in the openings 42 and 43, the gate electrode 13 is connected to the gate electrode 37. This means that the gate electrode 13 and the gate electrode 37 surround the oxide semiconductor film 17 in the channel width direction with the gate insulating film 15 and the protective film 21 provided between the oxide semiconductor film 17 and each of the gate electrode 13 and the gate electrode 37. Furthermore, in the channel width direction, the gate electrode 37 in the openings 42 and 43 and each of the side surfaces of the oxide semiconductor film 17 are provided so that the protective film 21 is positioned therebetween.

As illustrated in FIG. 5C, a side surface of the oxide semiconductor film 17 faces the gate electrode 37 in the channel width direction, and the oxide semiconductor film 17 is surrounded by the gate electrode 13 and the gate electrode 37 with the gate insulating film 15 interposed between the oxide semiconductor film 17 and the gate electrode 13 and the protective film 21 interposed between the oxide semiconductor film 17 and the gate electrode 37 in the channel width direction. Thus, in the oxide semiconductor film 17, carriers flow not only at the interface between the gate insulating film 15 and the oxide semiconductor film 17 and the interface between the protective film 21 and the oxide semiconductor film 17, but also in the oxide semiconductor film 17, whereby the amount of transfer of carriers is increased in the transistor 10e. As a result, the on-state current and field-effect mobility of the transistor 10 are increased. The electric field of the gate electrode 37 affects the side surface or an end portion including the side surface and its vicinity of the oxide semiconductor film 17; thus, generation of a parasitic channel at the side surface or the end portion of the oxide semiconductor film 17 can be suppressed.

Modification Example 4

Modification examples of the transistor 10 described in Embodiment 1 are described with reference to FIGS. 6A to 6D and FIGS. 7A to 7C. The transistor 10 described in Embodiment 1 includes the single-layer oxide semiconductor film; in contrast, transistors 10f and 10g described in this modification example each includes a multi-layer film.

Figure 6A:
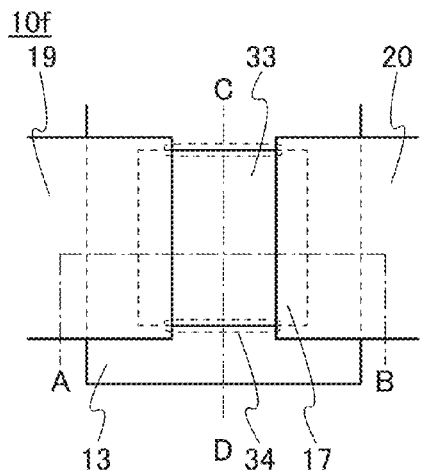
FIGS. 6A to 6D are a top view and cross-sectional views illustrating one embodiment of a transistor.
Figure 6C:
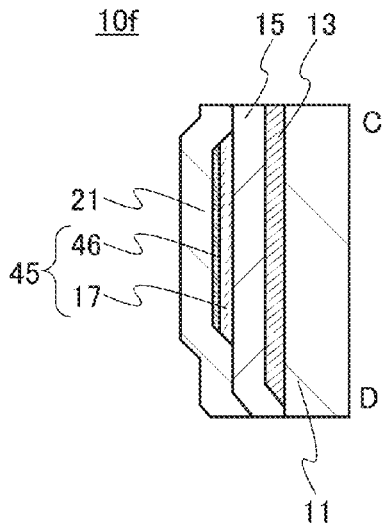
Figure 6B:
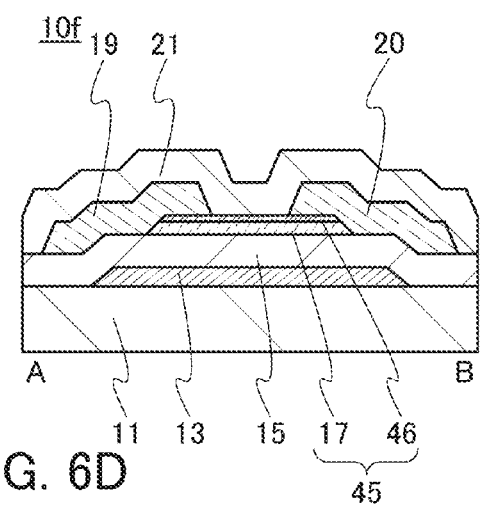

FIGS. 6A to 6C are a top view and cross-sectional views of the transistor 10f included in a semiconductor device. FIG. 6A is a top view of the transistor 10f, FIG. 6B is a cross-sectional view taken along dashed-dotted line A-B in FIG. 6A, and FIG. 6C is a cross-sectional view taken along dashed-dotted line C-D in FIG. 6A. Note that in FIG. 6A, the substrate 11, the gate insulating film 15, the protective film 21, and the like are omitted for simplicity.

The transistor 10f illustrated in FIG. 6A includes a multilayer film 45 overlapping with the gate electrode 13 with the gate insulating film 15 provided therebetween, and the pair of electrodes 19 and 20 in contact with the multilayer film 45. The protective film 21 is stacked over the gate insulating film 15, the multilayer film 45, and the pair of electrodes 19 and 20.

In the transistor 10f described in this embodiment, the multilayer film 45 includes the oxide semiconductor film 17 and an oxide semiconductor film 46. That is, the multilayer film 45 has a two-layer structure. Furthermore, part of the oxide semiconductor film 17 serves as a channel region. In addition, a protective film is formed in contact with the multilayer film 45.

The oxide semiconductor film 46 contains one or more elements that form the oxide semiconductor film 17. Thus, interface scattering is unlikely to occur at the interface between the oxide semiconductor film 17 and the oxide semiconductor film 46. Thus, the transistor can have high field-effect mobility because the movement of carriers is not hindered at the interfaces.

The oxide semiconductor film 46 is formed using a metal oxide film containing at least In or Zn. Typical examples of the metal oxide film include an In—Ga oxide film, an In—Zn oxide film, and an In-M-Zn oxide film (M represents Al, Ga, Y, Zr, La, Ce, or Nd). The conduction band minimum of the oxide semiconductor film 46 is closer to a vacuum level than that of the oxide semiconductor film 17 is; as a typical example, the energy difference between the conduction band minimum of the oxide semiconductor film 46 and the conduction band minimum of the oxide semiconductor film 17 is any one of 0.05 eV or more, 0.07 eV or more, 0.1 eV or more, or 0.15 eV or more, and any one of 2 eV or less, 1 eV or less, 0.5 eV or less, or 0.4 eV or less. That is, the difference between the electron affinity of the oxide semiconductor film 46 and the electron affinity of the oxide semiconductor film 17 is any one of 0.05 eV or more, 0.07 eV or more, 0.1 eV or more, or 0.15 eV or more, and any one of 2 eV or less, 1 eV or less, 0.5 eV or less, or 0.4 eV or less.

The oxide semiconductor film 46 preferably contains In because carrier mobility (electron mobility) can be increased.

When the oxide semiconductor film 46 contains a larger amount of Al, Ga, Y, Zr, La, Ce, or Nd than the amount of In in an atomic ratio, any of the following effects may be obtained: (1) the energy gap of the oxide semiconductor film 46 is widened; (2) the electron affinity of the oxide semiconductor film 46 decreases; (3) impurity diffusion from the outside is suppressed; (4) an insulating property of the oxide semiconductor film 46 increases as compared to that of the oxide semiconductor film 17; and (5) an oxygen vacancy is less likely to be generated because Al, Ga, Y, Zr, La, Ce, or Nd is a metal element that is strongly bonded to oxygen.

In the case where the oxide semiconductor film 46 is an In-M-Zn oxide film, the proportion of In and the proportion of M, not taking Zn and O into consideration, are less than 50 atomic % and greater than or equal to 50 atomic %, respectively, and preferably less than 25 atomic % and greater than or equal to 75 atomic %, respectively.

Furthermore, in the case where each of the oxide semiconductor films 17 and 46 contains an In-M-Zn oxide (M represents Al, Ga, Y, Zr, La, Ce, or Nd), the proportion of M atoms (M represents Al, Ga, Y, Zr, La, Ce, or Nd) in the oxide semiconductor film 46 is higher than that in the oxide semiconductor film 17. As a typical example, the proportion of M in the oxide semiconductor film 17 is 1.5 or more times, preferably twice or more, further preferably three or more times as high as that in the oxide semiconductor film 17.

Furthermore, in the case where each of the oxide semiconductor films 17 and 46 contains an In-M-Zn oxide (M represents Al, Ga, Y, Zr, La, Ce, or Nd), when In:M:Zn=$x_1$:$y_1$:$z_1$ [atomic ratio] is satisfied in the oxide semiconductor film 46 and In:M:Zn=$x_2$:$y_2$:$z_2$ [atomic ratio] is satisfied in the oxide semiconductor film 17, $y_1/x_1$ is higher than $y_2/x_2$, and preferably, $y_1/x_1$ be 1.5 or more times as high as $y_2/x_2$. Alternatively, $y_1/x_1$ is preferably twice or more as high as $y_2/x_2$. Further alternatively, $y_1/x_1$ is preferably three or more times as high as $y_2/x_2$. In this case, it is preferable that in the oxide semiconductor film, $y_2$ be higher than or equal to $x_2$ because a transistor including the oxide semiconductor film can have stable electrical characteristics.

In the case where the oxide semiconductor film 17 is an In-M-Zn oxide film (M is Al, Ga, Y, Zr, La, Ce, or Nd) and a target having the atomic ratio of metal elements of In:M:Zn=$x_1$:$y_1$:$z_1$ is used for forming the oxide semiconductor film 17, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film to be described later as the oxide semiconductor film 17 is easily formed. Typical examples of the atomic ratio of the metal elements of the target are In:M:Zn=1:1:1, In:M:Zn=1:1:1.2, and In:M:Zn=3:1:2.

In the case where the oxide semiconductor film 46 is an In-M-Zn oxide film (M is Al, Ga, Y, Zr, La, Ce, or Nd) and a target having the atomic ratio of metal elements of In:M:Zn=$x_2$:$y_2$:$z_2$ is used for forming the oxide semiconductor film 46, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, a CAAC-OS film to be described later as the oxide semiconductor film 46 is easily formed. Typical examples of the atomic ratio of the metal elements of the target are In:M:Zn=1:3:2, In:M:Zn=1:3:4, In:M:Zn=1:3:6, In:M:Zn=1:3:8, and the like.

Note that the proportion of each metal element in the atomic ratio of each of the oxide semiconductor films 17 and 46 varies within a range of ±40% of that in the above atomic ratio as an error.

The thickness of the oxide semiconductor film 46 is greater than or equal to 3 nm and less than or equal to 100 nm, preferably greater than or equal to 3 nm and less than or equal to 50 nm.

The oxide semiconductor film 46 may have a non-single-crystal structure, for example, like the oxide semiconductor film 17. The non-single crystal structure includes a c-axis aligned crystalline oxide semiconductor (CAAC-OS) that is described later, a polycrystalline structure, a microcrystalline structure described later, or an amorphous structure, for example.

The oxide semiconductor film 46 may have an amorphous structure, for example. An amorphous oxide semiconductor film has, for example, disordered atomic arrangement and no crystalline component. Alternatively, an amorphous oxide semiconductor film has, for example, an absolutely amorphous structure and no crystal part.

Note that the oxide semiconductor films 17 and 46 may each be a mixed film including two or more of a region having an amorphous structure, a region having a microcrystalline structure, a region having a polycrystalline structure, a CAAC-OS region, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Furthermore, in some cases, the mixed film has a stacked-layer structure of two or more of a region having an amorphous structure, a region having a microcrystalline structure, a region having a polycrystalline structure, a CAAC-OS region, and a region having a single-crystal structure.

In this case, the oxide semiconductor film 46 is provided between the oxide semiconductor film 17 and the oxide insulating film 23. Thus, if carrier traps are formed between the oxide semiconductor film 46 and the protective film 21 by impurities and defects, electrons flowing in the oxide semiconductor film 17 are less likely to be trapped by the carrier traps because there is a distance between the region where the carrier traps are formed and the oxide semiconductor film 17. Accordingly, the amount of on-state current of the transistor can be increased, and the field-effect mobility can be increased. When the electrons are trapped by the carrier traps, the electrons become negative fixed charges. As a result, the threshold voltage of the transistor varies. However, by the distance between the region where the carrier traps are formed and the oxide semiconductor film 17, trap of the electrons by the carrier traps can be reduced, and accordingly fluctuations of the threshold voltage can be reduced.

The oxide semiconductor film 46 can block impurities from the outside, and accordingly, the amount of impurities that are transferred from the outside to the oxide semiconductor film 17 can be reduced. Furthermore, an oxygen vacancy is less likely to be formed in the oxide semiconductor film 46. Consequently, the impurity concentration and oxygen vacancies in the oxide semiconductor film 17 can be reduced.

Note that the oxide semiconductor films 17 and 46 are not formed by simply stacking each film, but are formed to form a continuous junction (here, in particular, a structure in which the energy of the conduction band minimum is changed continuously between each film). In other words, a stacked-layer structure in which there exists no impurity that forms a defect level such as a trap center or a recombination center at each interface is provided. If an impurity exists between the oxide semiconductor films 17 and 46 that are stacked, a continuity of the energy band is damaged, and the carrier is trapped or recombined at the interface and then disappears.

To form such a continuous energy band, it is necessary to form films continuously without being exposed to the air, with use of a multi-chamber deposition apparatus (sputtering apparatus) including a load lock chamber. Each chamber in the sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove water or the like, which serves as an impurity against the oxide semiconductor film, as much as possible. Alternatively, a turbo molecular pump and a cold trap are preferably combined so as to prevent a backflow of a gas, especially a gas containing carbon or hydrogen from an exhaust system to the inside of the chamber.

Figure 6D:
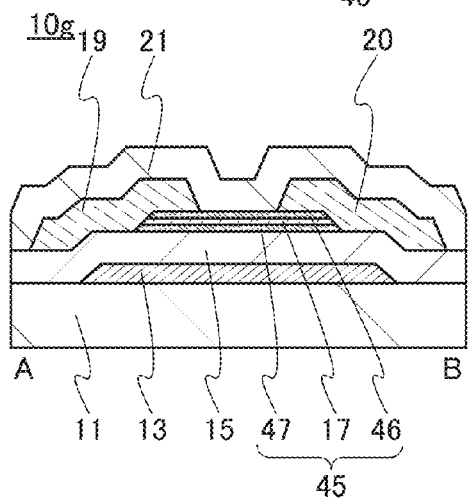

Note that a multilayer film 45 that is in a transistor 10g illustrated in FIG. 6D and has three oxide semiconductor films may be included instead of the multilayer film 45 having two oxide semiconductor films.

An oxide semiconductor film 47, the oxide semiconductor film 17, and the oxide semiconductor film 46 are stacked in this order in the multilayer film 45. That is, the multilayer film 45 has a three-layer structure. Furthermore, the oxide semiconductor film 17 serves as a channel region.

The gate insulating film 15 is in contact with the oxide semiconductor film 47. In other words, the oxide semiconductor film 47 is provided between the gate insulating film 15 and the oxide semiconductor film 17.

Furthermore, the oxide semiconductor film 46 is in contact with the protective film 21. That is, the oxide semiconductor film 46 is provided between the oxide semiconductor film 17 and the protective film 21.

The oxide semiconductor film 47 can be formed using a material and a formation method similar to those of the oxide semiconductor film 46.

It is preferable that the thickness of the oxide semiconductor film 47 be smaller than those of the oxide semiconductor film 17. When the thickness of the oxide semiconductor film 47 is greater than or equal to 1 nm and less than or equal to 5 nm, preferably greater than or equal to 1 nm and less than or equal to 3 nm, the amount of change in the threshold voltage of the transistor can be reduced.

In the transistors described in this embodiment, the oxide semiconductor film 46 is provided between the oxide semiconductor film 17 and the protective film 21. Thus, if carrier traps are formed between the oxide semiconductor film 46 and the oxide insulating film 23 by impurities and defects, electrons flowing in the oxide semiconductor film 17 are less likely to be trapped by the carrier traps because there is a distance between the region where the carrier traps are formed and the oxide semiconductor film 17. Accordingly, the amount of on-state current of the transistor can be increased, and the field-effect mobility can be increased. When the electrons are trapped by the carrier traps, the electrons behave as negative fixed charges. As a result, the threshold voltage of the transistor varies. However, by the distance between the region where the carrier traps are formed and the oxide semiconductor film 17, trap of electrons by the carrier traps can be reduced, and accordingly, fluctuations of the threshold voltage can be reduced.

The oxide semiconductor film 46 can block entry of impurities from the outside, and accordingly, the amount of impurities transferred to the oxide semiconductor film 17 from the outside can be reduced. Furthermore, an oxygen vacancy is less likely to be formed in the oxide semiconductor film 46. Consequently, the impurity concentration and the number of oxygen vacancies in the oxide semiconductor film 17 can be reduced.

The oxide semiconductor film 47 is provided between the gate insulating film 15 and the oxide semiconductor film 17, and the oxide semiconductor film 46 is provided between the oxide semiconductor film 17 and the protective film 21. Thus, it is possible to reduce the concentration of silicon or carbon in the vicinity of the interface between the oxide semiconductor film 47 and the oxide semiconductor film 17, in the oxide semiconductor film 17, or in the vicinity of the interface between the oxide semiconductor film 46 and the oxide semiconductor film 17.

The transistor 10g having such a structure includes very few defects in the multilayer film 45 including the oxide semiconductor film 17; thus, the electrical characteristics, typified by the on-state current and the field-effect mobility, of these transistors can be improved. Further, in a gate BT stress test and a gate BT photostress test that are examples of a stress test, the amount of change in threshold voltage is small, and thus, reliability is high.

<Band Structure of Transistor>

Next, band structures of the multilayer film 45 included in the transistor 10f illustrated in FIG. 6B and the multilayer film 45 included in the transistor 10g illustrated in FIG. 6D are described with reference to FIGS. 7A to 7C.

Here, for example, an In—Ga—Zn oxide having an energy gap of 3.15 eV is used for the oxide semiconductor film 17, and an In—Ga—Zn oxide having an energy gap of 3.5 eV is used for the oxide semiconductor film 46. The energy gaps can be measured using a spectroscopic ellipsometer (UT-300 manufactured by HORIBA JOBIN YVON SAS.).

The energy difference between the vacuum level and the valence band maximum (also called ionization potential) of the oxide semiconductor film 17 and the energy difference between the vacuum level and the valence band maximum of the oxide semiconductor film 46 were 8 eV and 8.2 eV, respectively. Note that the energy difference between the vacuum level and the valence band maximum can be measured using an ultraviolet photoelectron spectroscopy (UPS) device (VersaProbe manufactured by ULVAC-PHI, Inc.).

Thus, the energy difference between the vacuum level and the conduction band minimum (also called electron affinity) of the oxide semiconductor film 17 and the energy difference between the vacuum level and the conduction band minimum of the oxide semiconductor film 46 are 4.85 eV and 4.7 eV, respectively.

Figure 7A:
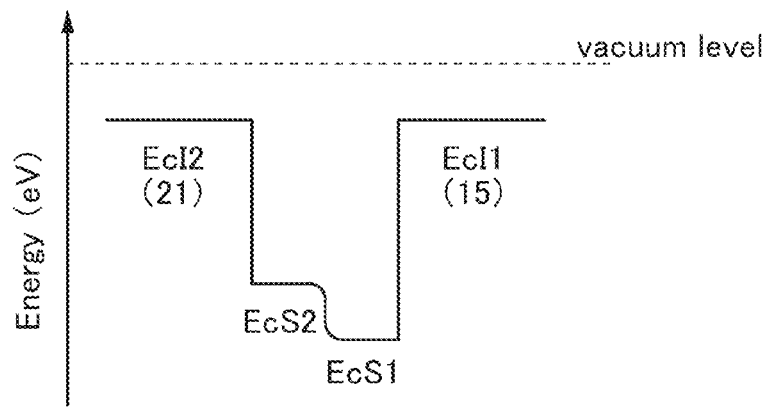
FIGS. 7A to 7C are each a diagram showing a band structure of a transistor.

FIG. 7A schematically illustrates a part of the band structure of the multilayer film 45 included in the transistor 10f. Here, the case where silicon oxide films are used for the gate insulating film 15 and the protective film 21 and the silicon oxide films are provided in contact with the multilayer film 45 is described. In FIG. 7A, EcI1 denotes the energy of the conduction band minimum of the silicon oxide film;

EcS1 denotes the energy of the conduction band minimum of the oxide semiconductor film 17; EcS2 denotes the energy of the conduction band minimum of the oxide semiconductor film 46; and EcI2 denotes the energy of the conduction band minimum of the silicon oxide film. Furthermore, EcI1 and EcI2 correspond to the gate insulating film 15 and the protective film 21 in FIG. 6B, respectively.

As illustrated in FIG. 7A, there is no energy barrier between the oxide semiconductor films 17 and 46, and the energy of the conduction band minimum gradually changes therebetween. In other words, the energy of the conduction band minimum is continuously changed. This is because the multilayer film 45 contains an element contained in the oxide semiconductor film 17 and oxygen is transferred between the oxide semiconductor films 17 and 46, so that a mixed layer is formed.

As shown in FIG. 7A, the oxide semiconductor film 17 in the multilayer film 45 serves as a well and a channel region of the transistor including the multilayer film 45 is formed in the oxide semiconductor film 17. Note that since the energy of the conduction band minimum of the multilayer film 45 is continuously changed, it can be said that the oxide semiconductor films 17 and 46 are continuous.

Although trap levels due to impurities or defects might be generated in the vicinity of the interface between the oxide semiconductor film 46 and the protective film 21 as shown in FIG. 7A, the oxide semiconductor film 17 can be distanced from the region where the trap levels are generated owing to the existence of the oxide semiconductor film 46. However, when the energy difference between EcS1 and EcS2 is small, an electron in the oxide semiconductor film 17 might reach the trap level across the energy difference. When the electron is trapped by the trap level, a negative fixed charge is generated at the interface with the oxide insulating film, whereby the threshold voltage of the transistor shifts in the positive direction. Thus, it is preferable that the energy difference between EcS1 and EcS2 be 0.1 eV or more, further preferably 0.15 eV or more, because a change in the threshold voltage of the transistor is reduced and stable electrical characteristics are obtained.

Figure 7B:
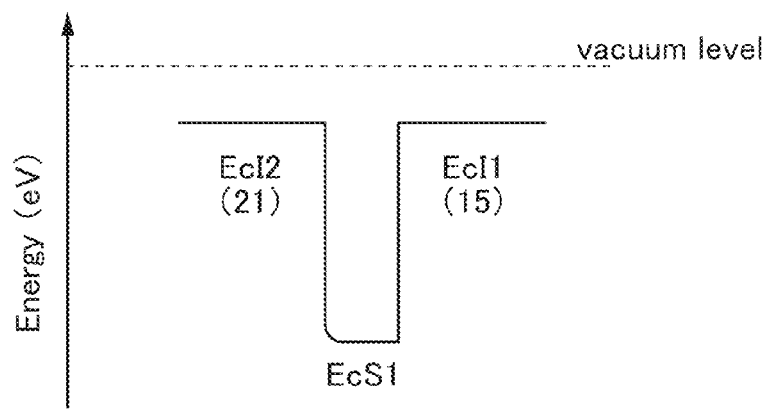

FIG. 7B schematically illustrates a part of the band structure of the multilayer film 45 of the transistor 10f, which is a variation of the band structure shown in FIG. 7A. Here, a structure where silicon oxide films are used for the gate insulating film 15 and the protective film 21 and the silicon oxide films are in contact with the multilayer film 45 is described. In FIG. 7B, EcI1 denotes the energy of the conduction band minimum of the silicon oxide film; EcS1 denotes the energy of the conduction band minimum of the oxide semiconductor film 17; and EcI2 denotes the energy of the conduction band minimum of the silicon oxide film. Further, EcI1 and EcI2 correspond to the gate insulating film 15 and the protective film 21 in FIG. 6B, respectively.

In the transistor illustrated in FIG. 6B, an upper portion of the multilayer film 45, that is, the oxide semiconductor film 46 might be etched in formation of the pair of electrodes 19 and 20. Furthermore, a mixed layer of the oxide semiconductor films 17 and 46 is likely to be formed on the top surface of the oxide semiconductor film 17 in formation of the oxide semiconductor film 46.

For example, Ga content in the oxide semiconductor film 46 is higher than that in the oxide semiconductor film 17 in the case where the oxide semiconductor film 17 is an oxide semiconductor film formed with use of, as a sputtering target, In—Ga—Zn oxide whose atomic ratio of In to Ga and Zn is 1:1:1 or In—Ga—Zn oxide whose atomic ratio of In to Ga and Zn is 3:1:2, and the oxide semiconductor film 46 is an oxide film formed with use of, as a sputtering target, In—Ga—Zn oxide whose atomic ratio of In to Ga and Zn is 1:3:2, In—Ga—Zn oxide whose atomic ratio of In to Ga and Zn is 1:3:4, or In—Ga—Zn oxide whose atomic ratio of In to Ga and Zn is 1:3:6. Thus, a $GaO_x$ layer or a mixed layer whose Ga content is higher than that in the oxide semiconductor film 17 can be formed on the top surface of the oxide semiconductor film 17.

For that reason, even in the case where the oxide semiconductor film 46 is etched, the energy of the conduction band minimum EcS1 on the EcI2 side is increased and the band structure shown in FIG. 7B can be obtained in some cases.

As in the band structure shown in FIG. 7B, in observation of a cross section of a channel region, only the oxide semiconductor film 17 in the multilayer film 45 is apparently observed in some cases. However, a mixed layer that contains Ga more than the oxide semiconductor film 17 is formed over the oxide semiconductor film 17 in fact, and thus the mixed layer can be regarded as a 1.5-th layer. Note that the mixed layer can be confirmed by analyzing a composition in the upper portion of the oxide semiconductor film 17, when the elements contained in the multilayer film 45 are measured by an EDX analysis, for example. The mixed layer can be confirmed, for example, in such a manner that the Ga content in the composition in the upper portion of the oxide semiconductor film 17 is larger than the Ga content in the oxide semiconductor film 17.

Figure 7C:
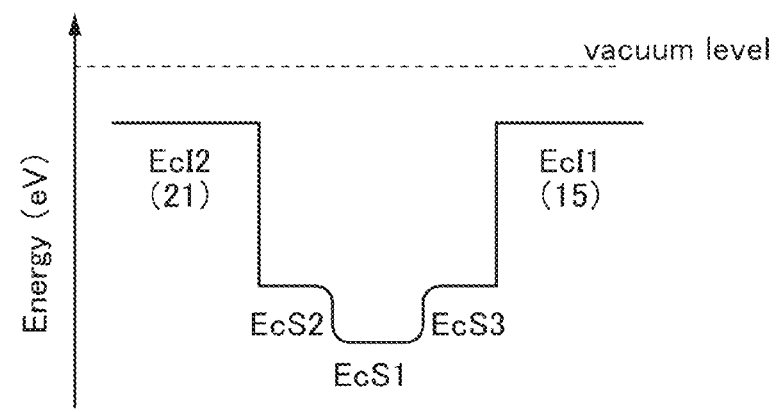

FIG. 7C schematically illustrates a part of the band structure of the multilayer film 45 of the transistor 10g. Here, the case where silicon oxide films are used for the gate insulating film 15 and the protective film 21 and the silicon oxide films are in contact with the multilayer film 45 is described. In FIG. 7C, EcI1 denotes the energy of the conduction band minimum of the silicon oxide film; EcS1 denotes the energy of the conduction band minimum of the oxide semiconductor film 17; EcS2 denotes the energy of the conduction band minimum of the oxide semiconductor film 46; EcS3 denotes the energy of the conduction band minimum of the oxide semiconductor film 47; and EcI2 denotes the energy of the conduction band minimum of the silicon oxide film. Furthermore, EcI1 and EcI2 correspond to the gate insulating film 15 and the protective film 21 in FIG. 6D, respectively.

As illustrated in FIG. 7C, there is no energy barrier between the oxide semiconductor films 47, 17, and 46, and the conduction band minimums thereof smoothly vary. In other words, the conduction band minimums are continuous. This is because the multilayer film 45 contains an element contained in the oxide semiconductor film 17 and oxygen is transferred between the oxide semiconductor films 17 and 47 and between the oxide semiconductor films 17 and 46, so that a mixed layer is formed.

As shown in FIG. 7C, the oxide semiconductor film 17 in the multilayer film 45 serves as a well and a channel region of the transistor including the multilayer film 45 is formed in the oxide semiconductor film 17. Note that since the energy of the conduction band minimum of the multilayer film 45 is continuously changed, it can be said that the oxide semiconductor films 47, 17, and 46 are continuous.

Although trap levels due to impurities or defects might be generated in the vicinity of the interface between the oxide semiconductor film 17 and the protective film 21 and in the vicinity of the interface between the oxide semiconductor film 17 and the gate insulating film 15, as illustrated in FIG. 7C, the oxide semiconductor film 17 can be distanced from the region where the trap levels are generated owing to the existence of the oxide semiconductor films 46 and 47. However, when the energy difference between EcS1 and EcS2 and the energy difference between EcS1 and EcS3 are small, electrons in the oxide semiconductor film 17 might reach the trap level across the energy difference. When the electrons are trapped by the trap level, a negative fixed charge is generated at the interface with the insulating film, whereby the threshold voltage of the transistor shifts in the positive direction. Thus, it is preferable that the energy difference between EcS1 and EcS2 and the energy difference between EcS1 and EcS3 be 0.1 eV or more, further preferably 0.15 eV or more, because a change in the threshold voltage of the transistor is reduced and stable electrical characteristics are obtained.

Note that the structures, methods, and the like described in this embodiment can be used as appropriate in combination with any of the structures, methods, and the like described in the other embodiments and examples.

Embodiment 2

In this embodiment, an oxide semiconductor film included in a transistor, defects included in an oxide insulating film in contact with the oxide semiconductor film, and the deterioration of transistor characteristics are described.

<1. $NO_x$>

First, nitrogen oxide (hereinafter $NO_x$; x is greater than or equal to 0 and smaller than or equal to 2, preferably greater than or equal to 1 and smaller than or equal to 2) contained in the oxide insulating film in contact with the oxide semiconductor film is described.

<1-1. Transition Level of NO in Oxide Insulating Film>

First, transition levels of point defects in a solid are described. A transition level shows the charge state of impurities or defects (hereinafter referred to as a defect D) forming a state in a gap, and is calculated from the formation energy of defects. In other words, a transition level is similar to a donor level or an acceptor level.

The relation between formation energy and transition levels of the charge state of the defect D and is described. The formation energy of the defect D is different depending on the charge state and also depends on the Fermi energy. Note that $D^+$ represents a state in which a defect releases one electron, $D^-$ represents a state in which a defect traps one electron, and $D^0$ represents a state in which no electron is transferred.

Figure 17A:
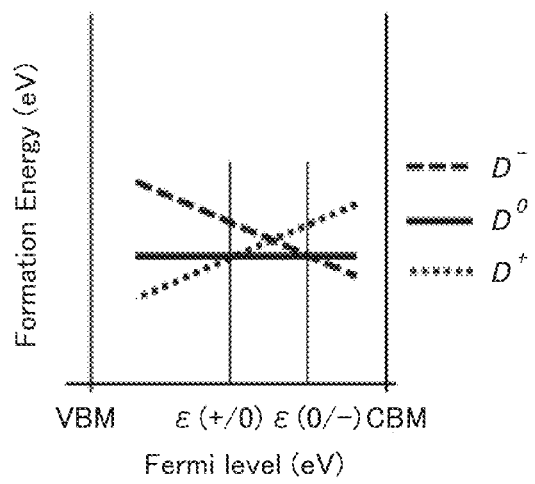
FIGS. 17A and 17B illustrate the relation between formation energy and transition levels and electron configurations of defects.
Figure 17B:
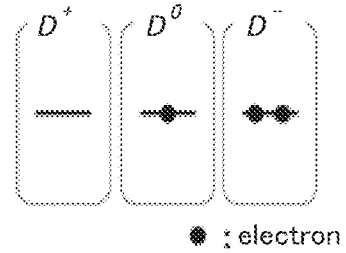

FIG. 17A illustrates the relation between the formation energy and the transition level of each of the defects $D^+$, $D^0$, and $D^-$. FIG. 17B illustrates electron configurations of the defects $D^+$, $D^0$, and $D^-$ in the case where the defect D in a neutral state has an orbit occupied by one electron.

In FIG. 17A, the dotted line indicates the formation energy of the defect $D^+$, the solid line indicates the formation energy of the defect $D^0$, and the dashed line indicates the formation energy of the defect $D^-$. The transition level means the position of the Fermi level at which the formation energies of the defects D having different charge states become equal to each other. The position of the Fermi level at which the formation energy of the defect $D^+$ becomes equal to that of the defect $D^0$ (that is, a position at which the dotted line and the solid line intersect) is denoted by $\in(+/0)$, and the position of the Fermi level at which the formation energy of the defect $D^0$ becomes equal to that of the defect D⁻ (that is, a position at which the solid line and the dashed line intersect) is denoted by ∈(0/−).

Figure 18:
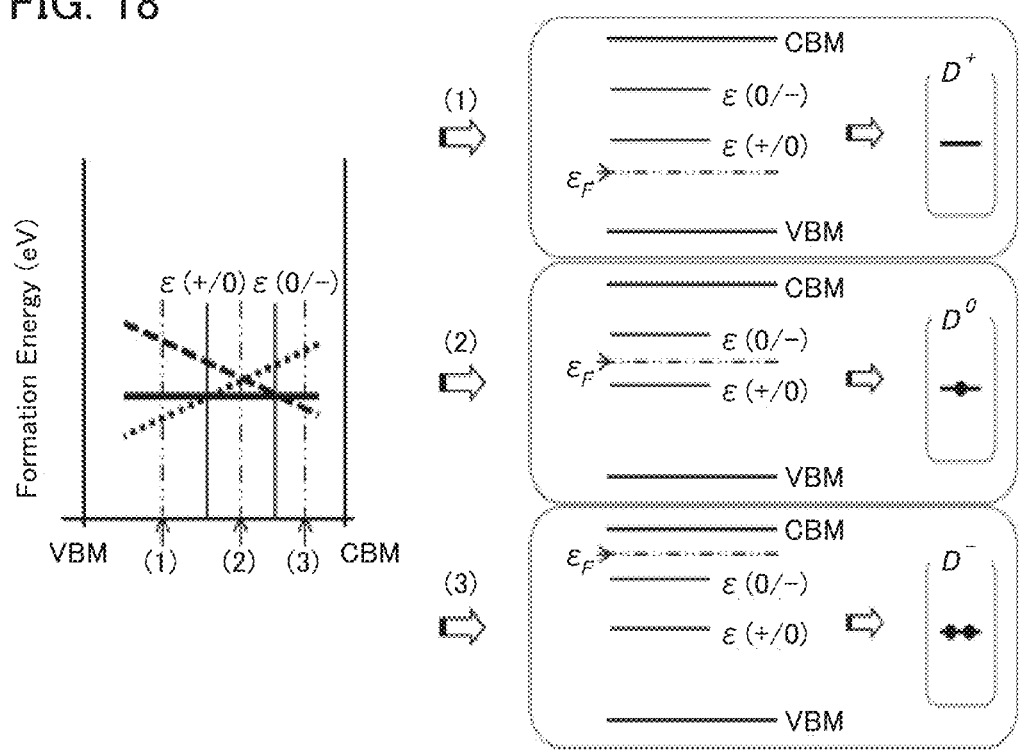
FIG. 18 illustrates a change in the Fermi level and a change in the charge states of defects.

FIG. 18 illustrates a conceptual diagram of transition of charge states of a defect that are energetically stable when the Fermi level is changed. In FIG. 18, the dashed double-dotted line indicates the Fermi level. Right views of FIG. 18 are band diagrams of (1), (2), and (3) that indicate the Fermi level in a left view of FIG. 18.

By finding out the transition level of a solid, it is qualitatively known that which charge state allows a detect to be energetically stable at each of the Fermi levels when the Fermi level is used as a parameter.

As a typical example of the oxide insulating film in contact with the oxide semiconductor film, a silicon oxynitride (SiON) film was used, and the defect level in the silicon oxynitride film and an ESR signal attributed to the defect level were examined by calculation. Specifically, models in which a nitrogen dioxide molecule, a dinitrogen monoxide molecule, a nitrogen monoxide molecule, and a nitrogen atom were introduced into the respective silicon oxide ($SiO_2$) were formed, and the transition levels thereof were examined to verify whether the atoms introduced into silicon oxide serve as electron traps of the transistor.

Figure 8:
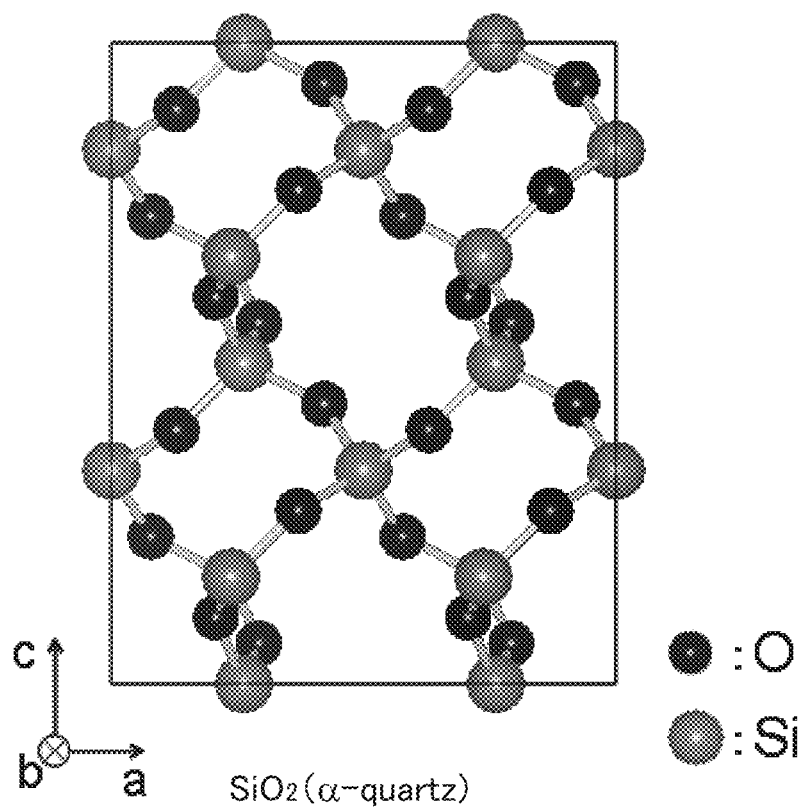
FIG. 8 shows a crystalline model of c-SiO$_2$.

In calculation, $SiO_2$ (c-$SiO_2$) with a low-temperature quartz (α-quartz) crystal structure was used as a model. A crystal model of c-$SiO_2$ without defects is shown in FIG. 8.

First, structure optimization calculation was performed on a model including 72 atoms, particularly on the lattice constants and the atomic coordinates. The model was obtained by doubling the unit cells in all axis direction of c-$SiO_2$. In the calculation, first principles calculation software VASP (the Vienna Ab initio Simulation Package) was used. The effect of inner-shell electron was calculated by a projector augmented wave (PAW) method, and as a functional, Heyd-Scuseria-Ernzerhof (HSE) DFT hybrid factor (HSE06) was used. The calculation conditions are shown below.

TABLE 1

| Software | VASP |
|---|---|
| Pseudopotential | PAW method |
| Functional | HSE06 |
| Mixing ratio of exchange term | 0.4 |
| Cut-off energy | 800 eV |
| k-point | 1 × 1 × 1 (optimization) |
| | 2 × 2 × 2 (total energy) |

The band gap of c-$SiO_2$ model after the structure optimization was 8.97 eV that is close to the experimental value, 9.0 eV.

Next, the structure optimization calculation was performed on the above c-$SiO_2$ models where a nitrogen dioxide molecule, a dinitrogen monoxide molecule, a nitrogen monoxide molecule, and a nitrogen atom were introduced into spaces (interstitial sites) in respective crystal structures. The structure optimization calculation was performed on each model with respect to the following three cases: a case where the whole model is positive monovalent (charge: +1); a case where the whole model is electrically neutral (zerovalent) (charge: neutral); and a case where the whole model is negative monovalent (charge: −1). Note that the charges imposed on the whole model, which were in the ground state of electrons, were localized in defects including the nitrogen dioxide molecule, the dinitrogen monoxide molecule, the nitrogen monoxide molecule, and the nitrogen atom.

Figure 9:
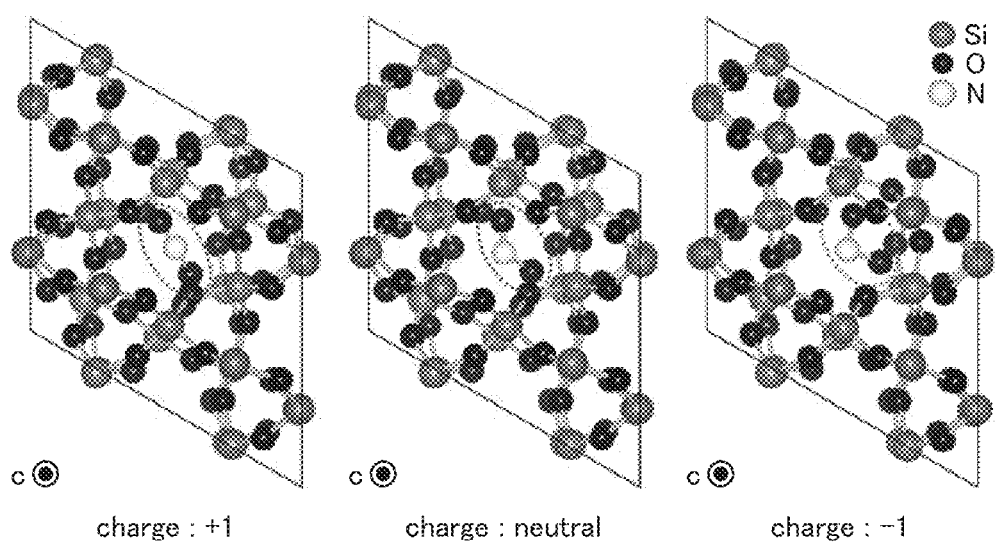
FIG. 9 shows a model in which a nitrogen dioxide molecule is introduced into an interstitial site of a c-SiO$_2$ model.

As for the model in which a nitrogen dioxide molecule was introduced into an interstitial site in the c-$SiO_2$ model, a structure after the structure optimization calculation was performed and structural parameters of the nitrogen dioxide molecule are shown in FIG. 9. In FIG. 9, structural parameters of the nitrogen dioxide molecule in a gaseous state are also shown as a reference example.

Note that the molecule that is not electrically neutral is frequently called a molecular ion; however, unlike a gaseous state, it is difficult to quantitate the valence of molecule because the molecular discussed here is one introduced inside a crystal lattice. Thus, a molecule that is not electrically neutral is called molecular for convenience.

FIG. 9 shows that when the nitrogen dioxide molecule is introduced, the nitrogen dioxide molecule tends to be in a linear arrangement in the case where the charge of the model is +1. FIG. 9 also shows that the angle of the O—N—O bond of the model whose charge is −1 is smaller than that of the model whose charge is neutral, and the angle of the O—N—O bond of the model whose charge is neutral is smaller than that of the model whose charge is +1. This structure change in the nitrogen dioxide molecule is almost equal to a change in the bonding angle when the charge number of isolated molecules in a gas phase varies. Thus, it is suggested that almost the assumed charges are attributed to the nitrogen dioxide molecule, and the nitrogen dioxide molecule in $SiO_2$ probably exists in a state close to an isolated molecule.

Figure 10:
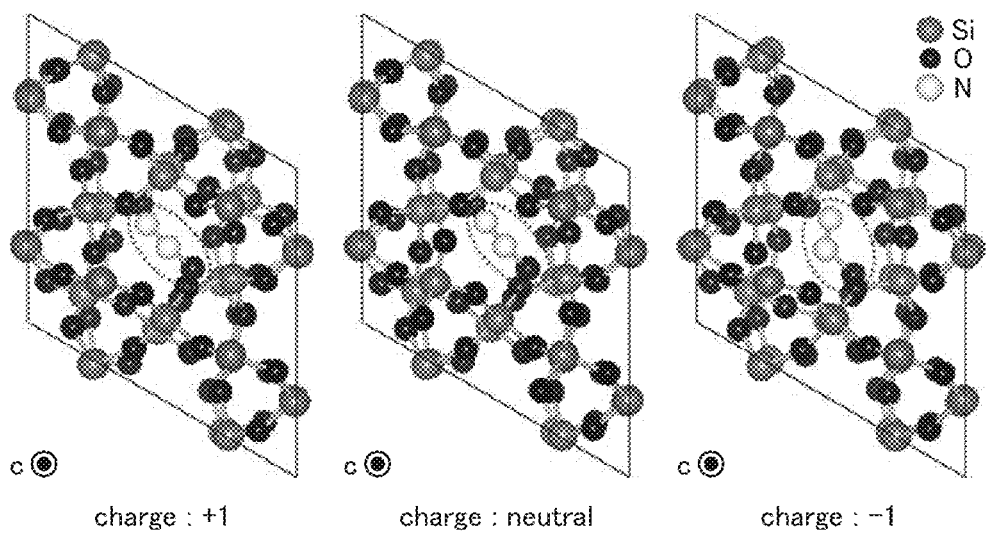
FIG. 10 shows a model in which a dinitrogen monoxide molecule is introduced into an interstitial site of a c-SiO$_2$ model.

Next, as for the model in which a dinitrogen monoxide molecule was introduced into an interstitial site in the c-$SiO_2$ model, a structure after the structure optimization calculation was performed and structural parameters of the dinitrogen monoxide molecule are shown in FIG. 10. In FIG. 10, structural parameters of the dinitrogen monoxide molecule in a gaseous state are also shown as a reference example.

According to FIG. 10, in the case where the charge of the model is +1 and the case where the charge is neutral, the structures of the dinitrogen monoxide molecules are both in a linear arrangement, which means the dinitrogen monoxide molecules of two cases have almost the same structure. In contrast, in the case where the charge of the model is −1, the dinitrogen monoxide molecule has a bent shape, and the distance between the nitrogen atom and the oxygen atom is longer than those of the above two cases. This conceivable reason is that an electron enters the LUMO level that is π* orbital of the dinitrogen monoxide molecule.

Figure 11:
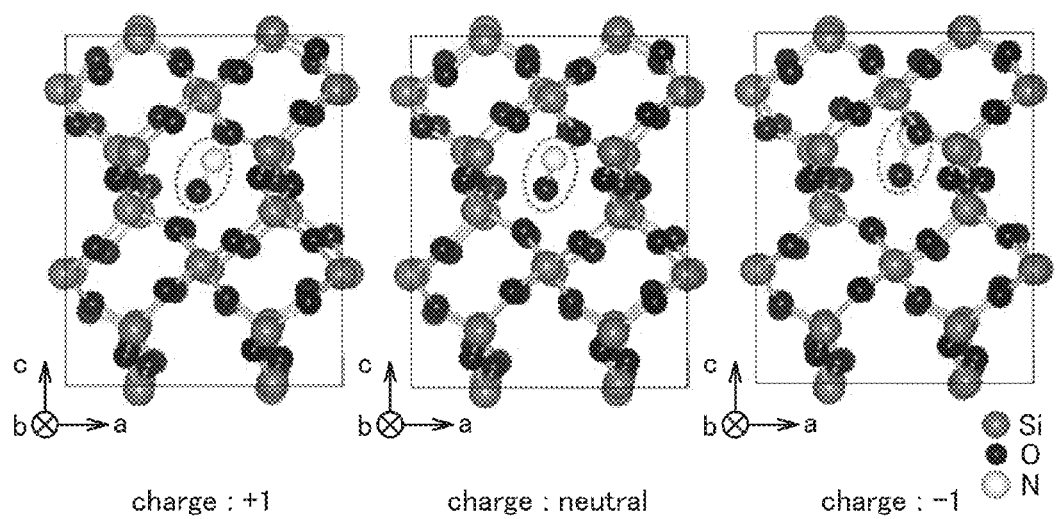
FIG. 11 shows a model in which a nitrogen monoxide molecule is introduced into an interstitial site of a c-SiO$_2$ model.

Next, as for the model in which a nitrogen monoxide molecule was introduced into an interstitial site in the c-$SiO_2$ model, a structure after the structure optimization calculation was performed and structural parameters of the nitrogen monoxide molecule are shown in FIG. 11.

According to FIG. 11, the distance between a nitrogen atom and an oxygen atom is short in the case where the charge of the model is +1, and the distance between a nitrogen atom and an oxygen atom is long in the case where the charge of the model is −1. This tendency is probably caused by the following reason. In the case where the charge of the nitrogen monoxide molecule in a gaseous state is +1, the bond order of the N—O bond is 3.0; in the case where the charge of the nitrogen monoxide molecule in a gaseous state is 0, the bond order is 2.5; and in the case where the charge of the nitrogen monoxide molecule in a gaseous state is −1, the bond order is 2.0. Thus, the bond order becomes the largest when the charge is +1. Therefore, the nitrogen monoxide molecule in $SiO_2$ is considered to exist stably in a state close to the isolated molecule.

Figure 12:
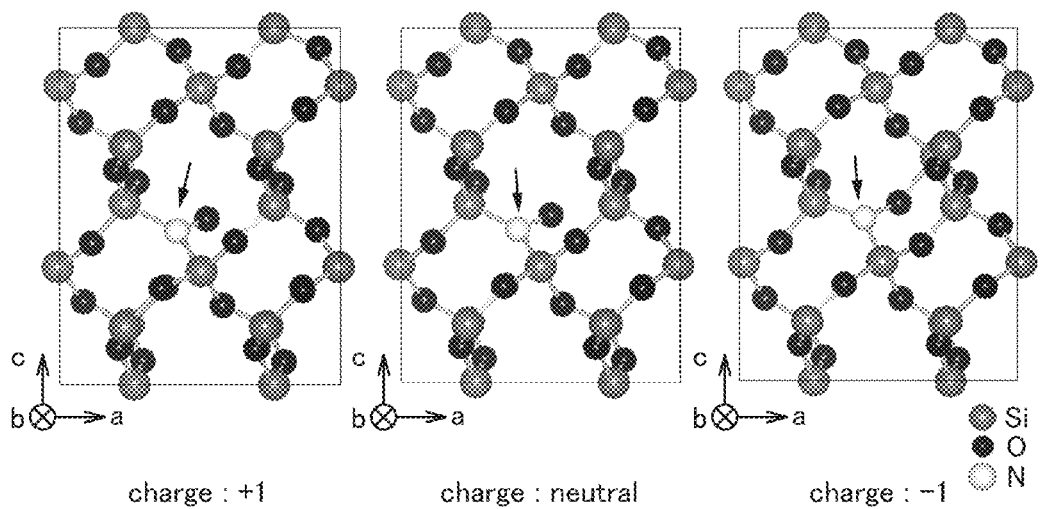
FIG. 12 shows a model in which a nitrogen atom is introduced into an interstitial site of a c-SiO$_2$ model.

Then, as for the model in which a nitrogen atom was introduced into an interstitial site in the c-$SiO_2$ model, a structure after the structure optimization calculation was performed is shown in FIG. 12.

According to FIG. 12, in either charge state, the nitrogen atom that is bonded to atoms in $SiO_2$ is more stable in terms of energy than the nitrogen atom exists as an isolated atom in an interstitial site.

Next, the calculation of a transition level was performed on each sample.

The transition level $\in(q/q')$ for transition between the charge q state and the charge q' state in a model having defect D in its structure can be calculated with Formula 1.

$$\varepsilon(q/q') = \frac{\Delta E^q - \Delta E^{q'}}{q' - q} \quad \text{[Formula 1]}$$

$$\Delta E^q = E_{tot}(D^q) - E_{tot}(\text{bulk}) + \sum_i n_i \mu_i + q(\varepsilon_{VBM} + \Delta V_q + E_F)$$

In the above formula, $E_{tot}(D^q)$ represents the total energy in the model having defect D of the charge q, $E_{tot}(\text{bulk})$ represents the total energy in a model without defects, $n_i$ represents the number of atoms i contributing to defects, $\mu_i$ represents the chemical potential of atom i, $\in_{VBM}$ represents the energy of the valence band maximum in the model without defects, $\Delta V_q$ represents the correction term relating to the electrostatic potential, and $E_F$ represents Fermi energy.

Figure 13:
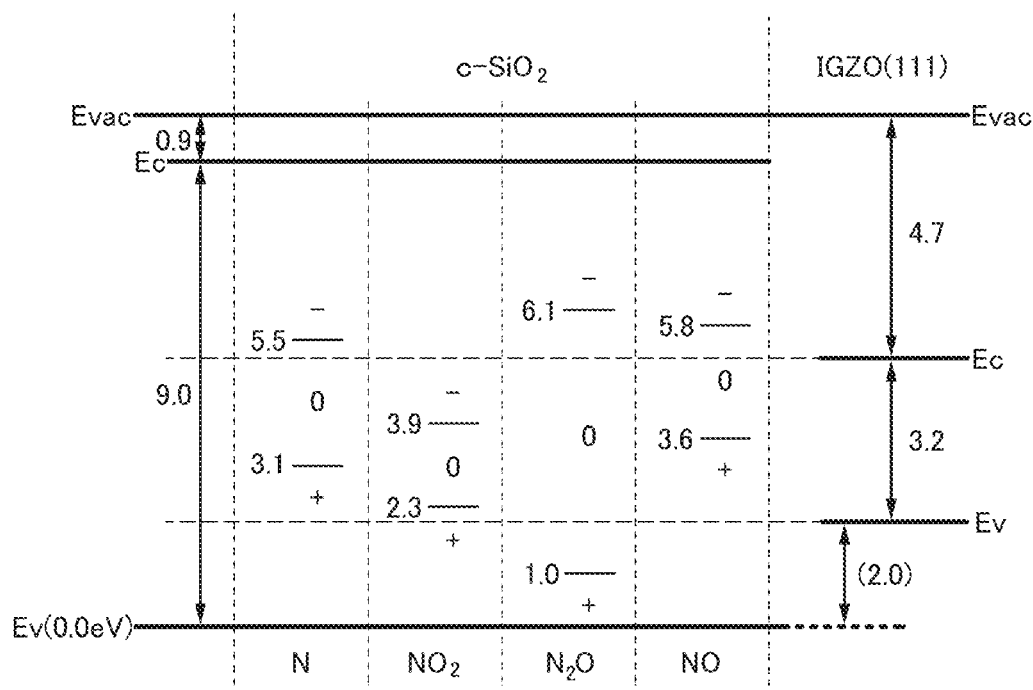
FIG. 13 is a band diagram.

FIG. 13 is a band diagram showing the transition levels obtained from the above formula. As the oxide semiconductor film, an oxide semiconductor film (hereinafter referred to as IGZO(111)) formed using metal oxide having an atomic ratio of In:Ga:Zn=1:1:1 is used. In FIG. 13, a band diagram of the IGZO(111) is shown in addition to the band diagrams of the above four models. The unit of the values in FIG. 13 is "eV".

In FIG. 13, the value of each transition level indicates a value obtained when the valence band maximum of $SiO_2$ is considered as a base (0.0 eV). Although a reference value was used as an electron affinity of $SiO_2$ here, the practical positional relation of the bands in the case where $SiO_2$ is bonded to the IGZO(111) is affected by the electron affinity of $SiO_2$ in some cases.

Hereinafter, the transition level that transits between a state where the charge of the model is +1 and a state where the charge of the model is 0 is referred to as (+/0), and the transition level that transits between a state where the charge of the model is 0 and a state where the charge of system is −1 is referred to as (0/−).

According to FIG. 13, in the model in which the nitrogen dioxide molecule was introduced into $SiO_2$, two transition levels of (+l0) and (0/−) exist at the positions within the band gap of the IGZO(111), which suggests that the nitrogen dioxide molecule may relate to trap and detrap of electrons. In both a model in which a nitrogen monoxide molecule was introduced into $SiO_2$ and a model in which a nitrogen atom was introduced into $SiO_2$, the transition level of (+/0) exits at a position within the band gap of the IGZO(111). In contrast, the transition level of the model in which a dinitrogen monoxide molecule was introduced into $SiO_2$ exists outside of the band gap of the IGZO(111), and the dinitrogen monoxide molecules probably exist stably as neutral molecules regardless of the position on Fermi level.

The above results strongly suggest that interstitial molecules containing nitrogen, which relate to trap and detrap of electrons caused by a shift of the threshold voltage of a transistor in the positive direction, have the transition level at a position on the conduction band side within the band gap of the IGZO(111). Here, a molecule having a transition level at a position close to the conduction band in the band gap of the IGZO(111) is probably a nitrogen dioxide molecule or a nitrogen monoxide molecule, or both.

<1-2. Examination of ESR Signal>

Following the calculation results of the transition level, ESR signals of nitrogen dioxide molecules were calculated. In addition, a model in which a nitrogen atom substituted for an oxygen atom in $SiO_2$ was examined in a manner similar to that of the above case.

In this case, a nitrogen atom has seven electrons, and an oxygen atom has eight electrons; in other words, an electron structure of the nitrogen dioxide molecule has an open shell. Thus, the neutral nitrogen dioxide molecule has a lone electron, and can be measured by ESR. In the case where a nitrogen atom substitutes for an oxygen atom in $SiO_2$, only two silicon atoms exist around a nitrogen atom, and the nitrogen atom includes a dangling bond. Thus, the case can also be measured by ESR. Furthermore, $^{14}N$ has only one nuclear spin, and a peak of ESR signal relating to $^{14}N$ is split into three. At this time, the split width of ESR signal is a hyperfine coupling constant.

Figure 14A:
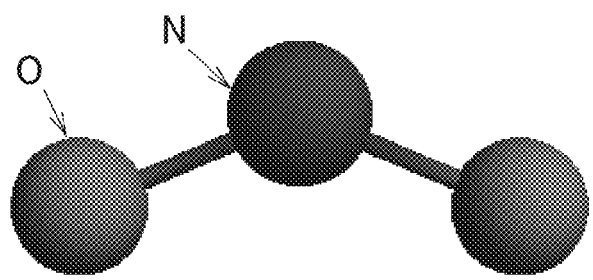
FIGS. 14A and 14B each show a model of a cluster structure.
Figure 14B:
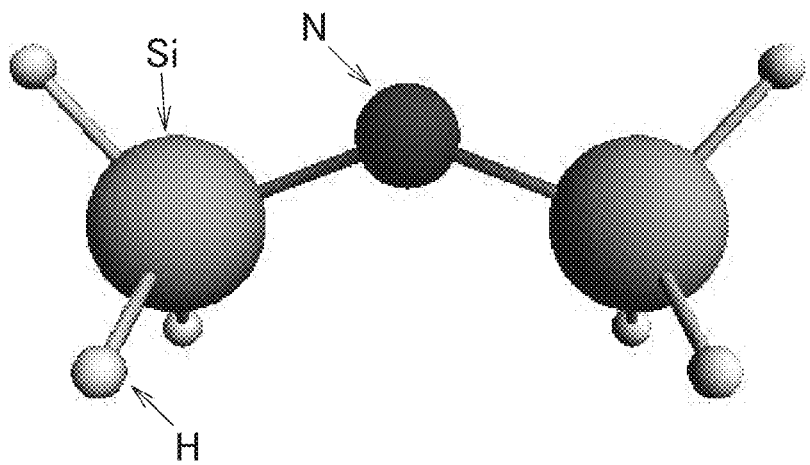

Thus, calculation was performed to examine whether split of an ESR signal of the oxide insulating film into three is caused by the nitrogen dioxide molecule or the nitrogen atom that replaces an oxygen atom in $SiO_2$. When an $SiO_2$ crystal structure is used as a model, the amount of calculation is enormous. Thus, in this case, two kinds of models of cluster structures as shown in FIGS. 14A and 14B were used, the structure optimization was performed on these models, and then, g-factors and hyperfine coupling constants were calculated. FIG. 14A shows a model of a nitrogen dioxide molecule in a neutral state, and FIG. 14B shows a cluster model including a Si—N—Si bond. Note that the model shown in FIG. 14B is a cluster model in which a dangling bond of a silicon atom is terminated with a hydrogen atom.

Amsterdam density functional (ADF) software was used for structure optimization of the models and calculation of the g-factors and hyperfine coupling constants of the models whose structures were optimized. In the structure optimization and the calculation of the models and the g-factors and hyperfine coupling constants of the models whose structures were optimized, "GGA:BP" was used as a functional, and "QZ4P" was used as a basic function, and "None" was used as Core Type. In addition, in the calculation of the g-factors and hyperfine coupling constants, "Spin-Orbit" was considered as a relativistic effect, and as a calculation method of ESR/EPR, "g & A-Tensor (full SO)" was employed. The calculation conditions are as follows.

TABLE 2

| Software | ADF |
| --- | --- |
| Basis function | QZ4P |
| Functional | GGA-BP |
| Core Type | None |
| Relativistic Effect | Spin-Orbit |
| Calculation method of ESR/EPR | g & A-Tensor (full SO) |

As a result of structure optimization, in the case of the nitrogen dioxide molecule shown in FIG. 14A, the bonding distance of the N—O bond was 0.1205 nm, and the angle of the O—N—O bond was 134.1°, which are close to the experimental values of the nitrogen dioxide molecule (the bonding distance: 0.1197 nm, and the bonding angle) 134.3°. In the case of the Si—N—Si cluster model shown in FIG. 14B, the bonding distance of Si—N was 0.172 nm and the angle of the Si—N—Si bond was 138.3°, which were equivalent to the bonding distance of Si—N (0.170 nm) and the angle of the Si—N—Si bond (139.0°) in the structure that had been subjected to structure optimization by first principles calculation in a state where a nitrogen atom substitutes for an oxygen atom in the $SiO_2$ crystal.

The calculated g-factors and hyperfine coupling constants are shown below.

TABLE 3

| | g-factor | | | | Hyperfine coupling constant [mT] | | | |
|---|---|---|---|---|---|---|---|---|
| | g_x | g_y | g_z | g (average) | A_x | A_y | A_z | A (average) |
| $NO_2$ | 2.0066 | 1.9884 | 2.0014 | 1.9988 | 4.54 | 4.49 | 6.53 | 5.19 |
| Si—N—Si | 2.0021 | 2.0174 | 2.0056 | 2.0084 | 3.14 | −0.61 | −0.62 | 0.64 |

As described above, the hyperfine coupling constant A corresponds to the split width of a peak of the ESR signal. According to Table 3, the average value of the hyperfine coupling constant A of the nitrogen dioxide molecule is approximately 5 mT. In the case of the Si—N—Si cluster model, only A_x in the hyperfine coupling constants A is a positive value, which is approximately 3 mT.

According to this result, the ESR spectrum that has three signals, a hyperfine structure constant of approximately 5 mT, and a g-factor of approximately 2, which are obtained by ESR measurement using an X-band, is obtained probably because of a nitrogen dioxide molecule in an $SiO_2$ crystal. Among three signals, the g-factor of the medium signal is approximately 2.

<1-3. Consideration of Deterioration Mechanism of Transistor>

A mechanism of a phenomenon in which the threshold voltage of a transistor is shifted in the positive direction when a positive gate BT stress test (+GBT) is performed is considered below based on the above results.

Figure 15:
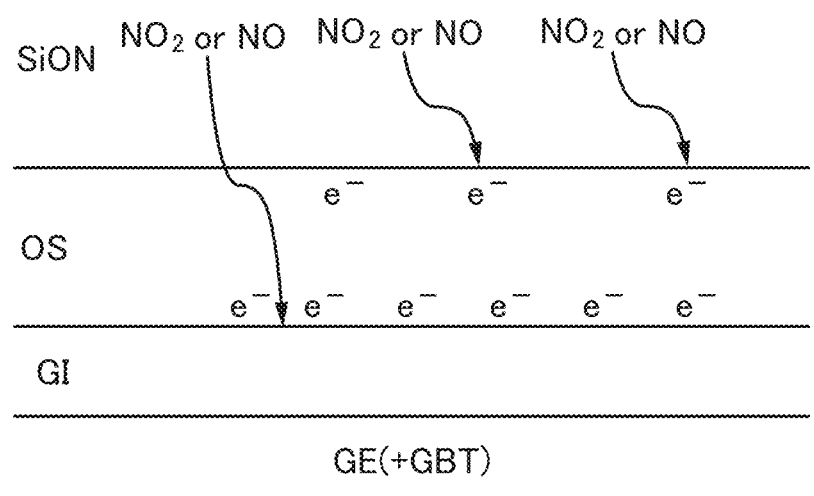
FIG. 15 illustrates a mechanism of a phenomenon in which the threshold voltage of a transistor is shifted in the positive direction.

The mechanism is considered with reference to FIG. 15. FIG. 15 illustrates a structure in which a gate (GE), a gate insulating film (GI), an oxide semiconductor film (OS), and a silicon oxynitride film (SiON) are stacked in this order. Here, a case where the silicon oxynitride film SiON that is positioned on the back channel side of the oxide semiconductor film (OS) contains nitrogen oxide is described.

First, when the positive gate BT stress test (+GBT) is performed, the electron densities of the gate insulating film GI side and the silicon oxynitride film SiON side of the oxide semiconductor film OS become higher. In the oxide semiconductor film OS, the silicon oxynitride film SiON side has a lower electron density than the gate insulating film GI side. When a nitrogen dioxide molecule or a nitrogen monoxide molecule contained in the silicon oxynitride film SiON is diffused into the interface between the gate insulating film GI and the oxide semiconductor film OS and the interface between the oxide semiconductor film OS and the silicon oxynitride film SiON, electrons on the gate insulating film GI side and the back channel side that are induced by the positive gate BT stress test (+GBT) are trapped. As a result, the trapped electrons remain in the vicinity of the interface between the gate insulating film GI and the oxide semiconductor film OS and the interface between the oxide semiconductor film OS and the silicon oxynitride film SiON; thus, the threshold voltage of the transistor is shifted in the positive direction.

That is, a lower concentration of nitrogen oxide contained in the silicon oxynitride film in contact with the oxide semiconductor film can suppress a change in the threshold voltage of the transistor. Here, as specific examples of the silicon oxynitride film in contact with the oxide semiconductor film, the protective film in contact with the back channel side, the gate insulating film, and the like can be given. By providing the silicon oxynitride film containing an extremely small amount of nitrogen oxide in contact with the oxide semiconductor film, the transistor can have excellent reliability.

<2. $V_oH$>

Next, a hydrogen atom (hereinafter referred to as $V_oH$) positioned in an oxygen vacancy $V_o$, which is one of defects contained in the oxide semiconductor film, is described.

<2-1. Energy and Stability Between Existing Modes of H>

First, the energy difference and stability in a mode of H that exists in an oxide semiconductor film is described with calculated results. Here, $InGaZnO_4$ (hereinafter referred to as IGZO (111)) was used as the oxide semiconductor film.

The structure used for the calculation is based on a 84-atom bulk model in which twice the number of a hexagonal unit cell of the IGZO(111) is arranged along the a-axis and b-axis.

Figure 16A:
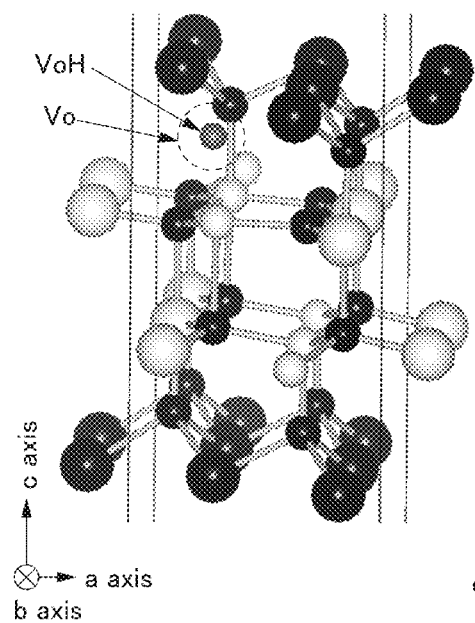
FIGS. 16A to 16D illustrate bulk models.
Figure 16B:
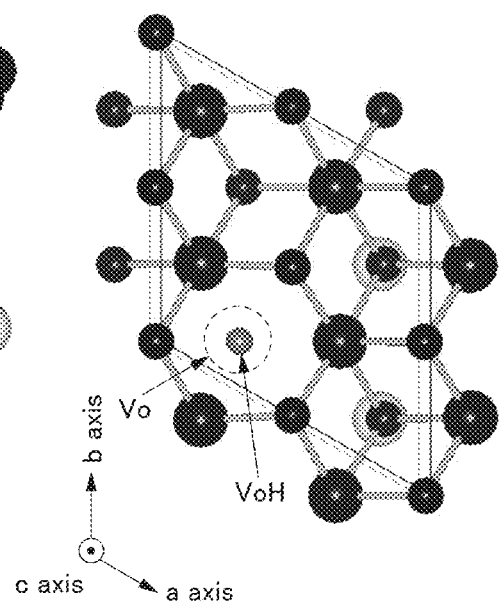

As the bulk model, a model in which one oxygen atom bonded to three indium atoms and one zinc atom is replaced with a hydrogen atom was prepared (see FIG. 16A). FIG. 16B shows a diagram in which the a-b plane of the InO layer in FIG. 16A is viewed from the c-axis direction. A region from which one oxygen atom bonded to three indium atoms and one zinc atom is removed is shown as an oxygen vacancy $V_o$, which is shown in a dashed line in FIGS. 16A and 16B. In addition, a hydrogen atom in the oxygen vacancy $V_o$ is expressed as $V_oH$.

Figure 16C:
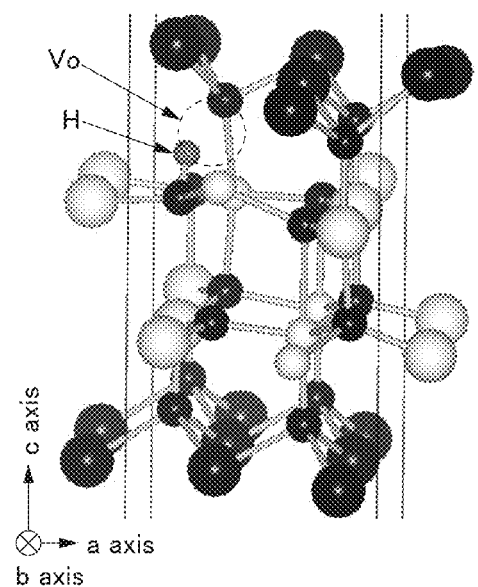
Figure 16D:
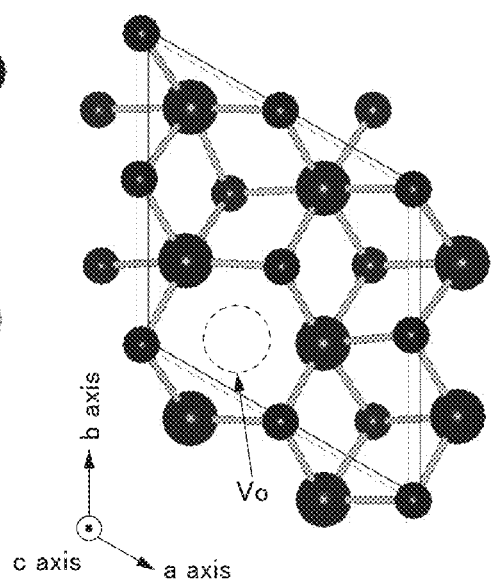

In the bulk model, one oxygen atom bonded to three indium atoms and one zinc atom is removed, whereby an oxygen vacancy $V_o$ is formed. A model in which, in the vicinity of the oxygen vacancy $V_o$, a hydrogen atom is bonded to one oxygen atom to which one gallium atom and two zinc atoms are bonded on the a-b plane was prepared (see FIG. 16C). FIG. 16D shows a diagram in which the a-b plane of the InO layer in FIG. 16C is viewed from the c-axis direction. In FIGS. 16C and 16D, an oxygen vacancy $V_o$ is shown in a dashed line. A model in which an oxygen vacancy $V_o$ is formed and, in the vicinity of the oxygen vacancy $V_o$, a hydrogen atom is bonded to one oxygen atom to which one gallium atom and two zinc atoms are bonded on the a-b plane is expressed as $V_o+H$.

Optimization calculation was performed on the above two models with a fixed lattice constant to calculate the total energy. Note that as the value of the total energy is smaller, the structure becomes more stable.

In the calculation, first principles calculation software VASP (The Vienna Ab initio simulation Package) was used. The calculation conditions are shown in Table 4.

TABLE 4

| Software | VASP |
|---|---|
| Pseudopotential | PAW method |
| Functional | GGA/PBE |
| Cut-off energy | 500 eV |
| k-point | 4 × 4 × 1 |

As pseudopotential calculation of electronic states, a potential generated by a projector augmented wave (PAW) method was used, and as a functional, generalized-gradient-approximation/Perdew-Burke-Ernzerhof (GGA/PBE) was used.

In addition, the total energy of the two models that were obtained by the calculations is shown in Table 5.

TABLE 5

| Model | Total energy |
|---|---|
| VoH | −456.084 eV |
| Vo + H | −455.304 eV |

According to Table 5, the total energy of $V_oH$ is lower than that of $V_o+H$ by 0.78 eV. Thus, $V_oH$ is more stable than $V_o+H$. This suggests that, when a hydrogen atom comes close to an oxygen vacancy ($V_o$), the hydrogen atom is easily trapped in the oxygen vacancy ($V_o$) than bonding with an oxygen atom.

<2-2. Thermodynamic State of $V_oH$>

Next, the thermodynamic state of $V_oH$, which is a hydrogen atom trapped in an oxygen vacancy ($V_o$), is evaluated with electronic state calculation, and the results are described.

The formation energies of the defects $V_oH$ contained in the IGZO(111), $(V_oH)^+$, $(V_oH)^−$, and $(V_oH)^0$, were calculated. Note that $(V_oH)^+$ represents a state in which a defect releases one electron, $(V_oH)^−$ represents a state in which a defect traps one electron, and $(V_oH)^0$ represents a state in which no electron is transferred.

Figure 19:
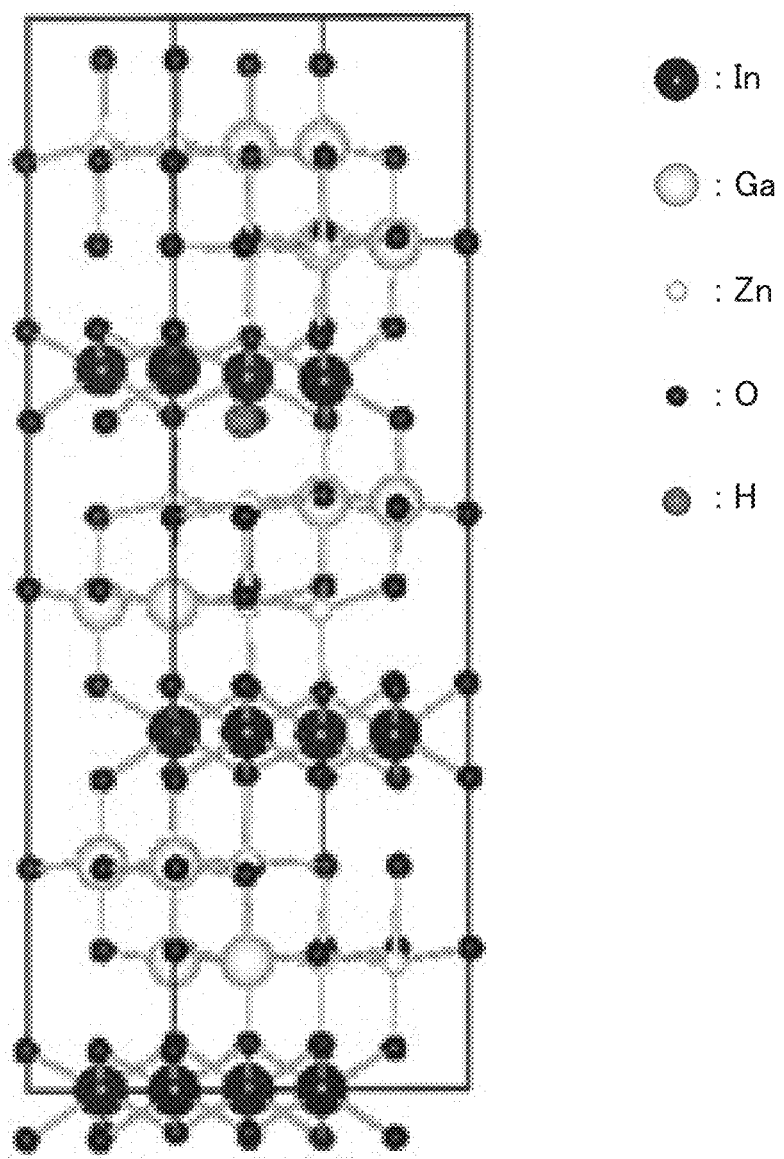
FIG. 19 illustrates the structure of a model.

In the calculation, the first principles calculation software VASP was used. The calculation conditions are shown in Table 6. FIG. 19 illustrates a model that were used for the calculation. The formation energy was calculated on the assumption of the reaction in Formula 2. As pseudopotential calculation of electronic states, a potential generated by a PAW method was used, and as a functional, Heyd-Scuseria-Ernzerhof (HSE) DFT hybrid factor (HSE06) was used. Note that the formation energy of an oxygen vacancy was calculated as follows: a dilute limit of the concentration of oxygen vacancies was assumed, and excessive expansion of electrons and holes to the conduction band and the valence band was corrected. In addition, shift of the valence band due to the defect structure was corrected using the average electrostatic potential with the valence band maximum of a complete crystal serving as the origin of energy.

TABLE 6

| Software | VASP |
|---|---|
| Pseudopotential | PAW method |
| Functional | HSE06 |
| Cut-off energy | 800 eV |
| The number of K-point samples | 2 × 2 × 1 (optimization) |
| | 4 × 4 × 1 (single) |
| Spin | Polarized |
| Shielding parameter | 0.2 |
| Exchange term mixing ratio | 0.25 |
| The number of atoms | 84 |

$$IGZO \rightarrow IGZO: V_oH + \frac{1}{2}O_2 - \frac{1}{2}H_2 \quad \text{[Formula 2]}$$

$$E_{form}(IGZO:V_oH) =$$
$$E_{tot}(IGZO:V_oH) - E_{tot}(IGZO) + \frac{1}{2}E_{tot}(O_2) - \frac{1}{2}E_{tot}(H_2)$$

Figure 20A:
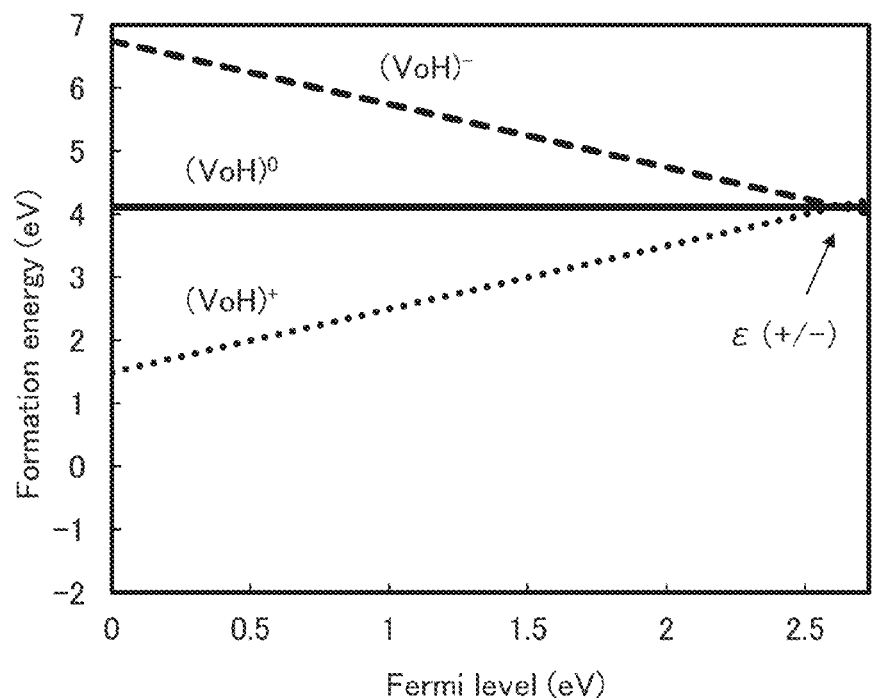
FIGS. 20A and 20B illustrate the relation between the formation energy and the transition levels of V$_o$H and the thermodynamic transition level of V$_o$H.

The formation energy obtained by the calculation is shown in FIG. 20A.

FIG. 20A shows the formation energies of $(V_oH)^+$, $(V_oH)^−$, and $(V_oH)^0$. The horizontal axis represents the Fermi level, and the vertical axis represents the formation energy. The dotted line represents the formation energy of $(V_oH)^+$, the solid line represents the formation energy of $(V_oH)^0$, and the dashed line represents the formation energy of $(V_oH)^−$. In addition, the transition level of the $V_oH$ charge from $(V_oH)^+$ to $(V_oH)^−$ through $(V_oH)^0$ is represented by $\in(+/-)$.

Figure 20B:
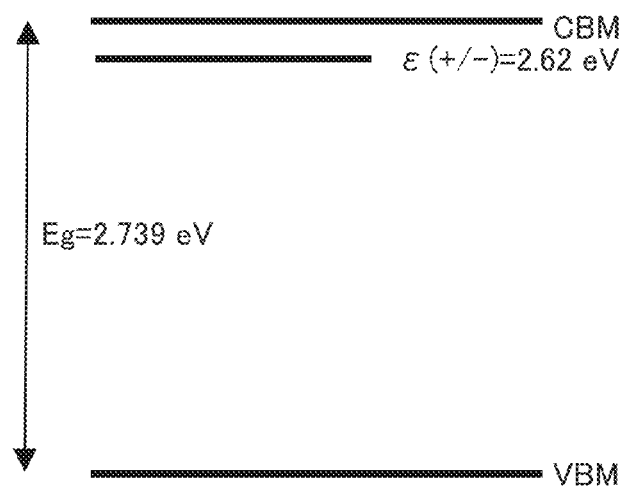

FIG. 20B shows a thermodynamic transition level of $V_oH$. From the calculation result, the energy gap of $InGaZnO_4$ was 2.739 eV. In addition, when the energy of the valence band is 0 eV, the transfer level ($\in(+/-)$) is 2.62 eV, which exists just under the conduction band. These suggest that in the case where the Fermi level exists in the energy gap, the charge state of $V_oH$ is always +1 and $V_oH$ serves as a donor. This shows that IGZO(111) becomes n-type by trapping a hydrogen atom in an oxygen vacancy ($V_o$).

Figure 21:
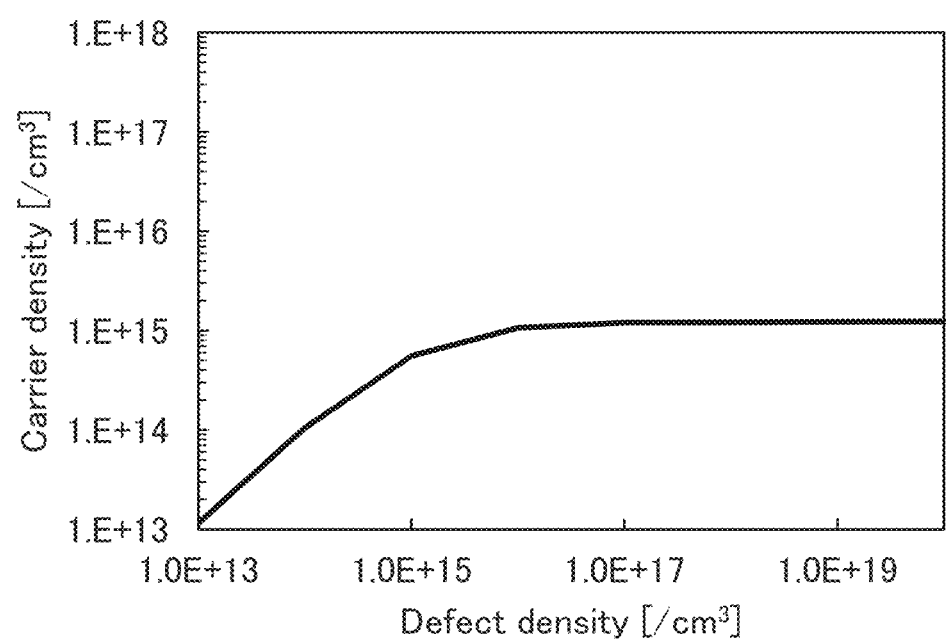
FIG. 21 shows the relation between the carrier density and the defect density of V$_o$H.

Next, FIG. 21 shows the results of evaluation of the relation between the carrier (electron) density and the defect ($V_oH$) density.

FIG. 21 shows that the carrier density increases as the defect ($V_oH$) density increases.

Accordingly, it is found that $V_oH$ in the IGZO(111) serves as a donor. In addition, it is also found that when the density of $V_oH$ becomes high, the IGZO(111) becomes n-type.

<3. Model Explaining Relation Between DOS in Oxide Semiconductor Film and Element to be DOS>

When density of states (DOS) exists inside an oxide semiconductor film and in the vicinity of the interface between the oxide semiconductor film and the outside, DOS can cause deterioration of a transistor including the oxide semiconductor film. The DOS inside the oxide semiconductor film and in the vicinity of the interface with the oxide semiconductor film can be explained on the basis of the positions of and the bonding relation among oxygen (O), an oxygen vacancy ($V_o$), hydrogen (H), and nitrogen oxide ($NO_x$). A concept of a model is described below.

In order to fabricate a transistor with stable electrical characteristics, it is important to reduce the DOS inside the oxide semiconductor film and in the vicinity of the interface (to make a highly purified intrinsic state). In order to reduce the DOS, oxygen vacancies, hydrogen, and nitrogen oxide should be reduced.

Figure 22:
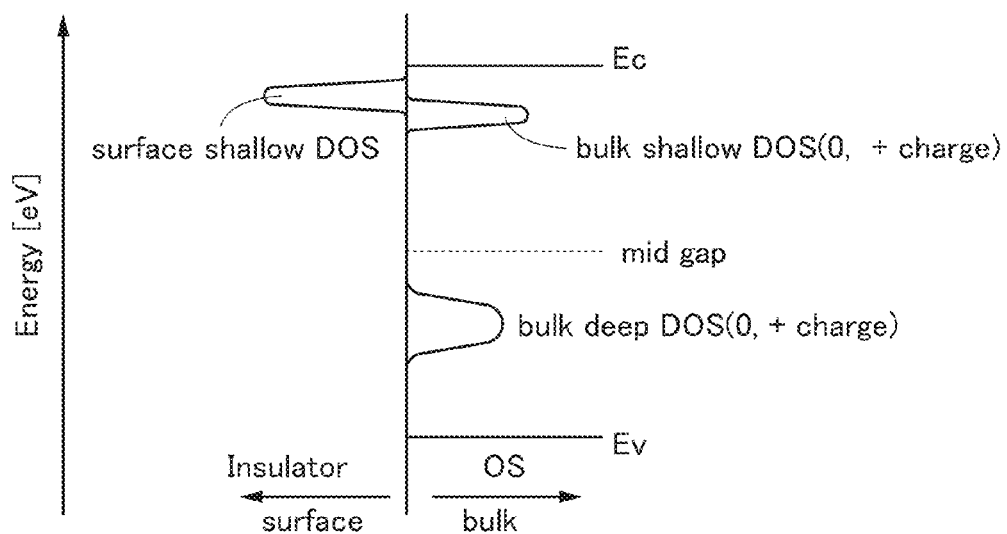
FIG. 22 illustrates a band structure of DOS inside an oxide semiconductor film and in the vicinity of the interface of the oxide semiconductor film.

FIG. 22 illustrates a band structure of DOS inside an oxide semiconductor film and in the vicinity of the interface of the oxide semiconductor film. The case where the oxide semiconductor film is the oxide semiconductor film (IGZO (111)) containing indium, gallium, and zinc is described below.

There are two types of DOS, DOS at a shallow level (shallow level DOS) and DOS at a deep level (deep level DOS). Note that in this specification, the shallow level DOS refers to DOS between energy at the conduction band minimum (Ec) and the mid gap. Thus, for example, the shallow level DOS is located closer to energy at the conduction band minimum. Note that in this specification, the deep level DOS refers to DOS between energy at the valence band maximum (Ev) and the mid gap. Thus, for example, the deep level DOS is located closer to the mid gap than to energy at the valence band maximum.

In the oxide semiconductor film, there are two types of shallow level DOS. One is DOS in the vicinity of a surface of an oxide semiconductor film (at the interface with an insulating film (insulator) or in the vicinity of the interface with the insulating film), that is, surface shallow DOS. The other is DOS inside the oxide semiconductor film, that is, bulk shallow DOS. Furthermore, as a type of the deep level DOS, there is DOS inside the oxide semiconductor film, that is, bulk deep DOS.

These types of DOS are likely to act as described below. The surface shallow DOS in the vicinity of the surface of an oxide semiconductor film is located at a shallow level from the conduction band minimum, and thus trap and loss of an electric charge are likely to occur easily in the surface shallow DOS. The bulk shallow DOS inside the oxide semiconductor film is located at a deep level from the conduction band minimum as compared to the surface shallow DOS in the vicinity of the surface of the oxide semiconductor film, and thus loss of an electric charge does not easily occur in the bulk shallow DOS.

An element causing DOS in an oxide semiconductor film is described below.

For example, when a silicon oxide film is formed over an oxide semiconductor film, indium contained in the oxide semiconductor film is taken into the silicon oxide film and replaces silicon to form shallow level DOS.

For example, in the interface between the oxide semiconductor film and the silicon oxide film, a bond between oxygen and indium contained in the oxide semiconductor film is broken and a bond between the oxygen and silicon is generated. This is because the bonding energy between silicon and oxygen is higher than the bonding energy between indium and oxygen, and the valence of silicon (tetravalence) is larger than the valence of indium (trivalence). Oxygen contained in the oxide semiconductor film is trapped by silicon, so that a site of oxygen that has been bonded to indium becomes an oxygen vacancy. In addition, this phenomenon occurs similarly when silicon is contained inside the oxide semiconductor film, as well as in the surface. Such an oxygen vacancy forms deep level DOS.

Another cause as well as silicon can break the bond between indium and oxygen. For example, in an oxide semiconductor film containing indium, gallium, and zinc, the bond between indium and oxygen is weaker and cut more easily than the bond between oxygen and gallium or zinc. For this reason, the bond between indium and oxygen is broken by plasma damages or damages due to sputtered particles, so that an oxygen vacancy can be produced. The oxygen vacancy forms deep level DOS.

The deep level DOS can trap a hole and thus serve as a hole trap (hole trapping center). This means that the oxygen vacancy forms bulk deep DOS inside the oxide semiconductor film. Since such an oxygen vacancy forms bulk deep DOS, the oxygen vacancy is an instability factor to the oxide semiconductor film.

Such deep level DOS due to an oxygen vacancy is one of causes for forming bulk shallow DOS in the oxide semiconductor film, which is described below.

In addition, an oxygen vacancy in the oxide semiconductor film traps hydrogen to be metastable. That is, when an oxygen vacancy that is deep level DOS and is capable of trapping a hole traps hydrogen, the oxygen vacancy forms bulk shallow DOS and becomes metastable. As described in <Thermodynamic state of $V_oH$> of this embodiment, when an oxygen vacancy traps hydrogen, the oxygen vacancy is neutrally or positively charged. That is, $V_oH$, which is one bulk shallow DOS in the oxide semiconductor film, releases an electron, to be neutrally or positively charged, which adversely affects the characteristics of a transistor.

It is important to reduce the density of oxygen vacancies to prevent an adverse effect on the characteristics of the transistor. Thus, by supplying excess oxygen to the oxide semiconductor film, that is, by filling oxygen vacancies with excess oxygen, the density of oxygen vacancies in the oxide semiconductor film can be lowered. In other words, the oxygen vacancies become stable by receiving excess oxygen. For example, when excess oxygen is included in the oxide semiconductor film or an insulating film provided near the interface with the oxide semiconductor film, the excess oxygen can fill oxygen vacancies in the oxide semiconductor film, thereby effectively eliminating or reducing oxygen vacancies in the oxide semiconductor film.

As described above, the oxygen vacancy may become a metastable state or a stable state by hydrogen or oxygen.

As described in <Transition level of NO in oxide insulating film> of this embodiment, nitrogen monoxide or nitrogen dioxide, which is $NO_x$, traps an electron included in the oxide semiconductor film. Because nitrogen monoxide or nitrogen dioxide, which is $NO_x$, is surface shallow DOS in the vicinity of the surface of the oxide semiconductor film, when $NO_x$ is included in the insulating film in the vicinity of the interface with the oxide semiconductor film, the characteristics of a transistor are adversely affected.

It is important to reduce the content of $NO_x$ in the insulating film in the vicinity of the interface with the oxide semiconductor film to prevent an adverse effect on the characteristics of the transistor.

<3-1. Model of Hysteresis Deterioration in Dark State of Transistor Including Oxide Semiconductor Film>

A mechanism in deterioration of a transistor including an oxide semiconductor film is described next. The transistor including an oxide semiconductor film deteriorates differently depending on whether or not the transistor is irradiated with light. When the transistor is irradiated with light, deterioration is likely to result from the bulk deep DOS at the deep level inside the oxide semiconductor film. When the transistor is not irradiated with light, deterioration is likely to result from the surface shallow DOS at the shallow level in the vicinity of the surface of the oxide semiconductor film (at the interface with an insulating film or in the vicinity thereof).

Thus, a state where the transistor including an oxide semiconductor film is not irradiated with light (dark state) is described. In the dark state, the deterioration mechanism of the transistor can be explained on the basis of trapping and releasing of a charge by the surface shallow DOS at the shallow level in the vicinity of the surface of the oxide semiconductor film (at the interface with an insulating film or in the vicinity of the interface). Note that here, a gate insulating film is described as an insulating film provided in the vicinity of the interface with the oxide semiconductor film.

Figure 23:
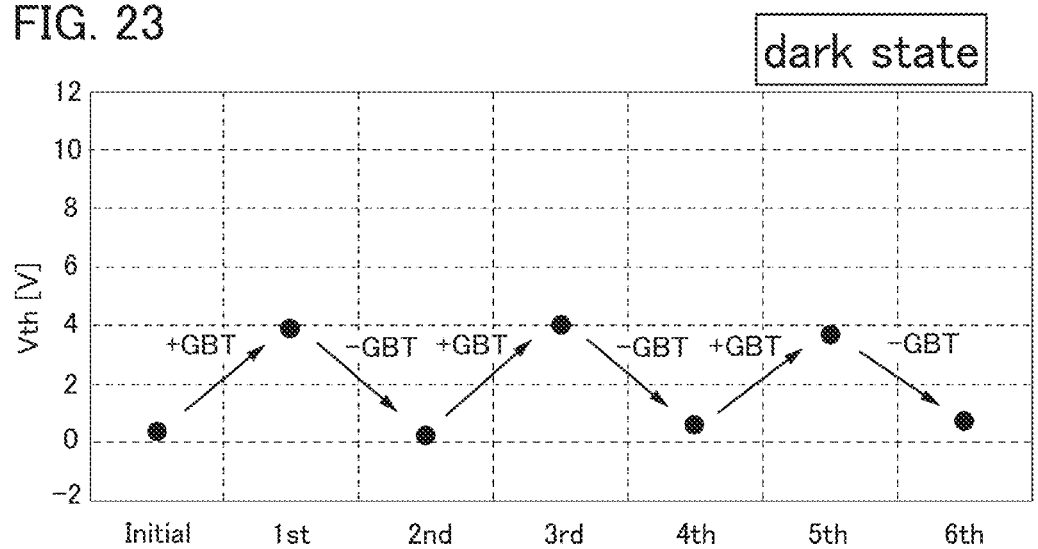
FIG. 23 is a graph showing deterioration of a transistor including an oxide semiconductor film in a dark state.

FIG. 23 shows variation in a threshold voltage ($V_{th}$) when the transistor including an oxide semiconductor film is subjected to a gate bias temperature (BT) stress test repeatedly in the dark state. As apparent from FIG. 23, the threshold voltage is shifted to a positive side by the positive gate BT (+GBT) stress test. Then, the transistor is subjected to a negative gate BT (−GBT) stress test, so that the threshold voltage is shifted to a negative side and is substantially equal to the initial value (initial). In this manner, by repeating the positive gate BT stress test and the negative gate BT stress test alternately, the threshold voltage is shifted positively and negatively (i.e., a hysteresis occurs). In other words, it is found that when the positive gate BT stress test and the negative gate BT stress test are repeated without light irradiation, the threshold voltage is shifted alternately to a positive side and then a negative side, but the shift fits in certain range as a whole.

Figure 24:
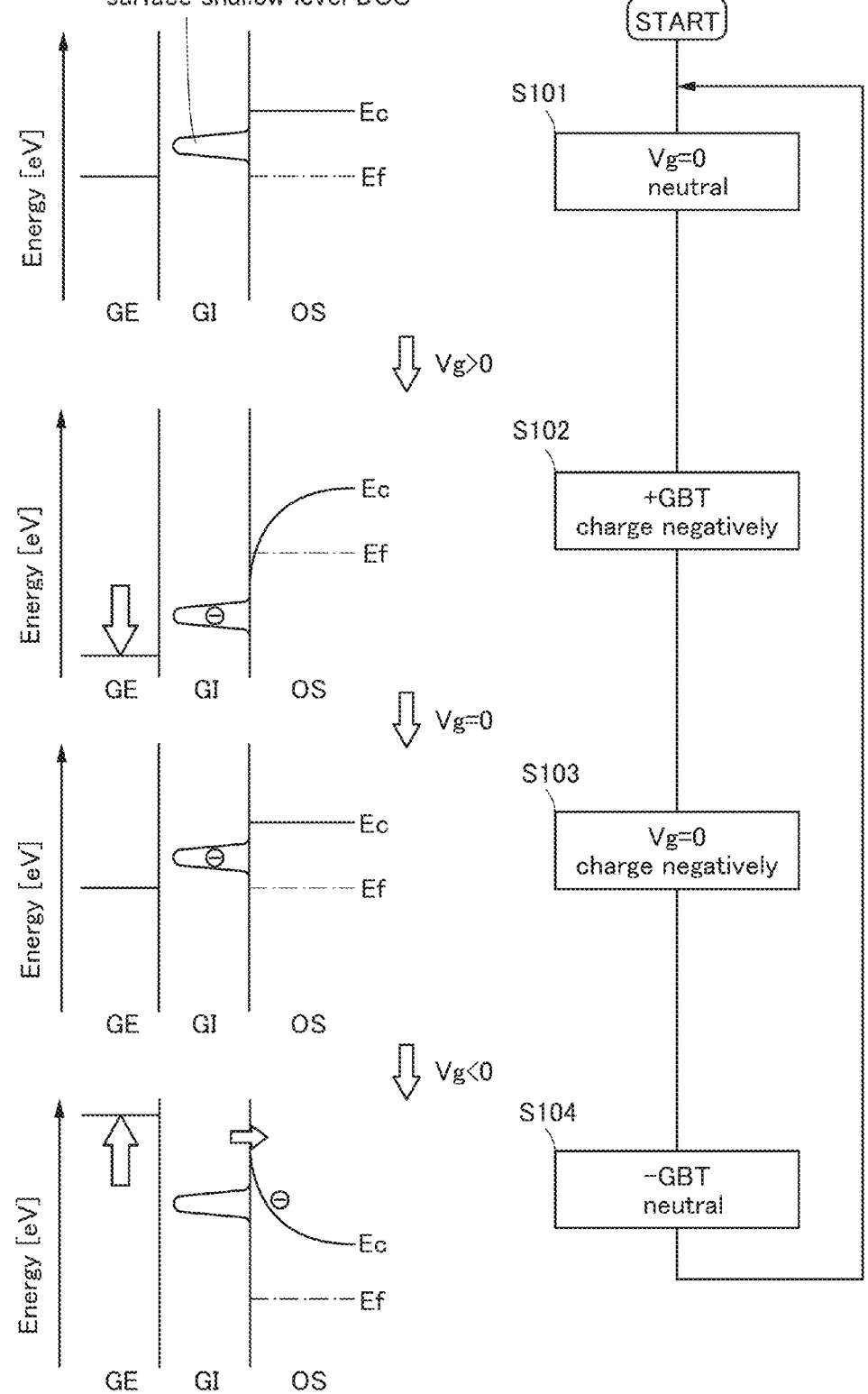
FIG. 24 illustrates deterioration of a transistor including an oxide semiconductor film in a dark state.

The variation in the threshold voltage of the transistor due to the gate BT stress test in the dark state can be explained with the surface shallow DOS in the vicinity of the surface of an oxide semiconductor film. FIG. 24 illustrates a band structure of an oxide semiconductor film and flow charts corresponding to the band structure.

Before application of the gate BT stress (at the gate voltage ($V_g$) of 0), the surface shallow DOS in the vicinity of the surface of an oxide semiconductor film has energy higher than the Fermi level ($E_f$) and is electrically neutral since an electron is not trapped (Step S101 in FIG. 24). In Step S101, the threshold voltage measured at this time is set as an initial value before the gate BT stress is applied.

Next, the positive gate BT stress test (dark state) is performed. When the positive gate voltage is applied, the conduction band is curved and the energy of the surface shallow DOS in the vicinity of the surface of the oxide semiconductor film becomes lower than the Fermi level. Thus, an electron is trapped in the surface shallow DOS in the vicinity of the surface of the oxide semiconductor film, so that the DOS is charged negatively (Step S102 in FIG. 24).

Next, the application of stress is stopped such that the gate voltage is 0. By the gate voltage at 0, the surface shallow DOS in the vicinity of the surface of an oxide semiconductor film has energy higher than the Fermi level. However, it takes a long time for the electron trapped in the surface shallow DOS in the vicinity of the surface of the oxide semiconductor film to be released. Thus, the surface shallow DOS in the vicinity of the surface of the oxide semiconductor film remains charged negatively (Step S103 in FIG. 24). At this time, a channel formation region of the transistor is being subjected to application of a negative voltage as well as the gate voltage. Accordingly, a gate voltage that is higher than the initial value should be applied so as to turn on the transistor, so that the threshold voltage is shifted to a positive side. In other words, the transistor tends to be normally off.

Next, a negative gate voltage is applied as the negative gate BT stress test (dark state). When the negative gate voltage is applied, the conduction band is curved and the energy of the surface shallow DOS in the vicinity of the surface of the oxide semiconductor film becomes much higher. Thus, the electron trapped in the surface shallow DOS in the vicinity of the surface of the oxide semiconductor film is released, so that the DOS becomes electrically neutral (Step S104 in FIG. 24).

Next, the application of stress is stopped such that the gate voltage is 0. The surface shallow DOS in the vicinity of the surface of an oxide semiconductor film at this time has released the electron and is electrically neutral (Step S101). Thus, the threshold voltage is shifted to a positive side, so that it returns to the initial value before the gate BT stress tests. The negative gate BT test and the positive gate BT stress test are repeated in the dark state, so that the threshold voltage is shifted repeatedly to the positive side and to the negative side. However, an electron trapped in the surface shallow DOS in the vicinity of the surface of an oxide semiconductor film at the time of the positive gate BT stress test is released at the time of the negative gate BT stress test; therefore, it is found that the threshold voltage is shifted within a certain range as a whole.

As described above, the shift in the threshold voltage of a transistor due to the gate BT stress test in the dark state can be explained on the basis of the understanding of the surface shallow DOS in the vicinity of the surface of the oxide semiconductor film.

<3-2. Model of Deterioration in Bright State of Transistor Including Oxide Semiconductor Film>

Then, a deterioration mechanism under light irradiation (bright state) is described here. The deterioration mechanism of the transistor in the bright state is explained on the basis of the trap and release of an electron in the bulk deep DOS at the deep level in the oxide semiconductor film.

Figure 25:
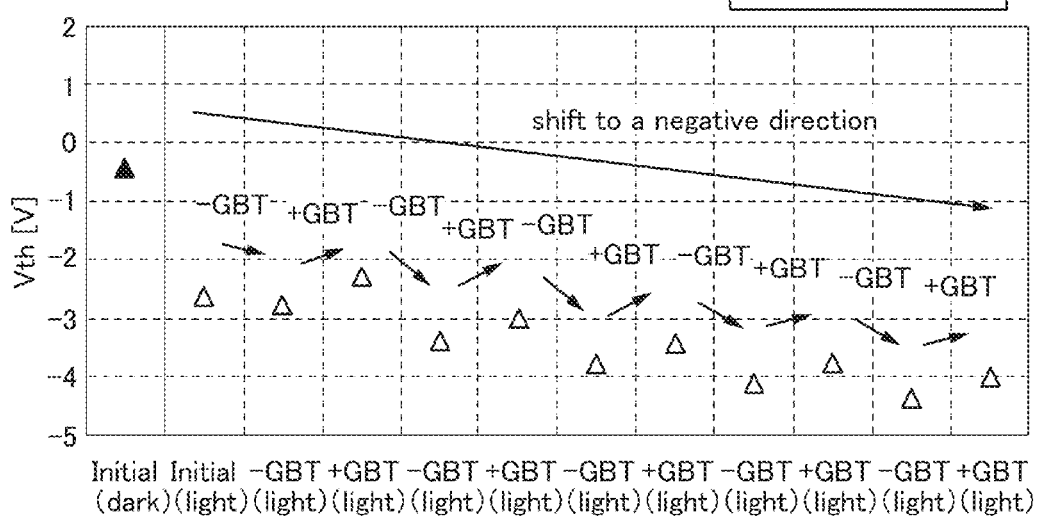
FIG. 25 is a graph showing deterioration of a transistor including an oxide semiconductor film under light irradiation.

FIG. 25 shows the shift in the threshold voltage ($V_{th}$) when the gate BT stress test is conducted repeatedly on the transistor including an oxide semiconductor film in the bright state. As shown in FIG. 25, the threshold voltage ($V_{th}$) is shifted from the initial value (initial) in the negative direction.

In FIG. 25, a value measured in the dark state without application of the gate BT stress is plotted as the initial value of the threshold voltage. Then, the threshold voltage is measured in the bright state without application of the gate BT stress. As a result, the threshold voltage in the bright state is shifted to a negative side greatly from the threshold voltage in the dark state. One of the conceivable factors is that an electron and a hole are generated by light irradiation and the generated electron is excited to the conduction band. In other words, even when the gate BT stress is not applied, the threshold voltage of the transistor including an oxide semiconductor film is shifted to a negative side by light irradiation, so that the transistor is easily normally on. In this case, as the energy gap of the oxide semiconductor film is larger, or as fewer DOS exist in the gap, fewer electrons are excited. For that reason, the shift in the threshold voltage due to light irradiation is small in that case.

Then when the negative gate BT stress is applied under light irradiation (−GBT), the threshold voltage is further shifted to a negative side.

After that, the positive gate BT (+GBT) stress test is conducted under light irradiation, so that the threshold voltage is shifted to a positive side.

Further, when the negative gate BT stress test and the positive gate BT stress test are repeated under light irradiation, the threshold voltage is shifted to a positive side and a negative side repeatedly; as a result, it is found that the threshold voltage is shifted gradually to a negative side as a whole.

Figure 26:
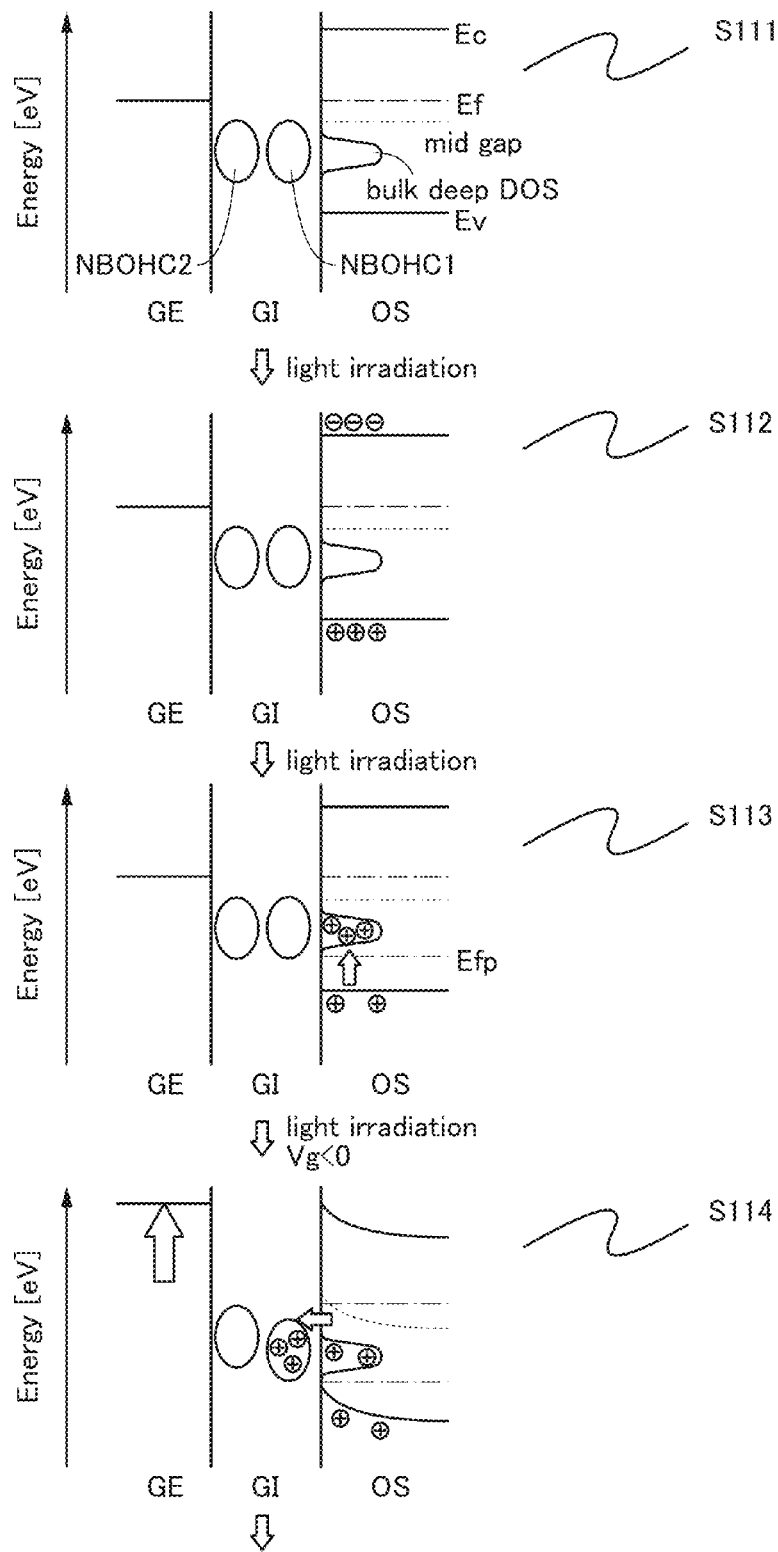
FIG. 26 illustrates showing deterioration of a transistor including an oxide semiconductor film under light irradiation.
Figure 27:
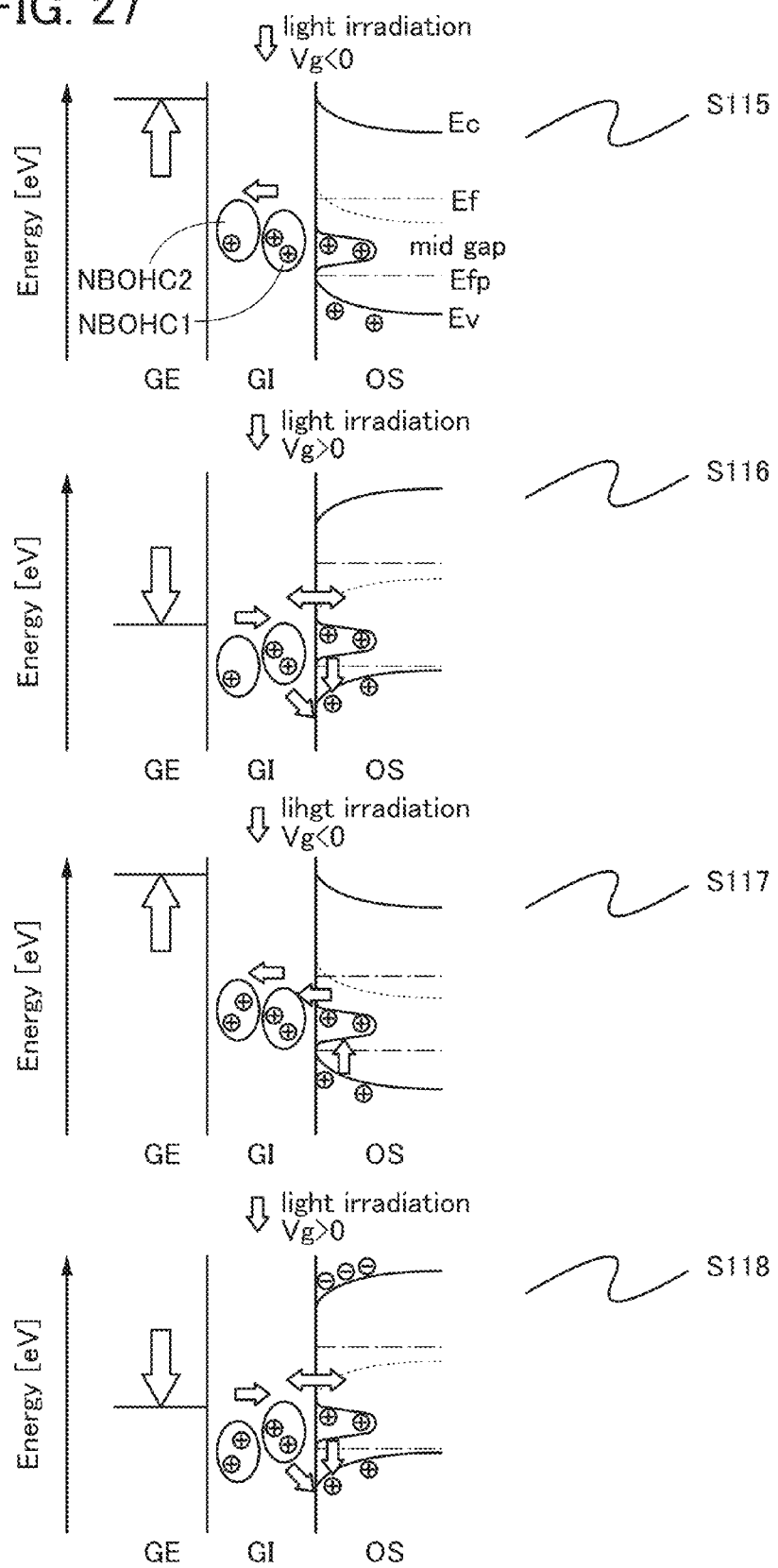
FIG. 27 is a graph showing deterioration of a transistor including an oxide semiconductor film under light irradiation.

In the gate BT stress tests (where the positive gate BT stress test and the negative gate BT stress test are repeated) in the bright state, a mechanism of the shift in the threshold voltage of the transistor is explained with reference to the band structures in FIG. 26 and FIG. 27. With reference to FIG. 26 and FIG. 27, the bulk deep DOS in the oxide semiconductor film and the non bridging oxygen hole centers (NBOHC1 and NBOHC2) in the gate insulating film are described. Note that the non bridging oxygen hole center (NBOHC1) is NBOHC that is located closer to the interface with the oxide semiconductor film (on the surface side) than the non bridging oxygen hole center (NBOHC2) is.

Before the gate BT stress test and light irradiation (when the gate voltage ($V_g$) is 0), the bulk deep DOS in the oxide semiconductor film has energy lower than the Fermi level ($E_f$), and is electrically neutral since holes are not trapped (Step S111 in FIG. 26). At this time, the threshold voltage measured in the dark state is regarded as the initial value in the dark state.

Next, the oxide semiconductor film is irradiated with light without being subjected to the gate BT stress, so that electrons and holes are generated (Step S112 in FIG. 26). The generated electrons are excited to the conduction band, so that the threshold voltage is shifted to a negative side (electrons are not described in the subsequent steps). In addition, the generated holes lower the quasi-the Fermi level ($E_{fp}$) of holes. Because the quasi-the Fermi level ($E_{fp}$) of holes is lowered, holes are trapped in the bulk deep DOS inside the oxide semiconductor film (Step S113 in FIG. 26). Accordingly, under light irradiation without the gate BT stress test, the threshold voltage is shifted to the negative side, so that the transistor easily becomes normally on, unlike the transistor in the dark state.

Next, the negative gate BT stress test is conducted under light irradiation, so that an electric field gradient is generated and holes trapped in the bulk deep DOS inside the oxide semiconductor film are injected to the non bridging oxygen hole center (NBOHC1) in the gate insulating film (Step S114 in FIG. 26). In addition, some holes move into the non bridging oxygen hole centers (NBOHC2) further inside the gate insulating film by the electric field (Step S115 in FIG. 27). The movement of holes from the non bridging oxygen hole centers (NBOHC1) to the non bridging oxygen hole centers (NBOHC2) in the gate insulating film progresses with time of the electric field application. The holes in the non bridging oxygen hole centers (NBOHC1 and NBOHC2) in the gate insulating film act as positively-charged fixed charges, and shift the threshold voltage to the negative side, so that the transistor easily becomes normally on.

Light irradiation and the negative gate BT stress test are described as different steps for easy understanding, but the present invention is not construed as being limited to description in this embodiment. For example, Step S112 to Step S115 can occur in parallel.

Next, the positive gate BT stress test is conducted under light irradiation, and holes trapped in the bulk deep DOS inside the oxide semiconductor film and holes in the non bridging oxygen hole centers (NBOHC1) in the gate insulating film are released by the application of the positive gate voltage (Step S116 in FIG. 27). Thus, the threshold voltage is shifted to the positive side. Note that because the non bridging oxygen hole center (NBOHC2) in the gate insulating film is at the deep level in the gate insulating film, almost no holes in the non bridging oxygen hole centers (NBOHC2) are directly released even when the positive gate BT stress test is in the bright state. In order that the holes in the non bridging oxygen hole center (NBOHC2) in the gate insulating film can be released, the holes should move to the non bridging oxygen hole centers (NBOHC1) on the surface side. The movement of a hole from the non bridging oxygen hole center (NBOHC2) to the non bridging oxygen hole center (NBOHC1) in the gate insulating film progresses little by little with the time of electric field application. Therefore, the shift amount to the positive side of the threshold voltage is small, and the threshold voltage does not return completely to the initial value.

In addition, the movement of a hole occurs between the non bridging oxygen hole center (NBOHC1) in the gate insulating film and the bulk deep DOS inside the oxide semiconductor film. However, because many holes have been trapped in the bulk deep DOS inside the oxide semiconductor film, the whole electric charge amount of the oxide semiconductor film and the gate insulating film can be hardly reduced.

Next, the negative gate BT stress test is conducted again under light irradiation, so that an electric field gradient occurs and holes trapped in the bulk deep DOS inside the oxide semiconductor film are injected into the non bridging oxygen hole center (NBOHC1) in the gate insulating film. In addition, some of the holes are injected into the non bridging oxygen hole center (NBOHC2) that is deeper inside the gate insulating film by an electric field (Step S117 in FIG. 27). Note that the holes in the non bridging oxygen hole centers (NBOHC2) in the gate insulating film, which have been injected thereinto in Step S115, are left without being released. Thus, holes are further injected, so that the number of holes serving as fixed charges is further increased. The threshold voltage is further shifted to the negative side, so that the transistor further easily becomes normally on.

Next, the positive gate BT stress test is conducted under light irradiation, so that holes trapped in the bulk deep DOS in the oxide semiconductor film and holes in the non bridging oxygen hole center (NBOHC1) in the gate insulating film are released by application of the positive gate voltage (Step S118 in FIG. 27). As a result, the threshold voltage is shifted to the positive side. However, the holes in the non bridging oxygen hole center (NBOHC2) in the gate insulating film are hardly released. Accordingly, the shift amount to the positive side of the threshold voltage is small, and the threshold voltage does not return completely to the initial value.

It is presumed that by repeating the negative gate BT stress test and the positive gate BT stress test in the bright state as described above, the threshold voltage is gradually shifted to the negative side as a whole while the threshold voltage is shifted to the positive side and the negative side repeatedly.

The shift of the threshold voltage of the transistor in the gate BT stress test in the bright state can be explained on the basis of the bulk deep DOS inside the oxide semiconductor film and the non bridging oxygen hole centers (NBOHC1 and NBOHC2) in the gate insulating film.

<3-3. Process Model of Dehydration, Dehydrogenation, and Oxygen Addition of Oxide Semiconductor Film>

In order to fabricate a transistor with stable electrical characteristics, it is important to reduce the DOS inside the oxide semiconductor film and in the vicinity of the interface of the oxide semiconductor film (to make a highly purified intrinsic state). A process model where the oxide semiconductor film is highly purified to be intrinsic is described below. Dehydration or dehydrogenation of the oxide semiconductor film are described first and then oxygen addition where an oxygen vacancy (Vo) is filled with oxygen is described.

Before a process model where the oxide semiconductor film is highly purified to be intrinsic is described, the position at which an oxygen vacancy is likely to be generated in the oxide semiconductor film is described. In the oxide semiconductor film containing indium, gallium, and zinc, the bond between indium and oxygen is broken most easily as compared to the bond between gallium and oxygen and the bond between zinc and oxygen. Thus, a model where the bond between indium and oxygen is broken to form an oxygen vacancy is described below.

When the bond between indium and oxygen is broken, oxygen is released and a site of the oxygen that has been bonded to indium serves as an oxygen vacancy. The oxygen vacancy forms the deep level DOS at the deep level of the oxide semiconductor film. Because the oxygen vacancy in the oxide semiconductor film is instable, it traps oxygen or hydrogen to be stable. For this reason, when hydrogen exists near an oxygen vacancy, the oxygen vacancy traps hydrogen to become $V_oH$. The $V_oH$ forms the shallow level DOS at the shallow level in the oxide semiconductor film.

Figure 28A:
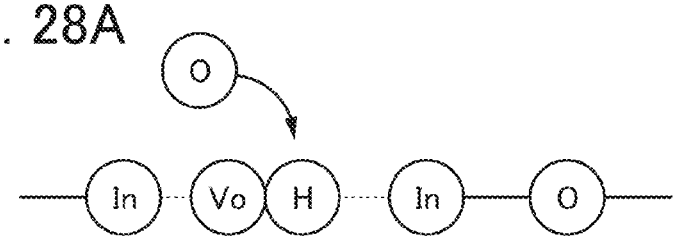
FIGS. 28A to 28F illustrate a model where an oxide semiconductor film is highly purified to be intrinsic.
Figure 28B:
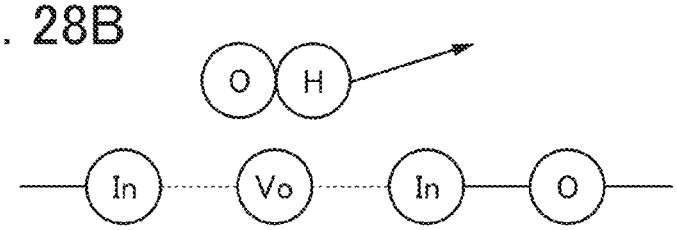

Next, when oxygen comes close to the $V_oH$ in the oxide semiconductor film, oxygen extracts hydrogen from $V_oH$ to become a hydroxyl group (OH), so that hydrogen is released from the $V_oH$ (see FIGS. 28A and 28B). The oxygen can move in the oxide semiconductor film so as to come closer to hydrogen by heat treatment and the like.

Figure 28C:
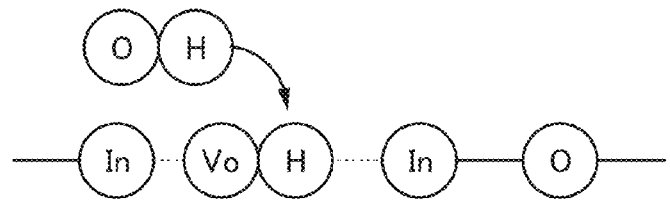
Figure 28D:
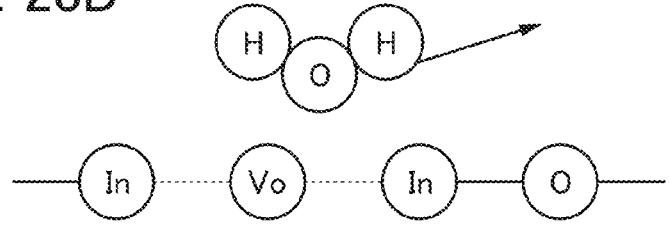

Further, when the hydroxyl group comes closer to another $V_oH$ in the oxide semiconductor film, the hydroxyl group extracts hydrogen from $V_oH$ to become a water molecule ($H_2O$), so that hydrogen is released from $V_oH$ (see FIGS. 28C and 28D). In this manner, one oxygen releases two hydrogen from the oxide semiconductor film. This is referred to as dehydration or dehydrogenation of the oxide semiconductor film. By the dehydration or dehydrogenation, the shallow level DOS at the shallow level in the oxide semiconductor film is reduced, and the deep level DOS is formed.

Figure 28E:
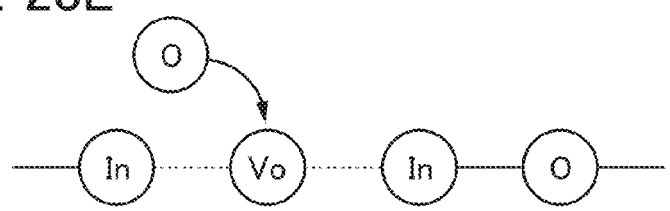
Figure 28F:
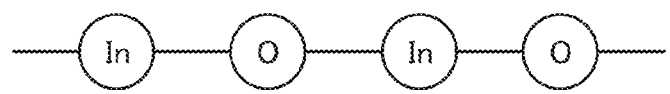

Next, when oxygen comes close to an oxygen vacancy in the oxide semiconductor film, oxygen is trapped by the oxygen vacancy, so that the oxygen vacancy is reduced (see FIGS. 28E and 28F). This is referred to as oxygen addition in the oxide semiconductor film. By the oxygen addition, the deep level DOS at the deep level in the oxide semiconductor film is reduced.

As described above, when dehydration or dehydrogenation and oxygen addition of the oxide semiconductor film are performed, the shallow level DOS and the deep level DOS in the oxide semiconductor film can be reduced. This process is referred to as a highly purification process for making an intrinsic oxide semiconductor.

Note that the structures, methods, and the like described in this embodiment can be used as appropriate in combination with any of the structures, methods, and the like described in the other embodiments and examples.

Embodiment 3

In this embodiment, impurities included in an oxide semiconductor film in a transistor and deterioration of the transistor characteristics are described. In the description, the IGZO(111) is used for the oxide semiconductor film and carbon is used as one of the impurities.

<1. Effect of Carbon in IGZO>

An electronic state was calculated on a model where a carbon atom was introduced into the IGZO(111).

Figure 29A:
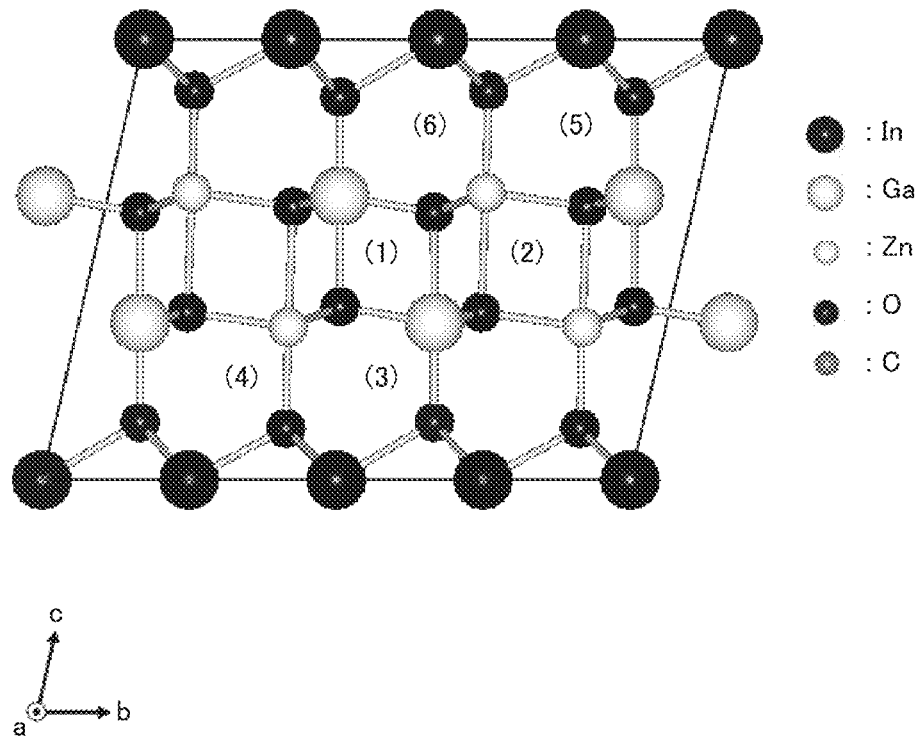
FIGS. 29A to 29C illustrate a crystalline model of InGaZnO$_4$ and a defect.

For the calculation, a IGZO(111) crystal model (the number of atoms: 112) shown in FIG. 29A was used.

Here, as the model where a carbon atom is included in the IGZO(111), as shown in FIG. 29A and Table 7, the following models were used: models in each of which a carbon atom was put in the respective interstitial sites (1) to (6), a model where one indium atom was replaced with a carbon atom, a model where one gallium atom was replaced with a carbon atom, a model where one zinc atom was replaced with a carbon atom, and a model where one oxygen atom was replaced with a carbon atom.

TABLE 7

| Arrangement Position | | Proximate metal atoms |
| --- | --- | --- |
| (1) | between (Ga,Zn)O and (Ga,Zn)O | Ga4, Zn2 |
| (2) | | Ga2, Zn4 |
| (3) | between (Ga,Zn)O and InO | In3, Ga2, Zn1 |
| (4) | | In3, Ga1, Zn2 |
| (5) | | In1, Ga2, Zn1 |
| (6) | | In1, Ga1, Zn2 |

<1-1. Model where Carbon Atom was Put in Interstitial Site>

A stable configuration was examined by comparing the energy after structure optimization of the models where carbon atoms were put in the respective interstitial sites (1) to (6). The calculation conditions are shown in Table 8. Note that GGA was used for exchange-correlation function, and thus the band gap tended to be underestimated.

TABLE 8

| | |
| --- | --- |
| Software | VASP |
| Model | InGaZnO4 crystal (112 atoms) |
| Calculation | Structure optimization (fixed lattice constant) |
| Functional | GGA-PBE |
| Pseudopotential | PAW method |
| Cut-off energy | 500 eV |
| k-point | 1 × 1 × 1 (optimization), 3 × 3 × 4 (state density) |

The results of the structure optimization calculation of the models where carbon atoms were put in the respective interstitial sites (1) to (6) are shown in Table 9.

TABLE 9

| Initial arrangement | After optimization | Energy (relative value) |
| --- | --- | --- |
| (1) interstitial site (Ga4, Zn2) | (CO)o (M1 = Ga, M2 = Ga, M3 = Zn, M4 = Zn) | −618.511 eV (0.326 eV) |
| (2) interstitial site (Ga2, Zn4) | interstitial site (Ga2, Zn4) | −615.091 eV (3.746 eV) |
| (3) interstitial site (In3, Ga2, Zn1) | (CO)o (M1 = In, M2 = Ga, M3 = In, M4 = In) | −618.640 eV (0.197 eV) |
| (4) interstitial site (In3, Ga1, Zn2) | (CO)o (M1 = In, M2 = Zn, M3 = In, M4 = In) | −618.196 eV (0.641 eV) |
| (5) interstitial site (In1, Ga2, Zn1) | bonded to In1, O3 | −618.140 eV (0.697 eV) |
| (6) interstitial site (In1, Ga1, Zn2) | bonded to In1, O2 | −618.837 eV (0.000 eV) |

Figure 29B:
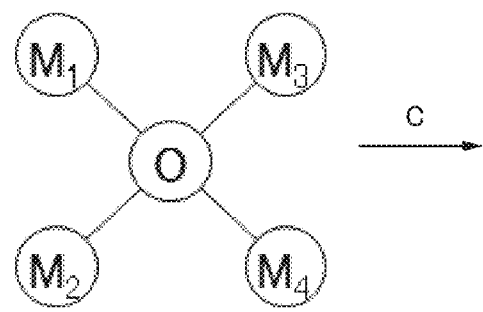
Figure 29C:
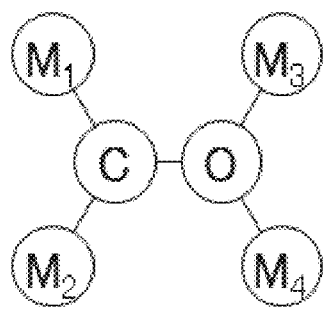

The interstitial sites were selected as the original position of a carbon atom. After the structure optimization was performed, a model where a carbon atom was put in the interstitial site (1), (3), or (4) had a $(CO)_o$ defect structure as illustrated in FIG. 29C. Note that $(CO)_o$ means that one oxygen atom in the structure in FIG. 29B is replaced with CO, as illustrated in the structure in FIG. 29C. In the $(CO)_o$ defect structure, a carbon atom is bonded to an oxygen atom. The carbon atom is bonded to an atom $M_1$ and an atom $M_2$.

The oxygen atom is bonded to an atom $M_3$ and an atom $M_4$. A model where a carbon atom was put in the interstitial site (5) or (6) has a structure in which a carbon atom was bonded to atoms in the IGZO(111). When the energy was compared, a carbon atom was more stable in the $(CO)_o$ defect structure and in a structure where a carbon atom was bonded to the atoms in the IGZO(111) than in the interstitial site.

Figure 30A:
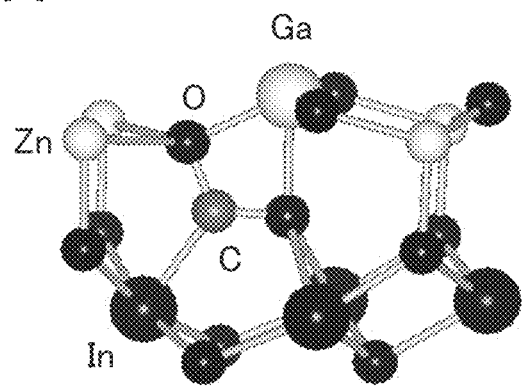
FIGS. 30A and 30B illustrate a structure of a model in which a carbon atom is put in (6) and its density of states.
Figure 30B:
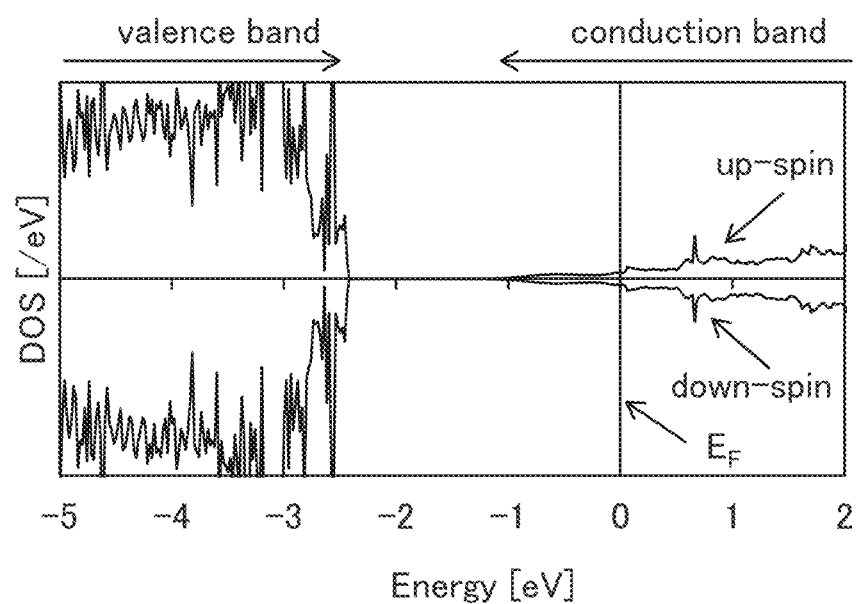

FIG. 30A shows a structure of the model that has the lowest energy and is the most stable (model where a carbon atom was put in the interstitial site (6)) in the calculation. FIG. 30B shows the density of states. In FIG. 30B, when the Fermi level $E_F$ is 0 eV in the horizontal axis, the density of states of up-spin and down-spin are shown in the upper and lower sides of the Fermi level $E_F$, respectively.

In the structure shown in FIG. 30A, a carbon atom is bonded to one indium atom and two oxygen atoms. In a model where a silicon atom belonging to the same group as a carbon atom was put in the interstitial site, the silicon atom was bonded only to an oxygen atom. The results indicate that the difference in bonding state between the silicon atom and the carbon atom may be attributed to differences of their ionic radiuses and electronegativity. In FIG. 30B, when the density of states from the conduction band minimum to the Fermi level $E_F$ is integrated, the density of states corresponds to two electrons. The Fermi level $E_F$ is positioned on the side closer to the vacuum level than the conduction band minimum is by two electrons; thus, it is presumed that, when the carbon atom is put in the interstitial site, two electrons are released from the carbon atom, so that the IGZO(111) becomes n-type.

<1-2. Model where Metal Element was Replaced with Carbon Atom>

Figure 31A:
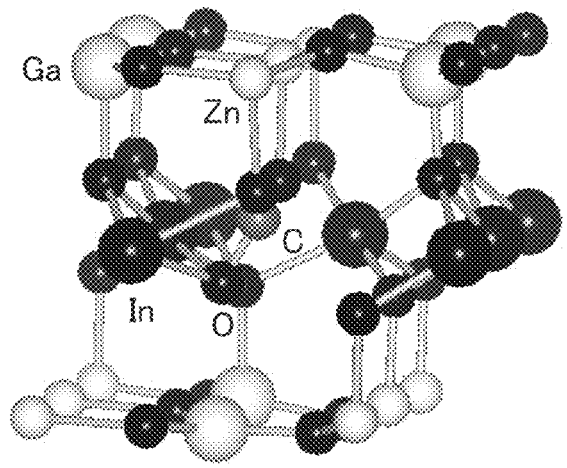
FIGS. 31A and 31B illustrate a structure of a model in which an indium atom is replaced with a carbon atom and its density of states.
Figure 31B:
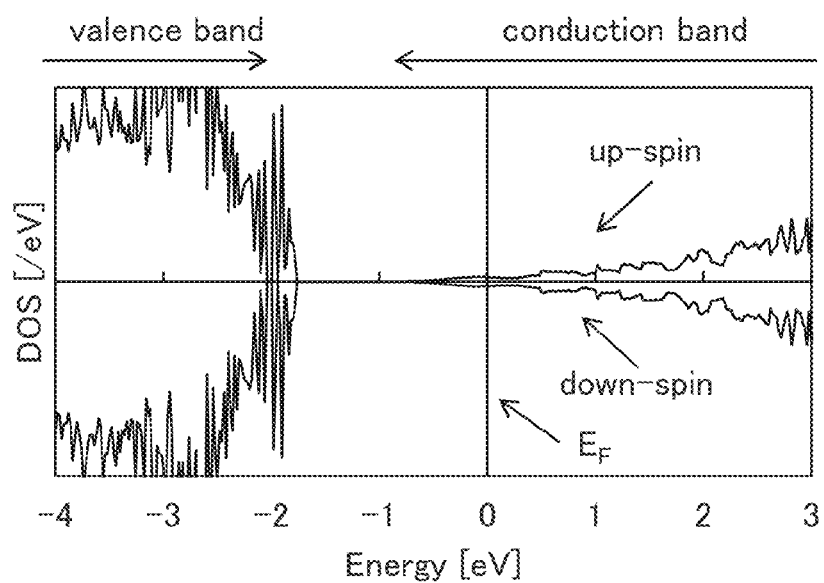

FIGS. 31A and 31B show the optimal structure and density of states in a model where one indium atom was replaced with a carbon atom. Note that in the horizontal axis of FIG. 31B, the Fermi level $E_F$ is 0 eV.

In the structure of FIG. 31A, a carbon atom is bonded to three oxygen atoms and positioned in a plane of a triangle having oxygen atoms as the vertexes. Although the sketch of the density of states illustrated in FIG. 31B is almost the same as that of the density of states in the case of no defect, the Fermi level $E_F$ is positioned on the side closer to the vacuum level than the conduction band minimum is by one electron; thus, it is presumed that, when an indium atom is replaced with a carbon atom, one electron is released from the carbon atom, so that the IGZO(111) became n-type. This is probably because a trivalent indium atom was replaced with a tetravalent carbon atom.

Figure 32A:
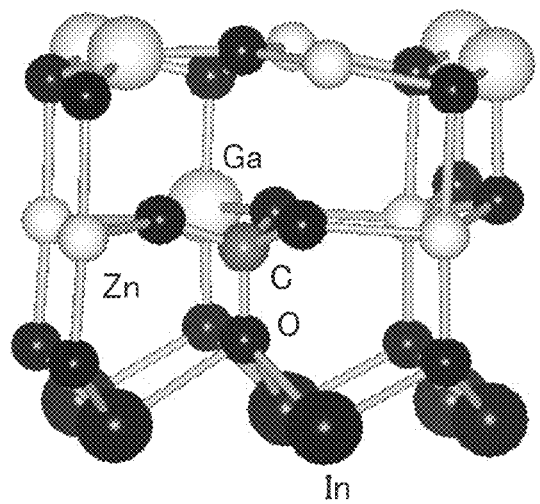
FIGS. 32A and 32B illustrate a structure of a model in which a gallium atom is replaced with a carbon atom and its density of states.
Figure 32B:
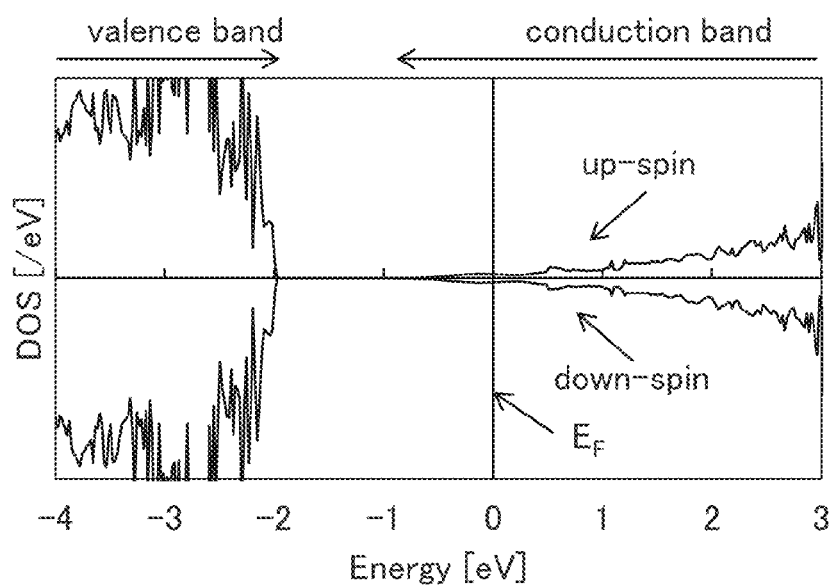

FIGS. 32A and 32B show the optimal structure and density of states in a model where one gallium atom was replaced with a carbon atom. Note that in the horizontal axis of FIG. 32B, the Fermi level $E_F$ is 0 eV.

In the structure of FIG. 32A, a carbon atom is bonded to four oxygen atoms and positioned in almost the center of a tetrahedron having oxygen atoms as the vertexes. Although the sketch of the density of states illustrated in FIG. 32B is almost the same as that of the density of states in the case of no defect, the Fermi level $E_F$ is positioned on the side closer to the vacuum level than the conduction band minimum is by one electron; thus, it is presumed that, when a gallium atom is replaced with a carbon atom, one electron is released from the carbon atom, so that the IGZO(111) became n-type. This is probably because a trivalent gallium atom is replaced with a tetravalent carbon atom.

Figure 33A:
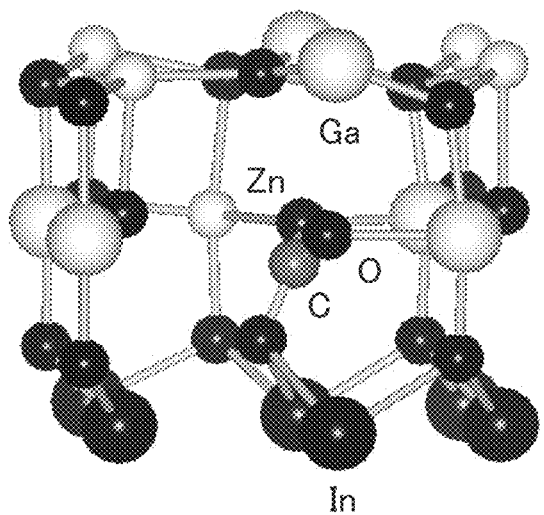
FIGS. 33A and 33B illustrate a structure of a model in which a zinc atom is replaced with a carbon atom and its density of states.
Figure 33B:
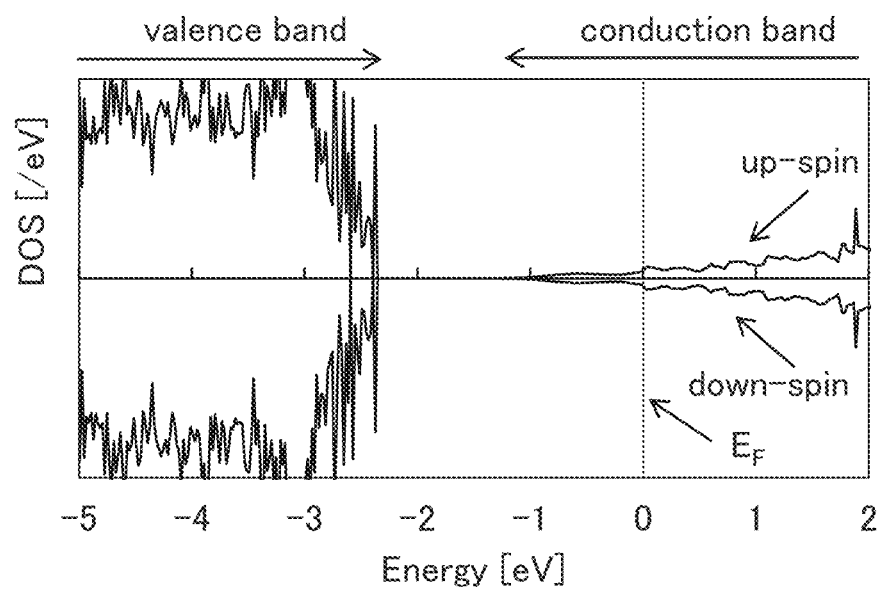

FIGS. 33A and 33B show the optimal structure and density of states in a model where one zinc atom was replaced with a carbon atom. Note that in the horizontal axis of FIG. 33B, the Fermi level $E_F$ is 0 eV.

In the structure of FIG. 33A, a carbon atom is bonded to three oxygen atoms and positioned in a plane of a triangle having oxygen atoms as the vertexes. Although the sketch of the density of states illustrated in FIG. 33B is almost the same as that of the density of states in the case of no defect, the Fermi level $E_F$ is positioned on the side closer to the vacuum level than the conduction band minimum is by two electrons; thus, it is presumed that, when a zinc atom is replaced with a carbon atom, two electrons are released from the carbon atom, so that the IGZO(111) became n-type. This is probably because a divalent zinc atom was replaced with a tetravalent carbon atom.

<1-3. Model where Oxygen Atom was Replaced with Carbon Atom>

Next, whether an oxygen atom can be replaced with a carbon atom was examined. In the case where one oxygen atom is replaced with a carbon atom, there are four oxygen atom sites in consideration of a combination of metals that are bonding partners of an oxygen atom, and substitution models for the sites were formed and structure optimization calculation was performed. As a result, a model where an oxygen atom bonded to two gallium atoms and one zinc atom was replaced with a carbon atom was energetically stable.

The IGZO(111) formed in an oxygen atmosphere contains sufficient oxygen atoms. Models (1) and (2) in Table 10 were examined to compare energies needed for a carbon atom to substitute for an oxygen atom in the IGZO(111) containing a lot of oxygen atoms. The numbers of atoms of Model (1) and (2) were equalized; after that, the total energy of each model was calculated.

TABLE 10

| Model | Existing mode |
| --- | --- |
| (1) | [InGaZnO$_4$] + [CO$_2$] |
| (2) | [InGaZnO$_4$: C$_O$] + 3/2[O$_2$] |

In Model (1), a carbon atom was contained in the IGZO (111) as $CO_2$. In Model (2), an oxygen atom was replaced with a carbon atom in the IGZO(111).

The energy of Model (1) was calculated to be lower than that of Model (2) by approximately 10.8 eV, and thus Model (1) is more stable than Model (2). This suggests that Model (1) is more likely to exist than Model (2). That is, that presumably shows that an oxygen atom is unlikely to be replaced with a carbon atom and the state where an oxygen atom is replaced with a carbon atom is unstable.

In order to find out the stable configuration of a carbon atom, the IGZO(111) containing a lot of oxygen was assumed, and the total energy of models where the numbers of atoms are the same as each other were calculated. Calculation results are shown in Table 11.

As shown in Table 11, it is presumed that, because the energy of a gallium atom is low, a carbon atom in the IGZO(111) is likely to substitute for a gallium atom and is unlikely to substitute for an oxygen atom. Note that in Table 11, "IGZO:$C_{atom}$" means that the atom is replaced with a carbon atom in InGaZnO$_4$.

TABLE 11

| Model | Existing mode | Total energy (relative value) |
|---|---|---|
| (No defect) | [InGaZnO$_4$] + [CO$_2$] | −637.446 eV (0.000 eV) |
| C is put in interstitial site | [InGaZnO$_4$ + C] + [O$_2$] | −628.695 eV (8.751 eV) |
| In is replaced with C | [InGaZnO$_4$: C$_{In}$] + 1/2[In$_2$O$_3$] + 1/4[O$_2$] | −632.759 eV (4.687 eV) |
| Ga is replaced with C | [InGaZnO$_4$: C$_{Ga}$] + 1/2[Ga$_2$O$_3$] + 1/4[O$_2$] | −633.665 eV (3.781 eV) |
| Zn is replaced with C | [InGaZnO$_4$: C$_{Zn}$] + [ZnO] + 1/2[O$_2$] | −632.801 eV (4.645 eV) |
| O is replaced with C | [InGaZnO$_4$: C$_O$] + 3/2[O$_2$] | −626.620 eV (10.826 eV) |

As a result, it is found that when a carbon atom is put in an interstitial site or a carbon atom substitutes for a metal atom (In, Ga, or Zn), the IGZO(111) becomes n-type. Furthermore, it is presumed that the configuration becomes stable when a carbon atom in the IGZO(111) substitutes particularly for a gallium atom.

Note that the structures, methods, and the like described in this embodiment can be used as appropriate in combination with any of the structures, methods, and the like described in the other embodiments and examples.

Embodiment 4

In this embodiment, a semiconductor device and a manufacturing method thereof, which are different from those in Embodiment 1, are described with reference to drawings. A transistor 50 of this embodiment is a top-gate transistor, which is different from the transistors in Embodiment 1.

<1. Structure of Transistor>

Figure 34A:
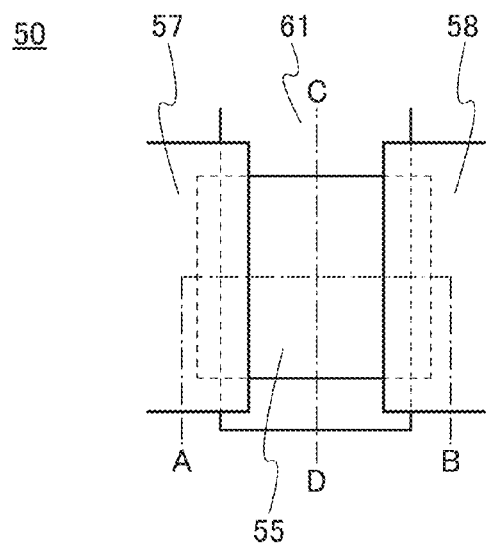
FIGS. 34A to 34C are a top view and cross-sectional views illustrating one embodiment of a transistor.
Figure 34C:
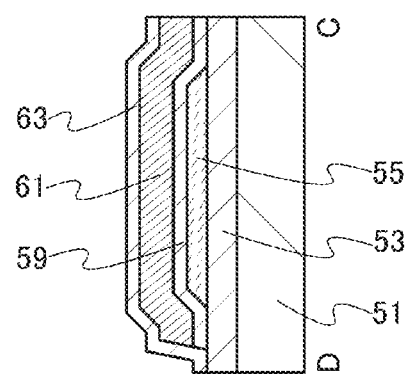
Figure 34B:
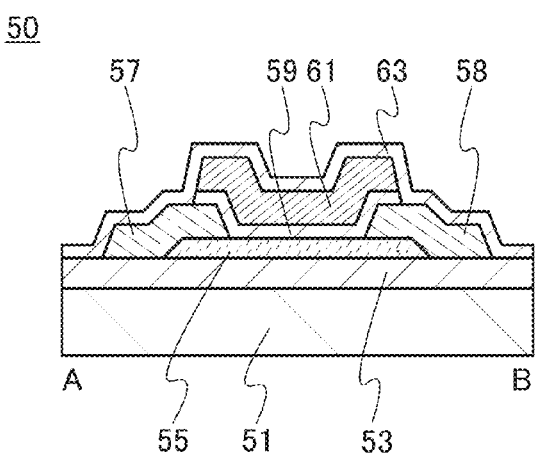

FIGS. 34A to 34C are a top view and cross-sectional views of the transistor 50. FIG. 34A is the top view of the transistor 50. FIG. 34B is a cross-sectional view taken along dashed-dotted line A-B in FIG. 34A. FIG. 34C is a cross-sectional view taken along dashed-dotted line C-D in FIG. 34A. Note that in FIG. 34A, for simplicity, a substrate 51, a protective film 53, a gate insulating film 59, an insulating film 63, and the like are omitted.

The transistor 50 illustrated in FIGS. 34A to 34C includes an oxide semiconductor film 55 over the protective film 53; a pair of electrodes 57 and 58 in contact with the oxide semiconductor film 55; the gate insulating film 59 in contact with the oxide semiconductor film 55 and the pair of electrodes 57 and 58; and a gate electrode 61 overlapping with the oxide semiconductor film 55 with the gate insulating film 59 therebetween. The insulating film 63 may be provided over the protective film 53, the pair of electrodes 57 and 58, the gate insulating film 59, and the gate electrode 61.

In this embodiment, a film in contact with the oxide semiconductor film 55, typically, at least one of the protective film 53 and the gate insulating film 59 is an oxide insulating film that contains nitrogen and has a small number of defects.

Typical examples of the oxide insulating film containing nitrogen and having a small number of defects include a silicon oxynitride film and an aluminum oxynitride film. Further, a "silicon oxynitride film" or an "aluminum oxynitride film" refers to a film that contains more oxygen than nitrogen, and a "silicon nitride oxide film" or an "aluminum nitride oxide film" refers to a film that contains more nitrogen than oxygen.

In an ESR spectrum at 100 K or lower of the oxide insulating film with a small number of defects, a first signal that appears at a g-factor of greater than or equal to 2.037 and smaller than or equal to 2.039, a second signal that appears at a g-factor of greater than or equal to 2.001 and smaller than or equal to 2.003, and a third signal that appears at a g-factor of greater than or equal to 1.964 and smaller than or equal to 1.966 are observed. The sum of the spin densities of the first signal that appears at a g-factor of greater than or equal to 2.037 and smaller than or equal to 2.039, the second signal that appears at a g-factor of greater than or equal to 2.001 and smaller than or equal to 2.003, and the third signal that appears at a g-factor of greater than or equal to 1.964 and smaller than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

In the ESR spectrum at 100 K or lower, the first signal that appears at a g-factor of greater than or equal to 2.037 and smaller than or equal to 2.039, the second signal that appears at a g-factor of greater than or equal to 2.001 and smaller than or equal to 2.003, and the third signal that appears at a g-factor of greater than or equal to 1.964 and smaller than or equal to 1.966 correspond to signals attributed to nitrogen oxide (NO$_x$; x is greater than or equal to 0 and smaller than or equal to 2, preferably greater than or equal to 1 and smaller than or equal to 2). Typical examples of nitrogen oxide include nitrogen monoxide and nitrogen dioxide.

When at least one of the protective film 53 and the gate insulating film 59 in contact with the oxide semiconductor film 55 contains a small amount of nitrogen oxide as described above, the carrier trap at the interface between the oxide semiconductor film 55 and the gate insulating film 15 or the interface between the oxide semiconductor film 55 and the protective film 21 can be inhibited. As a result, a change in the threshold voltage of the transistor included in the semiconductor device can be reduced, which leads to a reduced change in the electrical characteristics of the transistor.

At least one of the protective film 53 and the gate insulating film 59 preferably has a nitrogen concentration measured by SIMS of lower than or equal to $6 \times 10^{20}$ atoms/cm$^3$. In that case, nitrogen oxide is unlikely to be generated in at least one of the protective film 53 and the gate insulating film 59, so that the carrier trap at the interface between the oxide semiconductor film 55 and the gate insulating film 15 or the interface between the oxide semiconductor film 55 and the protective film 21 can be inhibited. Furthermore, a change in the threshold voltage of the transistor included in the semiconductor device can be reduced, which leads to a reduced change in the electrical characteristics of the transistor.

The details of other components of the transistor 50 are described below.

As the substrate 51, a substrate given as an example of the substrate 11 of Embodiment 1 can be used as appropriate.

In the case where the gate insulating film 59 is formed of an oxide insulating film containing nitrogen and having a small number of defects, the protective film 53 can be formed using an oxide insulating film containing oxygen at a higher proportion than oxygen in the stoichiometric composition. The oxide insulating film containing oxygen at a higher proportion than oxygen in the stoichiometric composition can diffuse oxygen into an oxide semiconductor film by heat treatment. As typical examples of the protective film 53, a silicon oxide film, a silicon oxynitride film, a silicon nitride oxide film, a gallium oxide film, a hafnium oxide film, an yttrium oxide film, an aluminum oxide film, an aluminum oxynitride film, and the like can be given.

The thickness of the protective film 53 is greater than or equal to 50 nm, preferably greater than or equal to 200 nm and less than or equal to 3000 nm, further preferably greater than or equal to 300 nm and less than or equal to 1000 nm. With use of the thick base the protective film 53, the number of oxygen molecules released from the protective film 53 can be increased, and the interface state at the interface between the base the protective film 53 and an oxide semiconductor film formed later can be reduced.

Here, "to release part of oxygen by heating" means that the amount of released oxygen by conversion into oxygen atoms is greater than or equal to $1\times10^{18}$ atoms/cm$^3$, preferably greater than or equal to $3\times10^{20}$ atoms/cm$^3$ in TDS analysis. Note that the substrate temperature in the TDS analysis is preferably higher than or equal to 100° C. and lower than or equal to 700° C., or higher than or equal to 100° C. and lower than or equal to 500° C.

The oxide semiconductor film 55 can be formed in a manner similar to that of the oxide semiconductor film 17 in Embodiment 1.

The pair of electrodes 57 and 58 can be formed in a manner similar to that of the pair of electrodes 19 and 20 of Embodiment 1.

Note that although the pair of electrodes 57 and 58 are provided between the oxide semiconductor film 55 and the gate insulating film 59 in this embodiment, the pair of electrodes 57 and 58 may be provided between the protective film 53 and the oxide semiconductor film 55.

In the case where the protective film 53 is formed using an oxide insulating film containing nitrogen and having a small number of defects, the gate insulating film 59 can be formed to have a single-layer structure or a stacked-layer structure using, for example, any of silicon oxide, silicon oxynitride, silicon nitride oxide, silicon nitride, aluminum oxide, hafnium oxide, gallium oxide, Ga—Zn-based metal oxide, and the like. Note that an oxide insulating film is preferably used for at least a region of the gate insulating film 59, which is in contact with the oxide semiconductor film 55, in order to improve characteristics of the interface with the oxide semiconductor film 55.

Further, it is possible to prevent outward diffusion of oxygen from the oxide semiconductor film 55 and entry of hydrogen, water, or the like into the oxide semiconductor film 55 from the outside by providing an insulating film having a blocking effect against oxygen, hydrogen, water, and the like for the gate insulating film 59. As for the insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given as examples.

The gate insulating film 59 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, so that gate leakage current of the transistor can be reduced.

The thickness of the gate insulating film 59 is, for example, greater than or equal to 5 nm and less than or equal to 400 nm, preferably greater than or equal to 10 nm and less than or equal to 300 nm, more preferably greater than or equal to 15 nm and less than or equal to 100 nm.

The gate electrode 61 can be formed in a manner similar to that of the gate electrode 13 of Embodiment 1.

The insulating film 63 is formed with a single-layer structure or a stacked structure using one or more of silicon oxide, silicon oxynitride, silicon nitride oxide, silicon nitride, aluminum oxide, aluminum oxynitride, aluminum nitride oxide, aluminum nitride, and the like to a thickness greater than or equal to 30 nm and less than or equal to 500 nm, preferably greater than or equal to 100 nm and less than or equal to 400 nm.

Like the protective film 53, the insulating film 63 may have a stacked-layer structure including an oxynitride insulating film containing oxygen at a higher proportion than oxygen in the stoichiometric composition and an insulating film having a blocking effect against hydrogen, water, and the like. As the insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and a silicon nitride film can be given as examples. In the case where such insulating films are used, in heat treatment, oxygen is supplied to the oxide semiconductor film 55 through the gate insulating film 59 and/or the protective film 53, which enables a reduction in the interface state between the oxide semiconductor film 55 and the gate insulating film 59 and/or the interface state between the oxide semiconductor film 55 and the protective film 53. Furthermore, the number of oxygen vacancies in the oxide semiconductor film 55 can be reduced.

<2. Method for Manufacturing Transistor>

Next, a method for manufacturing the transistor illustrated in FIGS. 34A to 34C is described with reference to FIGS. 35A to 35D. A cross-sectional view in the channel length direction along dot-dashed line A-B in FIG. 34A and a cross-sectional view in the channel width direction along dot-dashed line C-D in FIG. 34A are used for describing a method for manufacturing the transistor 50.

Figure 35A:
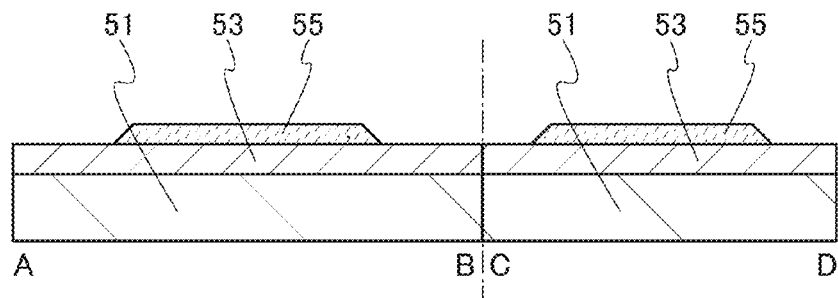
FIGS. 35A to 35D are cross-sectional views illustrating one embodiment of a method for manufacturing a transistor.

The protective film 53 is formed over the substrate 51 as illustrated in FIG. 35A. Then, the oxide semiconductor film 55 is formed over the protective film 53.

The protective film 53 is formed by a sputtering method, a CVD method, or the like.

In the case where an oxide insulating film containing nitrogen and having a small number of defects is formed as the protective film 53, a silicon oxynitride film can be formed by a CVD method as an example of the oxide insulating film containing nitrogen and having a small number of defects. In this case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide.

In the case where an oxide insulating film from which part of oxygen is released by heating is formed as the protective film 53, the oxide insulating film is preferably formed by a sputtering method using the conditions where the amount of oxygen in a deposition gas is large. As the deposition gas, oxygen, a mixed gas of oxygen and a rare gas, or the like can be used. Typically, the concentration of oxygen in the deposition gas is preferably higher than or equal to 6% and lower than or equal to 100%.

Furthermore in the case where an oxide insulating film from which part of oxygen is released by heating is formed as the protective film 53, an oxide insulating film is formed by a CVD method as the oxide insulating film from which part of oxygen is released by heating, and then oxygen is introduced into the oxide insulating film, so that the amount of oxygen released by heating can be increased. Oxygen can be added to the oxide insulating film by ion implantation, ion doping, plasma treatment, or the like. In this embodiment, the oxide semiconductor film is not provided below the protective film 53; accordingly, even when oxygen is introduced into the protective film 53, the oxide semiconductor film is not damaged. Thus, oxygen can be introduced into the protective film 53 in contact with the oxide semiconductor film without damage to the oxide semiconductor film.

In the case where an oxide insulating film is formed by a CVD method as the protective film 53, hydrogen or water derived from a source gas is sometimes mixed in the oxide insulating film. Thus, after the oxide insulating film is formed by a plasma CVD method, heat treatment is preferably performed for dehydrogenation or dehydration.

The oxide semiconductor film 55 can be formed as appropriate by a formation method similar to that of the oxide semiconductor film 17 described in Embodiment 1.

In order to improve the orientation of the crystal parts in the CAAC-OS film, planarity of the surface of the protective film 53 serving as a base insulating film of the oxide semiconductor film is preferably improved. Typically, the protective film 53 can be made to have an average surface roughness (Ra) of 1 nm or less, 0.3 nm or less, or 0.1 nm or less.

As planarization treatment for improving planarity of the surface of the protective film 53, one or more can be selected from chemical mechanical polishing (CMP) treatment, dry etching treatment, plasma treatment (what is called reverse sputtering), and the like. The plasma treatment is the one in which minute unevenness of the surface is reduced by introducing an inert gas such as an argon gas into a vacuum chamber and applying an electric field so that a surface to be processed serves as a cathode.

Figure 35B:
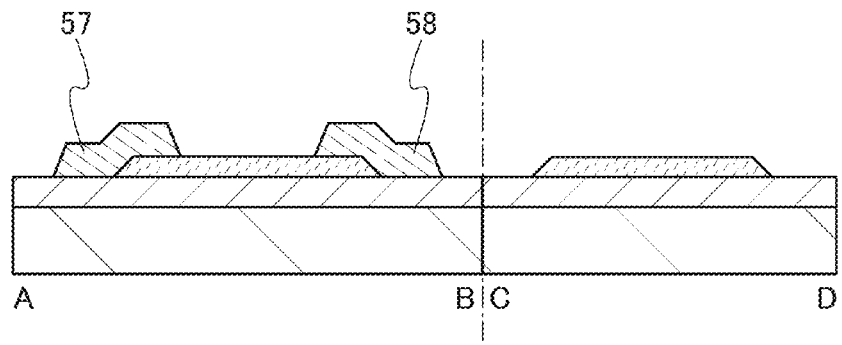

Next, as illustrated in FIG. 35B, the pair of electrodes 57 and 58 are formed. The pair of electrodes 57 and 58 can be formed as appropriate by a formation method similar to those of the pair of electrodes 19 and 20 described in Embodiment 1. Alternatively, the pair of electrodes 57 and 58 can be formed by a printing method or an inkjet method.

Figure 35C:
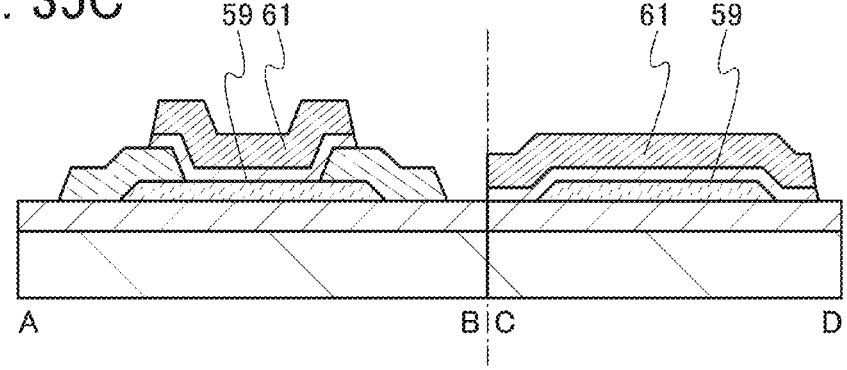

Next, as illustrated in FIG. 35C, the gate insulating film 59 and the gate electrode 61 are formed. An insulating film is formed by a sputtering method, a CVD method, an evaporation method, or the like, and a conductive film is formed over the insulating film by a sputtering method, a CVD method, an evaporation method, or the like. Then, a mask is formed over the conductive film by a photolithography process. After that, parts of insulating film and the conductive film are etched using the mask to form the gate insulating film 59 and the gate electrode 61. After that, the mask is removed.

A film to be the gate insulating film 59 is formed by a sputtering method, a CVD method, an evaporation method, or the like. A film to be the gate electrode 61 is formed by a sputtering method, a CVD method, an evaporation method, or the like.

In the case where an oxide insulating film containing nitrogen and having a small number of defects is formed as the film to be the gate insulating film 59, the film can be formed using conditions similar to those of the protective film 53 as appropriate.

Figure 35D:
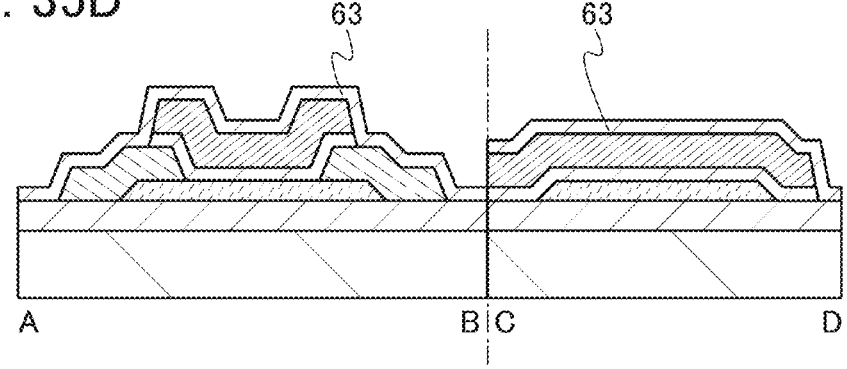

Next, as illustrated in FIG. 35D, the insulating film 63 is formed over the substrate 51, the pair of electrodes 57 and 58, the gate insulating film 59, and the gate electrode 61. The base insulating film 63 can be formed as appropriate by a sputtering method, a CVD method, a printing method, a coating method, or the like.

Next, in a manner similar to that in Embodiment 1, heat treatment may be performed. The heat treatment is performed typically at a temperature higher than or equal to 150° C. and lower than the strain point of the substrate, preferably higher than or equal to 250° C. and lower than or equal to 450° C., more preferably higher than or equal to 300° C. and lower than or equal to 450° C.

Through the above steps, a transistor in which a change in threshold voltage is reduced can be manufactured. Further, a transistor in which a change in electrical characteristics is reduced can be manufactured.

Note that the structures, methods, and the like described in this embodiment can be used as appropriate in combination with any of the structures, methods, and the like described in the other embodiments and examples.

Modification Example 1

Modification examples of the transistor 50 described in Embodiment 4 are described with reference to FIGS. 36A and 36B. In each of the transistors described in this modification example, a gate insulating film or a protective film has a stacked-layer structure.

Figure 36A:
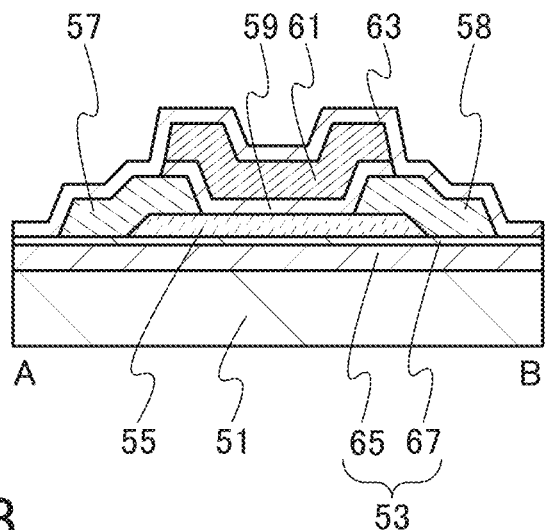
FIGS. 36A and 36B are each a cross-sectional view of one embodiment of a transistor.

In a transistor 50a illustrated in FIG. 36A, the protective film 53 have a multi-layer structure. Specifically, in the protective film 53, an oxide insulating film 65 and an oxide insulating film 67 are stacked. The oxide insulating film 65 contains oxygen at a higher proportion than oxygen in the stoichiometric composition. The oxide insulating film 67 in contact with the oxide semiconductor film 55 contains nitrogen, has a small number of defects, and can be used as at least one of the protective film 53 and the gate insulating film 59 of the transistor 50.

The oxide insulating film 65 containing oxygen at a higher proportion than oxygen in the stoichiometric composition has a thickness of greater than or equal to 50 nm, preferably greater than or equal to 200 nm and less than or equal to 3000 nm, more preferably greater than or equal to 300 nm and less than or equal to 1000 nm. When the oxide insulating film 65 containing oxygen at a higher proportion than oxygen in the stoichiometric composition is formed thick, the number of released oxygen molecules in the oxide insulating film 65 containing oxygen at a higher proportion than oxygen in the stoichiometric composition can be increased, and the interface state at the interface between the oxide insulating film 67 and the oxide semiconductor film 55 can be lowered.

For forming the oxide insulating film 65 containing oxygen at a higher proportion than oxygen in the stoichiometric composition, an oxide insulating film from which part of oxygen is released by heating and which can be used as the protective film 53 can be used as appropriate.

Furthermore, the oxide insulating film 67 can be formed in the formation manner of the oxide insulating film containing nitrogen and having a small number of defects which can be used as the protective film 53 and the gate insulating film 59 in the transistor 50.

The oxide insulating film 65 containing oxygen at a higher proportion than oxygen in the stoichiometric composition and the oxide insulating film 67 are formed, and the oxide semiconductor film 55 is formed over the oxide insulating film 67. After that, heat treatment may be performed. By the heat treatment, part of oxygen contained in the oxide insulating film 65 containing oxygen at a higher proportion than oxygen in the stoichiometric composition can be diffused in the vicinity of the interface between the oxide insulating film 67 and the oxide semiconductor film 55. As a result, the interface state in the vicinity of the interface between the oxide insulating film 67 and the oxide semiconductor film 55 can be lowered, so that a change in threshold voltage can be reduced.

The temperature of the heat treatment is typically higher than or equal to 150° C. and lower than the strain point of the substrate, preferably higher than or equal to 250° C. and lower than or equal to 450° C., more preferably higher than or equal to 300° C. and lower than or equal to 450° C.

The heat treatment is performed under an inert gas atmosphere containing nitrogen or a rare gas such as helium, neon, argon, xenon, or krypton. Further, the heat treatment may be performed under an inert gas atmosphere first, and then under an oxygen atmosphere. It is preferable that the above inert gas atmosphere and the above oxygen atmosphere do not contain hydrogen, water, and the like. The treatment time is 3 minutes to 24 hours.

Figure 36B:
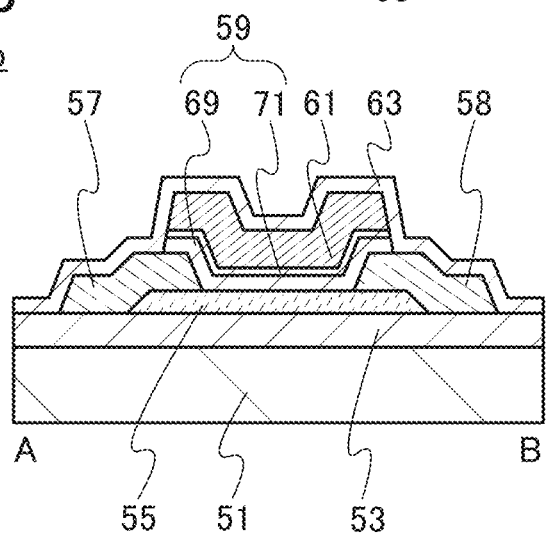

In a transistor 50b illustrated in FIG. 36B, the gate insulating film 59 has a stacked structure of an oxide insulating film 69 and a nitride insulating film 71 in this order, and the oxide insulating film 69 in contact with the oxide semiconductor film 55 is an oxide insulating film containing nitrogen and having a small number of defects.

As the nitride insulating film 71, a film similar to the nitride insulating film 29 described in Modification example 1 in Embodiment 1 is preferably used. Thus, the physical thickness of the gate insulating film 59 can be increased. This makes it possible to reduce a decrease in withstand voltage of the transistor 50b and furthermore increase the withstand voltage, thereby reducing electrostatic discharge damage to a semiconductor device.

Modification Example 2

A modification example of the transistor 50 described in Embodiment 4 is described with reference to FIGS. 37A to 37C. In this modification example, a transistor in which an oxide semiconductor film is provided between a gate insulating film and a pair of electrodes is described.

FIGS. 37A to 37C are a top view and cross-sectional views of a transistor 50c included in a semiconductor device of one embodiment of the present invention. FIG. 37A is a top view, FIG. 37B is a schematic cross-sectional view taken along dot-dashed line A-B in FIG. 37A, and FIG. 37C is a schematic cross-sectional view taken along dot-dashed line C-D in FIG. 37A.

The transistor 50c illustrated in FIGS. 37B and 37C includes an oxide semiconductor film 73 over the protective film 53; the oxide semiconductor film 55 over the oxide semiconductor film 73; the pair of electrodes 57 and 58 in contact with the oxide semiconductor film 55 and the oxide semiconductor film 73; an oxide semiconductor film 75 in contact with the oxide semiconductor film 55 and the pair of electrodes 57 and 58; the gate insulating film 59 over the oxide semiconductor film 75; and the gate electrode 61 overlapping with the oxide semiconductor film 55 with the gate insulating film 59 therebetween. The insulating film 63 may be provided over the protective film 53, the pair of electrodes 57 and 58, the oxide semiconductor film 75, the gate insulating film 59, and the gate electrode 61.

In the transistor 50c, the protective film 53 has a projecting portion, and the stacked oxide semiconductor films 73 and 55 are provided over the projecting portion of the protective film 53.

As illustrated in FIG. 37B, the oxide semiconductor film 75 is in contact with the top surface of the oxide semiconductor film 55 and the top and side surfaces of the pair of electrodes 57 and 58. As illustrated in FIG. 37C, the oxide semiconductor film 75 is in contact with a side surface of the projecting portion of the protective film 53, a side surface of the oxide semiconductor film 73, and the top and side surfaces of the oxide semiconductor film 55.

As illustrated in FIG. 37C, in the channel width direction of the transistor 50c, the gate electrode 61 faces the top and side surfaces of the oxide semiconductor film 55 with the oxide semiconductor film 75 and the gate insulating film 59 therebetween.

The gate electrode 61 electrically surrounds the oxide semiconductor film 55. With this structure, on-state current of the transistor 50c can be increased. Such a transistor structure is referred to as a surrounded channel (s-channel) structure. Note that in the s-channel structure, current flows in the whole (bulk) of the oxide semiconductor film 55. Since current flows in an inner part of the oxide semiconductor film 55, the current is hardly affected by interface scattering, and high on-state current can be obtained. In addition, by making the oxide semiconductor film 55 thick, on-state current can be increased.

In fabricating a transistor with a small channel length and a small channel width, when a pair of electrodes, an oxide semiconductor film, or the like is processed while a resist mask is reduced in size, the pair of electrodes, the oxide semiconductor film, or the like has a round end portion (curved surface) in some cases. With this structure, the coverage with the oxide semiconductor film 75 and the gate insulating film 59, which are to be formed over the oxide semiconductor film 55, can be improved. In addition, electric field concentration which might occur at the edges of the pair of electrodes 57 and 58 can be relaxed, which can suppress deterioration of the transistor.

In addition, by miniaturizing the transistor, higher integration and higher density can be achieved. For example, the channel length of the transistor is set to 100 nm or less, preferably 40 nm or less, more preferably 30 nm or less, still more preferably 20 nm or less, and the channel width of the transistor is set to 100 nm or less, preferably 40 nm or less, more preferably 30 nm or less, still more preferably 20 nm or less. The transistor of one embodiment of the present invention with the s-channel structure can increase on-state current even in the case where the channel width thereof is shortened as described above.

For the oxide semiconductor film 73, the material of the oxide semiconductor film 46 described in Modification example 4 in Embodiment 1 can be used as appropriate. Before a film to be the oxide semiconductor film 55 is formed in FIG. 35A, a film to be the oxide semiconductor film 73 is formed. Then, a film to be the oxide semiconductor film 73 and a film to be the oxide semiconductor film 55 are processed, whereby the oxide semiconductor film 73 and the oxide semiconductor film 55 can be obtained.

For the oxide semiconductor film 75, the material of the oxide semiconductor film 47 described in Modification example 4 in Embodiment 1 can be used as appropriate. Before a film to be the gate insulating film 59 is formed in FIG. 35C, a film to be the oxide semiconductor film 75 is formed. Then, a film to be the gate insulating film 59 and a film to be the gate electrode 61 are formed. After that, the films are processed at the same time, whereby the oxide semiconductor film 75, the gate insulating film 59, and the gate electrode 61 can be obtained.

High integration of a semiconductor device requires miniaturization of a transistor. However, it is known that miniaturization of a transistor causes deterioration in electrical characteristics of the transistor. A decrease in channel width causes a reduction in on-state current.

However, in the transistor of one embodiment of the present invention, as described above, the oxide semiconductor film 75 is formed to cover the channel formation region of the oxide semiconductor film 55, and the channel formation region and the gate insulating film 59 are not in contact with each other. Therefore, scattering of carries formed at the interface between the oxide semiconductor film 55 and the gate insulating film 59 can be suppressed, whereby on-state current of the transistor can be increased.

In the case where an oxide semiconductor film is made intrinsic or substantially intrinsic, decrease in the number of carriers contained in the oxide semiconductor film may reduce the field-effect mobility. However, in the transistor of one embodiment of the present invention, a gate electric field is applied to the oxide semiconductor film 55 not only in the vertical direction but also from the side surfaces. That is, the gate electric field is applied to the whole of the oxide semiconductor film 55, whereby current flows in the bulk of the oxide semiconductor films. It is thus possible to improve the field-effect mobility of the transistor while a change in electrical characteristics is reduced by highly purified intrinsic properties.

In the transistor of one embodiment of the present invention, the oxide semiconductor film 55 is formed over the oxide semiconductor film 73, so that an interface state is less likely to be formed. In addition, impurities do not enter the oxide semiconductor film 55 from above and below because the oxide semiconductor film 55 are provided between the oxide semiconductor films 73 and 75. Thus, the oxide semiconductor film 55 is surrounded by the oxide semiconductor film 73 and the oxide semiconductor film 75 (also electrically surrounded by the gate electrode 61), so that stabilization of the threshold voltage in addition to the above-described improvement of on-state current of the transistor is possible. As a result, current flowing between the source and the drain when the voltage of the gate electrode is 0 V can be reduced, which leads to lower power consumption. Further, the threshold voltage of the transistor becomes stable; thus, long-term reliability of the semiconductor device can be improved.

Note that the structures, methods, and the like described in this embodiment can be used as appropriate in combination with any of the structures, methods, and the like described in the other embodiments and examples.

Embodiment 5

In this embodiment, one embodiment that can be applied to the oxide semiconductor film in any of the transistors included in the semiconductor device described in the above embodiment is described.

The oxide semiconductor film may include one or more of the following: an oxide semiconductor having a single-crystal structure (hereinafter referred to as a single-crystal oxide semiconductor); an oxide semiconductor having a polycrystalline structure (hereinafter referred to as a polycrystalline oxide semiconductor); an oxide semiconductor having a microcrystalline structure (hereinafter referred to as a microcrystalline oxide semiconductor), and an oxide semiconductor having an amorphous structure (hereinafter referred to as an amorphous oxide semiconductor). Further, the oxide semiconductor film may be formed using a CAAC-OS film. Furthermore, the oxide semiconductor film may include an amorphous oxide semiconductor and an oxide semiconductor having a crystal grain. Described below are the CAAC-OS and the microcrystalline oxide semiconductor.

<1. CAAC-OS>

The CAAC-OS film is one of oxide semiconductor films having a plurality of crystal parts. The crystal parts included in the CAAC-OS film each have c-axis alignment. In a plan TEM image, the area of the crystal parts included in the CAAC oxide film is greater than or equal to 2500 nm$^2$, preferably greater than or equal to 5 $\mu$m$^2$, more preferably greater than or equal to 1000 $\mu$m$^2$. Further, in a cross-sectional TEM image, when the proportion of the crystal parts is greater than or equal to 50%, preferably greater than or equal to 80%, more preferably greater than or equal to 95% of the CAAC-OS film, the CAAC-OS film is a thin film having physical properties similar to those of a single crystal.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter a surface over which the CAAC-OS film is formed is referred to as a formation surface) or a top surface of the CAAC-OS film, and is arranged in parallel to the formation surface or the top surface of the CAAC-OS film. In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

Note that in an electron diffraction pattern of the CAAC-OS film, spots (luminescent spots) having alignment are shown.

From the results of the cross-sectional TEM image and the plan TEM image, alignment is found in the crystal parts in the CAAC-OS film.

A CAAC-OS film is subjected to structural analysis with an X-ray diffraction (XRD) apparatus. When the CAAC-OS film is analyzed by an out-of-plane method, a peak appears frequently when the diffraction angle (2θ) is around 31°. This peak is derived from the (00x) plane (x is an integer) of the InGaZn oxide crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an In-plane method in which an X-ray enters a sample in a direction substantially perpendicular to the c-axis, a peak appears frequently when 2θ is around 56°. This peak is derived from the (110) plane of the InGaZn oxide crystal. Here, analysis (ϕ scan) is performed under the conditions where the sample is rotated around a normal vector of a sample surface as an axis (ϕ axis) with 2θ fixed at around 56°. In the case where the sample is a single-crystal oxide semiconductor film of InGaZn oxide, six peaks appear. The six peaks are derived from crystal planes equivalent to the (110) plane. On the other hand, in the case of a CAAC-OS film, a peak is not clearly observed even when ϕ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film is analyzed by an out-of-plane method, a peak of 2θ may also be observed at around 36°, in addition to the peak of 2θ at around 31°. The peak of 2θ at around 36° indicates that a crystal part having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is trapped therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Charges trapped by the carrier traps in the oxide semiconductor film take a long time to be released, and might behave like fixed charges. Thus, the transistor that includes the oxide semiconductor film having high impurity concentration and a high density of defect states has unstable electrical characteristics in some cases.

With the use of the CAAC-OS film in a transistor, variation in electrical characteristics of the transistor due to irradiation with visible light or ultraviolet light is small.

<2. Microcrystalline Oxide Semiconductor>

In an image obtained with the TEM, crystal parts cannot be found clearly in the microcrystalline oxide semiconductor in some cases. In most cases, the size of a crystal part in a microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a crystal grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the diameter of a crystal part, a peak that shows a crystal plane does not appear. Further, a halo pattern is shown in a selected-area electron diffraction pattern of the nc-OS film obtained by using an electron beam having a diameter larger than the diameter of a crystal part (e.g., larger than or equal to 50 nm). Meanwhile, spots are shown in a nanobeam electron diffraction pattern of the nc-OS film obtained by using an electron beam having a probe diameter (e.g., larger than or equal to 1 nm and smaller than or equal to 30 nm) close to, or smaller than or equal to the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Note that the structures, methods, and the like described in this embodiment can be used as appropriate in combination with any of the structures, methods, and the like described in the other embodiments and examples.

Embodiment 6

In this embodiment, a structural example of a display panel of one embodiment of the present invention is described.

<Structural Example>

Figure 38A:
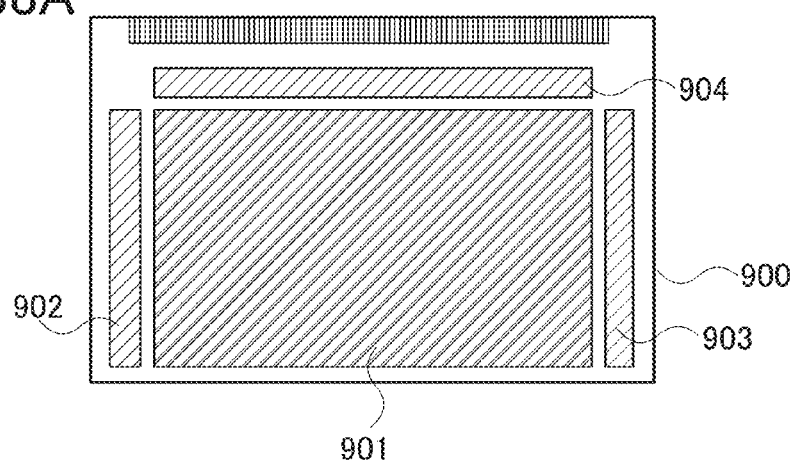
FIGS. 38A to 38C illustrate a structure of a display panel of one embodiment.
Figure 38B:
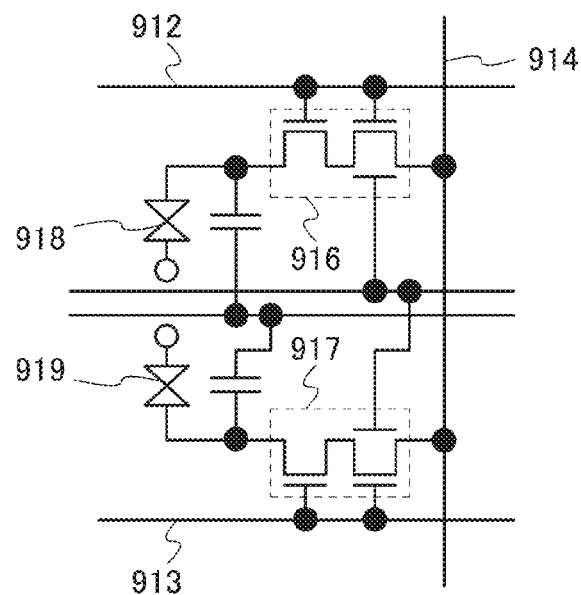
Figure 38C:
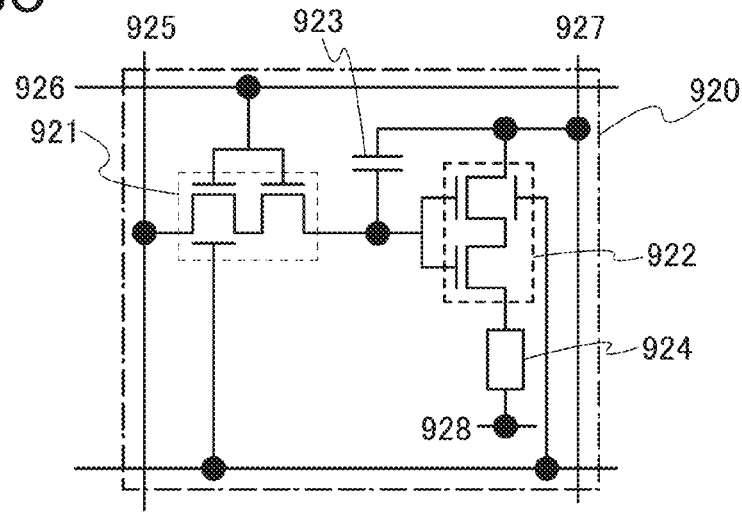

FIG. 38A is a top view of the display panel of one embodiment of the present invention. FIG. 38B is a circuit diagram illustrating a pixel circuit that can be used in the case where a liquid crystal element is used in a pixel in the display panel of one embodiment of the present invention. FIG. 38C is a circuit diagram illustrating a pixel circuit that can be used in the case where an organic EL element is used in a pixel in the display panel of one embodiment of the present invention.

The transistor in the pixel portion can be formed in accordance with the above embodiments. Further, the transistor can easily be an n-channel transistor, and thus, part of a driver circuit that can be formed using an n-channel transistor in the driver circuit is formed over the same substrate as the transistor of the pixel portion. With the use of any of the transistors described in the above embodiments for the pixel portion or the driver circuit in this manner, a highly reliable display device can be provided.

FIG. 38A illustrates an example of a block diagram of an active matrix display device. A pixel portion 901, a first scan line driver circuit 902, a second scan line driver circuit 903, and a signal line driver circuit 904 are provided over a substrate 900 in the display device. In the pixel portion 901, a plurality of signal lines extended from the signal line driver circuit 904 are arranged, and a plurality of scan lines extended from the first scan line driver circuit 902 and the second scan line driver circuit 903 are arranged. Pixels each including a display element are provided in matrix in respective regions in each of which the scan line and the signal line intersect with each other. The substrate 900 of the display device is connected to a timing control circuit (also referred to as controller or control IC) through a connection portion such as a flexible printed circuit (FPC).

In FIG. 38A, the first scan line driver circuit 902, the second scan line driver circuit 903, and the signal line driver circuit 904 are formed over the same substrate 900 as the pixel portion 901. Accordingly, the number of components such as a driver circuit, which are provided outside, is reduced, so that a reduction in cost can be achieved. Further, if the driver circuit is provided outside the substrate 900, wirings would need to be extended and the number of wiring connections would increase. However, by providing the driver circuit over the substrate 900, the number of wiring connections can be reduced and the reliability or yield can be improved.

<Liquid Crystal Panel>

FIG. 38B illustrates an example of a circuit configuration of the pixel. Here, a pixel circuit that can be used in a pixel of a VA liquid crystal display panel is illustrated.

This pixel circuit can be used in a structure in which one pixel includes a plurality of pixel electrodes. The pixel electrodes are connected to different transistors, and the transistors can be driven with different gate signals. Accordingly, signals applied to individual pixel electrodes in a multi-domain pixel can be controlled independently.

A gate wiring 912 of a transistor 916 and a gate wiring 913 of a transistor 917 are separated so that different gate signals can be given thereto. In contrast, a source or drain electrode 914 serving as a data line is used in common for the transistors 916 and 917. Any of the transistors described in the above embodiments can be used as appropriate as each of the transistors 916 and 917. In this way, a highly reliable liquid crystal display panel can be provided.

The shapes of a first pixel electrode electrically connected to the transistor 916 and a second pixel electrode electrically connected to the transistor 917 are described. The first pixel electrode and the second pixel electrode are separated by a slit. The first pixel electrode has a V shape and the second pixel electrode is provided so as to surround the first pixel electrode.

A gate electrode of the transistor 916 is connected to the gate wiring 912, and a gate electrode of the transistor 917 is connected to the gate wiring 913. When different gate signals are supplied to the gate wiring 912 and the gate wiring 913, operation timings of the transistor 916 and the transistor 917 can be varied. As a result, alignment of liquid crystals can be controlled.

Further, a storage capacitor may be formed using a capacitor wiring 910, a gate insulating film serving as a dielectric, and a capacitor electrode electrically connected to the first pixel electrode or the second pixel electrode.

The multi-domain pixel includes a first liquid crystal element 918 and a second liquid crystal element 919. The first liquid crystal element 918 includes the first pixel electrode, a counter electrode, and a liquid crystal layer therebetween. The second liquid crystal element 919 includes the second pixel electrode, a counter electrode, and a liquid crystal layer therebetween.

Note that a pixel circuit of the present invention is not limited to that shown in FIG. 38B. For example, a switch, a resistor, a capacitor, a transistor, a sensor, a logic circuit, or the like may be added to the pixel illustrated in FIG. 38B.

<Organic EL Panel>

FIG. 38C illustrates another example of a circuit configuration of the pixel. Here, a pixel structure of a display panel using an organic EL element is illustrated.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Based on such a mechanism, such a light-emitting element is referred to as a current-excitation type light-emitting element.

FIG. 38C illustrates an example of a pixel circuit that can be used. Here, an example in which an n-channel transistor is used in the pixel is shown. Further, digital time grayscale driving can be employed for the pixel circuit.

The configuration of the pixel circuit that can be used and operation of a pixel employing digital time grayscale driving are described.

A pixel 920 includes a switching transistor 921, a driving transistor 922, a light-emitting element 924, and a capacitor 923. A gate electrode of the switching transistor 921 is connected to a scan line 926. A first electrode (one of a source electrode and a drain electrode) of the switching transistor 921 is connected to a signal line 925. A second electrode (the other of the source electrode and the drain electrode) of the switching transistor 921 is connected to a gate electrode of the driving transistor 922. The gate electrode of the driving transistor 922 is connected to a power supply line 927 through the capacitor 923, a first electrode of the driving transistor 922 is connected to the power supply line 927, and a second electrode of the driving transistor 922 is connected to a first electrode (pixel electrode) of the light-emitting element 924. A second electrode of the light-emitting element 924 corresponds to a common electrode 928. The common electrode 928 is electrically connected to a common potential line formed over the same substrate as the common electrode 928.

As the switching transistor 921 and the driving transistor 922, any of the transistors described in the above embodiments can be used as appropriate. In this way, a highly reliable organic EL display panel can be provided.

The potential of the second electrode (the common electrode 928) of the light-emitting element 924 is set to be a low power supply potential. Note that the low power supply potential is lower than a high power supply potential supplied to the power supply line 927. For example, the low power supply potential can be GND, 0 V, or the like. The high power supply potential and the low power supply potential are set to be higher than or equal to the forward threshold voltage of the light-emitting element 924, and the difference between the potentials is applied to the light-emitting element 924, whereby current is supplied to the light-emitting element 924, leading to light emission. The forward voltage of the light-emitting element 924 refers to a voltage at which a desired luminance is obtained, and at least includes a forward threshold voltage.

Note that gate capacitance of the driving transistor 922 may be used as a substitute for the capacitor 923, so that the capacitor 923 can be omitted. The gate capacitance of the driving transistor 922 may be formed between the semiconductor film and the gate electrode.

Next, a signal input to the driving transistor 922 is described. For a voltage-input voltage driving method, a video signal for turning on or off the driving transistor 922 without fail is input to the driving transistor 922. In order for the driving transistor 922 to operate in a subthreshold region, voltage higher than the voltage of the power supply line 927 is applied to the gate electrode of the driving transistor 922. Voltage higher than or equal to voltage that is the sum of power supply line voltage and the threshold voltage $V_{th}$ of the driving transistor 922 is applied to the signal line 925.

In the case where analog grayscale driving is performed, voltage higher than or equal to voltage that is the sum of the forward voltage of the light-emitting element 924 and the threshold voltage $V_{th}$ of the driving transistor 922 is applied to the gate electrode of the driving transistor 922. A video signal by which the driving transistor 922 is operated in a saturation region is input, so that current is supplied to the light-emitting element 924. In order for the driving transistor 922 to operate in a saturation region, the potential of the power supply line 927 is set higher than the gate potential of the driving transistor 922. When an analog video signal is used, current corresponding to the video signal can be supplied to the light-emitting element 924 and analog grayscale driving can be performed.

Note that the configuration of the pixel circuit is not limited to that shown in FIG. 38C. For example, a switch, a resistor, a capacitor, a sensor, a transistor, a logic circuit, or the like may be added to the pixel circuit illustrated in FIG. 38C.

In the case where the transistor described in the above embodiments is used for the circuit shown in FIGS. 38A to 38C, the source electrode (the first electrode) is electrically connected to the low potential side and the drain electrode (the second electrode) is electrically connected to the high potential side. Further, the potential of the first gate electrode (and the third gate electrode) may be controlled by a control circuit or the like, and a potential lower than the potential applied to the source electrode may be input to the second gate electrode through a wiring that is not illustrated.

This embodiment can be combined with any of the other embodiments disclosed in this specification as appropriate.

Embodiment 7

In this embodiment, a display module and electronic devices that can be formed using a semiconductor device of one embodiment of the present invention are described.

Figure 39:
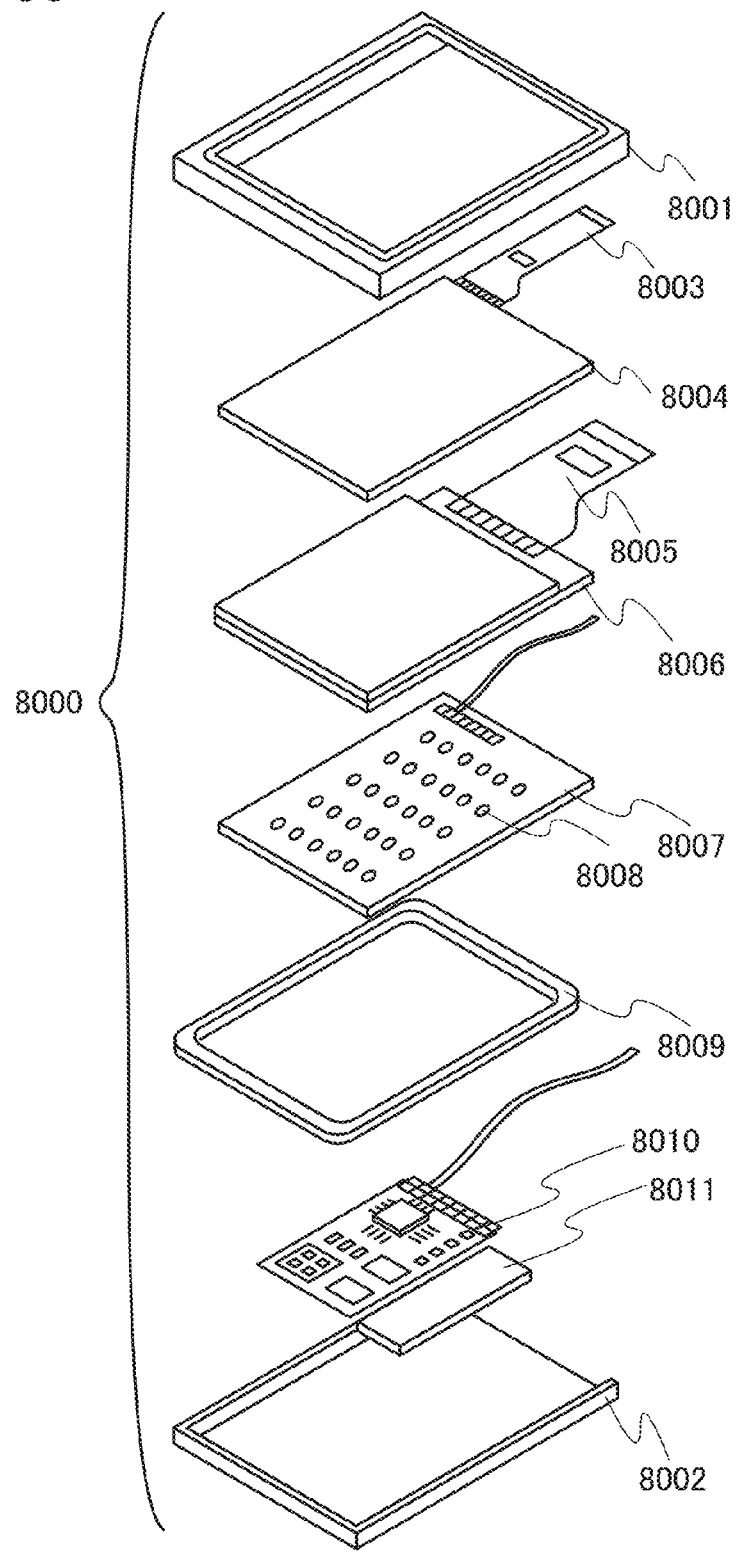
FIG. 39 illustrates a display module.

In a display module 8000 illustrated in FIG. 39, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. A counter substrate (sealing substrate) of the display panel 8006 can have a touch panel function. A photosensor may be provided in each pixel of the display panel 8006 to form an optical touch panel. An electrode for a touch sensor may be provided in each pixel of the display panel 8006 so that a capacitive touch panel is obtained.

The backlight unit 8007 includes a light source 8008. The light source 8008 may be provided at an end portion of the backlight unit 8007 and a light diffusing plate may be used.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 40A to 40D are external views of electronic devices each including the semiconductor device of one embodiment of the present invention.

Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like.

Figure 40A:
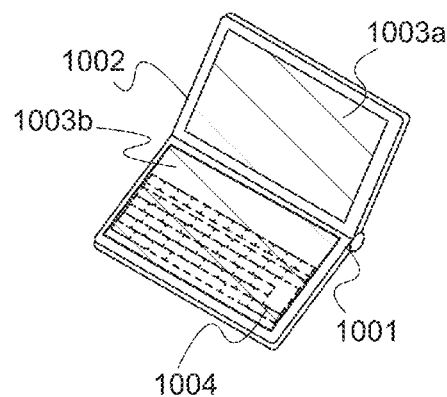
FIGS. 40A to 40D are each an external view of an electronic device according to one embodiment.

FIG. 40A illustrates a portable information terminal including a main body 1001, a housing 1002, display portions 1003a and 1003b, and the like. The display portion 1003b is a touch panel. By touching a keyboard button 1004 displayed on the display portion 1003b, a screen can be operated, and text can be input. It is needless to say that the display portion 1003a may be a touch panel. A liquid crystal panel or an organic light-emitting panel is manufactured by using any of the transistors described in the above embodiments as a switching element and used in the display portion 1003a or 1003b, whereby a highly reliable portable information terminal can be provided.

The portable information terminal illustrated in FIG. 40A has a function of displaying various kinds of data (e.g., a still image, a moving image, and a text image) on the display portion, a function of displaying a calendar, a date, the time, or the like on the display portion, a function of operating or editing the data displayed on the display portion, a function of controlling processing by various kinds of software (programs), and the like. Furthermore, an external connection terminal (an earphone terminal, a USB terminal, or the like), a recording medium insertion portion, and the like may be provided on the back surface or the side surface of the housing.

The portable information terminal illustrated in FIG. 40A may transmit and receive data wirelessly. Through wireless communication, desired book data or the like can be purchased and downloaded from an e-book server.

Figure 40B:
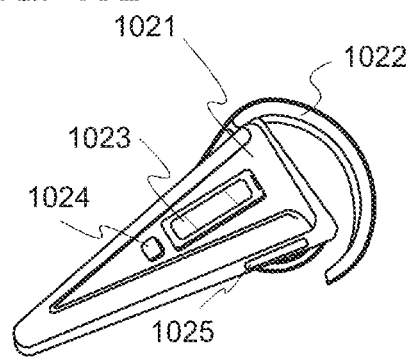

FIG. 40B illustrates a portable music player including, in a main body 1021, a display portion 1023, a fixing portion 1022 with which the portable music player can be worn on the ear, a speaker, an operation button 1024, an external memory slot 1025, and the like. A liquid crystal panel or an organic light-emitting panel is fabricated using any of the transistors described in the above embodiments as a switching element, and used in the display portion 1023, whereby a highly reliable portable music player can be provided.

Furthermore, when the portable music player illustrated in FIG. 40B has an antenna, a microphone function, or a wireless communication function and is used with a mobile phone, a user can talk on the phone wirelessly in a hands-free way while driving a car or the like.

Figure 40C:
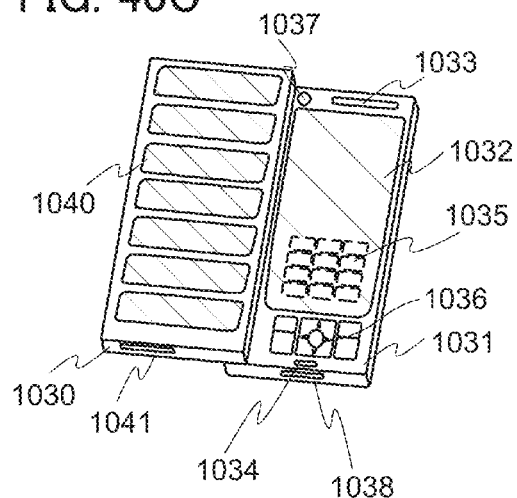

FIG. 40C illustrates a mobile phone that includes two housings, a housing 1030 and a housing 1031. The housing 1031 includes a display panel 1032, a speaker 1033, a microphone 1034, a pointing device 1036, a camera lens 1037, an external connection terminal 1038, and the like. The housing 1030 is provided with a solar cell 1040 for charging the mobile phone, an external memory slot 1041, and the like. In addition, an antenna is incorporated in the housing 1031. Any of the transistors described in the above embodiments is used in the display panel 1032, whereby a highly reliable mobile phone can be provided.

Further, the display panel 1032 includes a touch panel. A plurality of operation keys 1035 that are displayed as images are indicated by dotted lines in FIG. 40C. Note that a boosting circuit by which a voltage output from the solar cell 1040 is increased to be sufficiently high for each circuit is also included.

In the display panel 1032, the direction of display is changed as appropriate depending on the application mode. Further, the mobile phone is provided with the camera lens 1037 on the same surface as the display panel 1032, and thus it can be used as a video phone. The speaker 1033 and the microphone 1034 can be used for videophone calls, recording, and playing sound, etc. as well as voice calls. Moreover, the housings 1030 and 1031 in a state where they are opened as illustrated in FIG. 40C can shift, by sliding, to a state where one is lapped over the other. Therefore, the size of the mobile phone can be reduced, which makes the mobile phone suitable for being carried around.

The external connection terminal 1038 can be connected to an AC adaptor and a variety of cables such as a USB cable, whereby charging and data communication with a personal computer or the like are possible. Further, by inserting a recording medium into the external memory slot 1041, a larger amount of data can be stored and moved.

Further, in addition to the above functions, an infrared communication function, a television reception function, or the like may be provided.

Figure 40D:
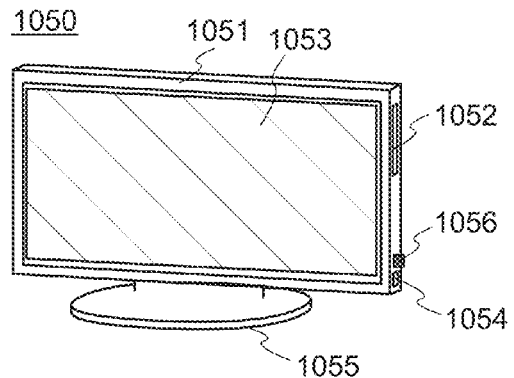

FIG. 40D illustrates an example of a television set. In a television set 1050, a display portion 1053 is incorporated in a housing 1051. Images can be displayed on the display portion 1053. Moreover, a CPU is incorporated in a stand 1055 for supporting the housing 1051. Any of the transistors described in the above embodiments is used in the display portion 1053 and the CPU, whereby the television set 1050 can have high reliability.

The television set 1050 can be operated with an operation switch of the housing 1051 or a separate remote controller. Further, the remote controller may be provided with a display portion for displaying data output from the remote controller.

Note that the television set 1050 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

Further, the television set 1050 is provided with an external connection terminal 1054, a storage medium recording and reproducing portion 1052, and an external memory slot. The external connection terminal 1054 can be connected to various types of cables such as a USB cable, and data communication with a personal computer or the like is possible. A disk storage medium is inserted into the storage medium recording and reproducing portion 1052, and reading data stored in the storage medium and writing data to the storage medium can be performed. In addition, an image, a video, or the like stored as data in an external memory 1056 inserted into the external memory slot can be displayed on the display portion 1053.

Further, in the case where the off-state leakage current of the transistor described in the above embodiments is extremely small, when the transistor is used in the external memory 1056 or the CPU, the television set 1050 can have high reliability and sufficiently reduced power consumption.

This embodiment can be combined with any of the other embodiments disclosed in this specification as appropriate.

Example 1

In this example, results of evaluating an oxide insulating film that can be used for the transistor of one embodiment of the present invention are described. More specifically, results of evaluating, by TDS, the amounts of nitrogen monoxide, dinitrogen monoxide, nitrogen dioxide, and nitrogen released by heating are described.
<Fabrication Method of Samples>
In this example, Sample A1 that is one embodiment of the present invention and Samples A2 and A3 for comparison were fabricated.
<Sample A1>
Sample A1 was fabricated by forming an oxide insulating film over a silicon wafer by a plasma CVD method under formation conditions that can be used for at least one of the gate insulating film 15 and the protective film 21 described in Embodiment 1 (see FIG. 1).

Here, as the oxide insulating film, a 400-nm-thick silicon oxynitride film was formed by a plasma CVD method under the conditions where the silicon wafer was held at a temperature of 220° C., silane at a flow rate of 50 sccm and dinitrogen monoxide at a flow rate of 2000 sccm were used as a source gas, the pressure in the treatment chamber was 20 Pa, and a high-frequency power of 100 W at 13.56 MHz ($1.6 \times 10^{-2}$ W/cm$^2$ as the power density) was supplied to parallel-plate electrodes. Note that the flow ratio of dinitrogen monoxide to silane was 40.
<Sample A2>
For Sample A2, instead of the oxide insulating film of Sample A1, an oxide insulating film was formed under the following conditions.

In Sample A2, as the oxide insulating film, a 400-nm-thick silicon oxynitride film was formed by a plasma CVD method under the conditions where the silicon wafer was held at a temperature of 220° C., silane at a flow rate of 30 sccm and dinitrogen monoxide at a flow rate of 4000 sccm were used as a source gas, the pressure in the treatment chamber was 40 Pa, and a high-frequency power of 150 W at 13.56 MHz ($8.0 \times 10^{-2}$ W/cm$^2$ as the power density) was supplied to parallel-plate electrodes. Note that the flow ratio of dinitrogen monoxide to silane was 133.
<Sample A3>
For Sample A3, instead of the oxide insulating film of Sample A1, an oxide insulating film was formed under the following conditions.

In Sample A3, as the oxide insulating film, a 100-nm-thick silicon oxide film was formed by a sputtering method under the conditions where the silicon wafer was held at a temperature of 100° C., a silicon target was used, oxygen at a flow rate of 50 sccm was used as a sputtering gas, the pressure in the treatment chamber was 0.5 Pa, and a high-frequency power of 6 kW was supplied to parallel-plate electrodes.
<TDS Analysis>
TDS analyses were performed on Samples A1 to A3. In each sample, a stage on which the sample is mounted is heated at higher than or equal to 55° C. and lower than or equal to 997° C. The amounts of nitrogen monoxide (M/z=30), dinitrogen monoxide (M/z=44), nitrogen dioxide (M/z=46), and nitrogen (M/z=28) released from Samples A1 to A3 are shown in FIGS. 41A, 41B, 41C and 42, respectively.

In FIGS. 41A to 41C and FIG. 42, the horizontal axis indicates the temperature of the samples; here, the temperature range is from 50° C. to 650° C. inclusive. The upper limit temperature of an analysis apparatus used in this example is approximately 650° C. The vertical axis indicates intensity proportional to the amount of each of the released gases. The total number of the molecules released to the outside corresponds to the integral value of the peak. Thus, with the degree of the peak intensity, the total number of the molecules contained in the oxide insulating film can be evaluated.

In FIGS. 41A to 41C and FIG. 42, the bold solid line, the thin solid line, and the dashed line indicate the measurement results of Samples A1, A2, and A3, respectively.

Figure 41A:
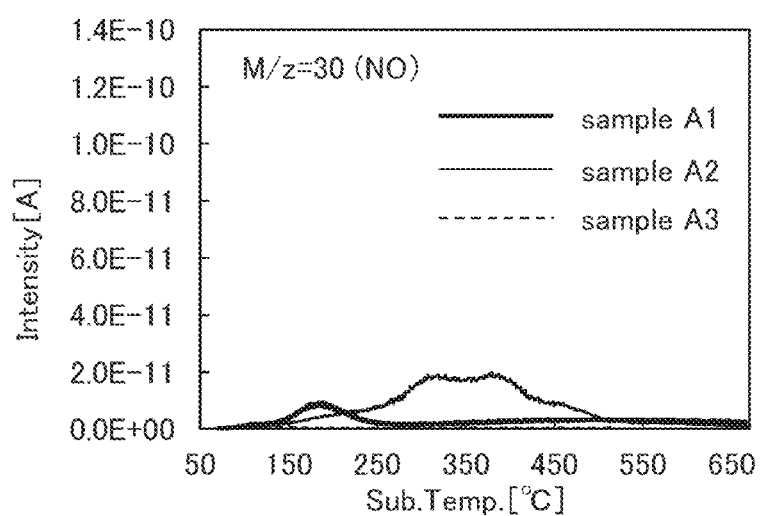
FIGS. 41A to 41C are graphs of results of TDS analysis.
Figure 41B:
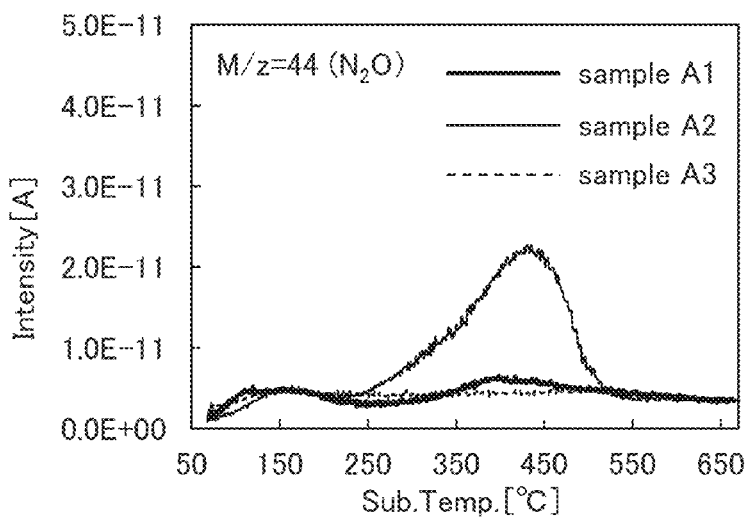
Figure 41C:
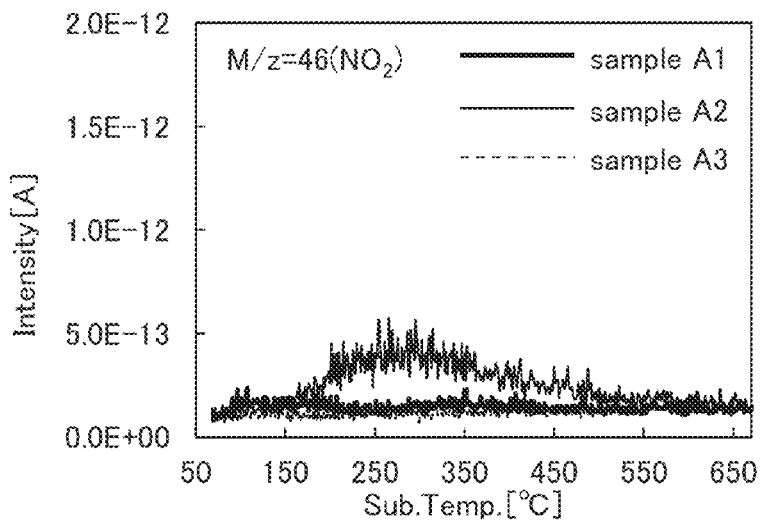
Figure 42:
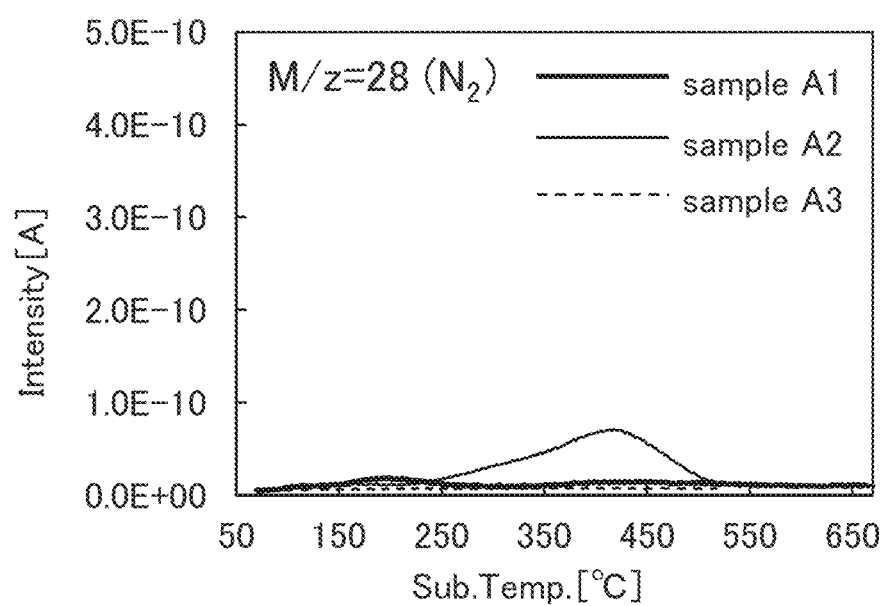
FIG. 42 shows results of TDS analysis.

As shown in FIG. 41A to 41C and FIG. 42, peaks of M/z=30, M/z=44, M/z=46, and M/z=28 were observed in Sample A2 but were not observed in Samples A1 and A3. Note that the peak of Sample A1 observed at a temperature range of 150° C. to 200° C. in FIG. 41A is probably attributed to release of a gas other than nitrogen monoxide. The peak of Sample A1 in FIG. 41B is probably attributed to release of a gas other than dinitrogen monoxide.

Figure 43:
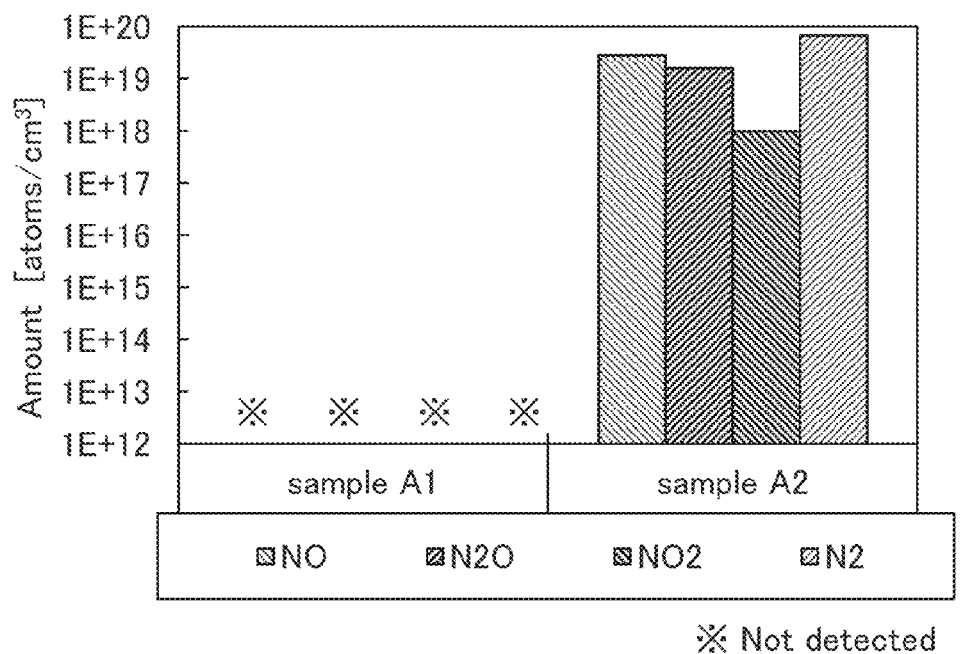
FIG. 43 shows results of TDS analysis.

Next, FIG. 43 shows the amounts of nitrogen monoxide (M/z=30), dinitrogen monoxide (M/z=44), nitrogen dioxide (M/z=46), and nitrogen (M/z=28) released from Samples A1 and A2 calculated from integrated values of the peaks of the curves in FIGS. 41A to 41C and FIG. 42.

As shown in FIG. 43, the amounts of nitrogen monoxide, dinitrogen monoxide, nitrogen dioxide, and nitrogen released from Sample A1 are smaller than those from Sample A2 and are each lower than or equal to the lower limit of detection; that is, the release of each gas is not detected.

The above results show that, when the flow ratio of dinitrogen monoxide to silane in a source gas is small, the released amounts of nitrogen monoxide, dinitrogen monoxide, nitrogen dioxide, and nitrogen are reduced.

Example 2

The amounts of hydrogen, carbon, nitrogen, and fluorine contained in the oxide insulating films of Samples A1 and A2 fabricated in Example 1 were measured by SIMS, and the results are described in this example.

In this example, silicon wafers were used as substrates of Samples A1 and A2.
<SIMS Analysis>
SIMS analysis was performed on Samples A1 to A3. The concentration of each of hydrogen, carbon, nitrogen, and fluorine in each sample was measured, from the surface of the oxide insulating film (SiON) toward the silicon wafer (Si). FIGS. 44A and 44B show the measurement results of Samples A1 and A2, respectively.

In FIGS. 44A and 44B, the horizontal axis indicates a distance from the surface of the oxide insulating film in the film thickness direction, and the vertical axis indicates the concentration of each element. Furthermore, in FIGS. 44A and 44B, the dashed, thin solid, bold solid, and dot-dashed lines indicate the concentrations of hydrogen, carbon, nitrogen, and fluorine, respectively. Note that Si and SiON indicate areas of the silicon wafer and the oxide insulating film, respectively.

In the oxide insulating film of Sample A1, the hydrogen concentration is higher than or equal to $2 \times 10^{21}$ atoms/cm$^3$ and lower than or equal to $5\times10^{21}$ atoms/cm$^3$; the nitrogen concentration is higher than or equal to $6\times10^{20}$ atoms/cm$^3$ and lower than or equal to $3\times10^{21}$ atoms/cm$^3$; the carbon concentration gradually decreases from the surface toward the silicon wafer, and is higher than or equal to $4\times10^{17}$ atoms/cm$^3$ and lower than or equal to $5\times10^{20}$ atoms/cm$^3$; and the fluorine concentration is higher than or equal to $6\times10^{18}$ atoms/cm$^3$ and lower than or equal to $9\times10^{18}$ atoms/cm$^3$.

In the oxide insulating film of Sample A2, the hydrogen concentration is higher than or equal to $1\times10^{21}$ atoms/cm$^3$ and lower than or equal to $3\times10^{21}$ atoms/cm$^3$; the nitrogen concentration is higher than or equal to $1\times10^{20}$ atoms/cm$^3$ and lower than or equal to $4\times10^{20}$ atoms/cm$^3$; the carbon concentration gradually decreases from the surface toward the silicon wafer, and is higher than lower than or equal to the lower limit of detection and lower than or equal to $6\times10^{19}$ atoms/cm$^3$; and the fluorine concentration is higher than or equal to $7\times10^{18}$ atoms/cm$^3$ and lower than or equal to $2\times10^{18}$ atoms/cm$^3$.

As shown in FIGS. 44A and 44B, the nitrogen concentration is higher in Sample A1 than in Sample A2. This is probably because the oxide insulating film of Sample A1 contains a lot of NH and NH$_3$ that do not become carrier traps.

In the case where the nitrogen concentration of the oxide insulating film is lower than or equal to $6\times10^{20}$ atoms/cm$^3$, the spin density is lower than or equal to $1\times10^{18}$ spins/cm$^3$, and the oxide insulating film has a reduced number of defects caused by NO$_N$.

Example 3

In this example, the number of defects in the oxide insulating film is described using the measurement results of ESR.

<Fabrication Methods 1 of Samples>

Fabrication methods of Samples B1 to B3 of this example are described below.

<Sample B1>

A 35-nm-thick oxide semiconductor film was formed over a quartz substrate by a sputtering method. The oxide semiconductor film was formed in such a manner that a sputtering target of In:Ga:Zn=1:1:1 (atomic ratio) was used, a sputtering gas in which the flow ratio of argon and oxygen was 1:1 was supplied into a treatment chamber of a sputtering apparatus, the pressure in the treatment chamber was adjusted to 0.6 Pa, and a direct-current power of 2.5 kW was supplied. Note that the oxide semiconductor film was formed at a substrate temperature of 170° C.

Next, heat treatment was performed at 450° C. in a nitrogen atmosphere for one hour, and after that, another heat treatment was performed at 450° C. in a mixed gas of nitrogen and oxygen for one hour.

Next, a first oxide insulating film and a second oxide insulating film were formed over the oxide semiconductor film.

The first oxide insulating film was formed to a thickness of 50 nm by a plasma CVD method under the following conditions: silane with a flow rate of 50 sccm and dinitrogen monoxide with a flow rate of 2000 sccm were used as a source gas; the pressure in the treatment chamber was 20 Pa; the substrate temperature was 220° C.; and a high-frequency power of 100 W was supplied to parallel-plate electrodes.

The second oxide insulating film was formed to a thickness of 400 nm by a plasma CVD method under the following conditions: silane at a flow rate of 160 sccm and dinitrogen monoxide at a flow rate of 4000 sccm were used as a source gas, the pressure in the treatment chamber was 200 Pa, the substrate temperature was 220° C., and a high-frequency power of 1500 W was supplied to parallel-plate electrodes. Under the above conditions, it is possible to form a silicon oxynitride film containing oxygen at a higher proportion than oxygen in the stoichiometric composition and from which part of oxygen is released by heating.

Next, by heat treatment, water, nitrogen, hydrogen, and the like were released from the first oxide insulating film and the second oxide insulating film and part of oxygen contained in the second oxide insulating film was supplied to the oxide semiconductor film. Here, the heat treatment was performed at 350° C. in a mixed atmosphere of nitrogen and oxygen for one hour.

Through the above process, Sample B1 of this example was fabricated.

<Sample B2>

Sample B2, which was used for comparison, was fabricated under the same conditions as those of Sample B1 except for the formation pressure of the first oxide insulating film.

In Sample B2, the first oxide insulating film was formed by a plasma CVD method under the following conditions: silane with a flow rate of 50 sccm and dinitrogen monoxide with a flow rate of 2000 sccm were used as a source gas; the pressure in the treatment chamber was 100 Pa; the substrate temperature was 220° C.; and a high-frequency power of 100 W was supplied to parallel-plate electrodes.

<Sample B3>

Sample B3, which was used for comparison, was fabricated under the same conditions as those of Sample B1 except for the formation pressure of the first oxide insulating film.

In Sample B3, the first oxide insulating film was formed by a plasma CVD method under the following conditions: silane at a flow rate of 50 sccm and dinitrogen monoxide at a flow rate of 2000 sccm were used as a source gas; the pressure in the treatment chamber was 200 Pa; the substrate temperature was 220° C.; and a high-frequency power of 100 W was supplied to parallel-plate electrodes.

<ESR Measurement>

Next, Samples B1 to B3 were measured by ESR measurement. Here, the ESR measurement was performed under the following conditions. The measurement temperature was −170° C., the high-frequency power (power of microwaves) of 8.92 GHz was 1 mW, and the direction of a magnetic field was parallel to a surface of each sample. The lower limit of detection of the spin density of a signal attributed to NO is $4.7\times10^{15}$ spins/cm$^3$. This means that when the number of spins is small, the number of defects is small in the film.

Figure 45A:
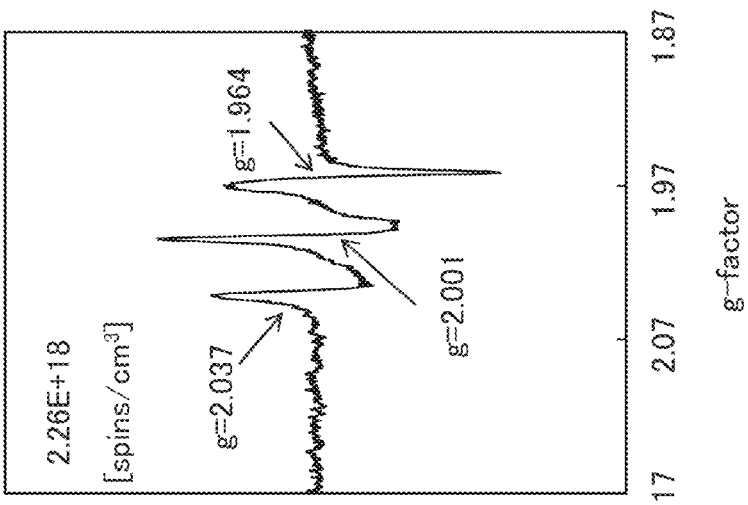
FIGS. 45A to 45C show ESR measurement results.
Figure 45B:
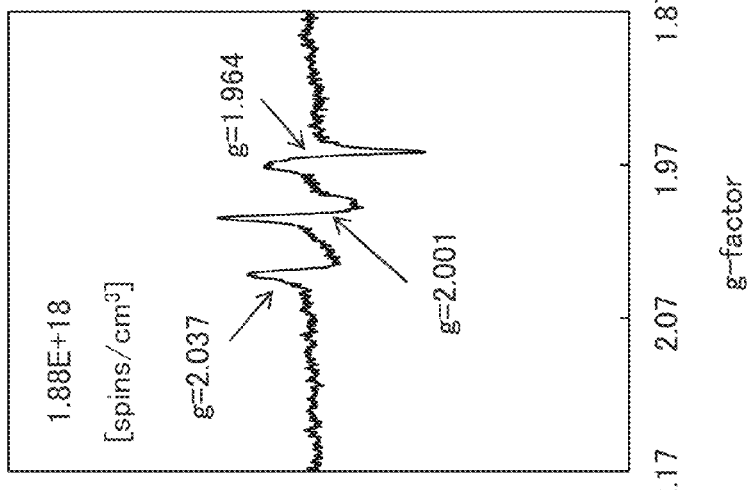
Figure 45C:
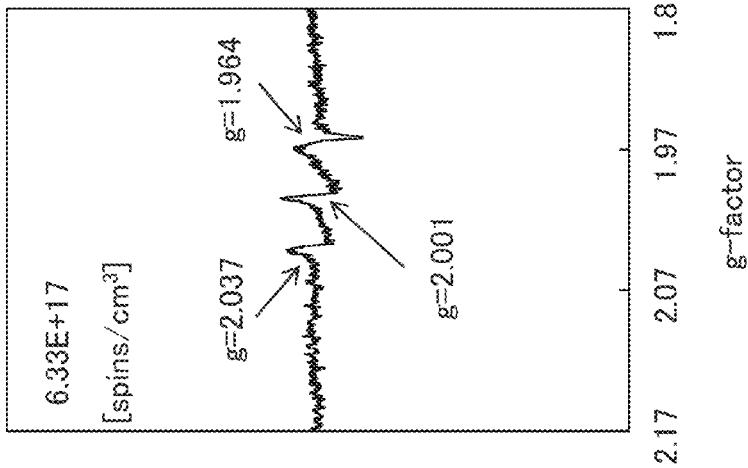

The spin densities of the signals attributed to NO of Samples B1 to B3 are shown in FIGS. 45A to 45C, respectively. Note that shown here is the spin densities obtained by converting the number of measured spins into that per unit volume.

As shown in FIGS. 45A to 45C, in Samples B1 to B3, a first signal that appears at a g-factor of greater than or equal to 2.037 and smaller than or equal to 2.039, a second signal that appears at a g-factor of greater than or equal to 2.001 and smaller than or equal to 2.003, and a third signal that appears at a g-factor of greater than or equal to 1.964 and smaller than or equal to 1.966 are observed. These three signals are due to NO and represent splits of a hyperfine structure arising from the interaction between an electron spin and the nuclear spin of a nitrogen atom. The signals attributed to NO have anisotropic spin species and thus the waveform is asymmetrical.

The spin density of the signals attributed to NO is higher in Samples B2 and B3 than in Sample B1, and thus the oxide insulating films of Samples B2 and B3 have a large number of defects. In FIGS. 45A to 45C, the spin density of the signals attributed to NO in Sample B1 is the smallest. Thus, it is shown that when the first oxide insulating film to be in contact with the oxide semiconductor film is formed in high vacuum, the oxide insulating film having a reduced number of defects is formed.

<Fabrication Methods 2 of Samples>

Next, Samples B4 and B5 were fabricated: the formation pressure of the first oxide insulating film was fixed at the pressure of Sample B1, which obtained excellent results in the ESR measurement, and the flow ratio of the deposition gas was changed. The number of defects of Samples B4 and B5 were measured. The fabrication methods of Samples B4 and B5 are shown below.

<Sample B4>

Sample B4, which was used for comparison, was fabricated under the same conditions as those of Sample B1 except for the flow ratio of the deposition gas for the first oxide insulating film.

In Sample B4, the first oxide insulating film was formed by a plasma CVD method under the following conditions: silane at a flow rate of 20 sccm and dinitrogen monoxide at a flow rate of 2000 sccm were used as a source gas; the pressure in the treatment chamber was 100 Pa; the substrate temperature was 220° C.; and a high-frequency power of 100 W was supplied to parallel-plate electrodes. In other words, when the flow ratio of silane was 1, the flow ratio of dinitrogen monoxide was 100.

<Sample B5>

Sample B5, which was used for comparison, was fabricated under the same conditions as those of Sample B1 except for the flow ratio of the deposition gas for the first oxide insulating film.

In Sample B5, the first oxide insulating film was formed by a plasma CVD method under the following conditions: silane at a flow rate of 100 sccm and dinitrogen monoxide at a flow rate of 2000 sccm were used as a source gas; the pressure in the treatment chamber was 200 Pa; the substrate temperature was 220° C.; and a high-frequency power of 100 W was supplied to parallel-plate electrodes. In other words, when the flow rate of silane was 1, the flow rate of dinitrogen monoxide was 20.

<ESR Measurement>

Figure 46A:
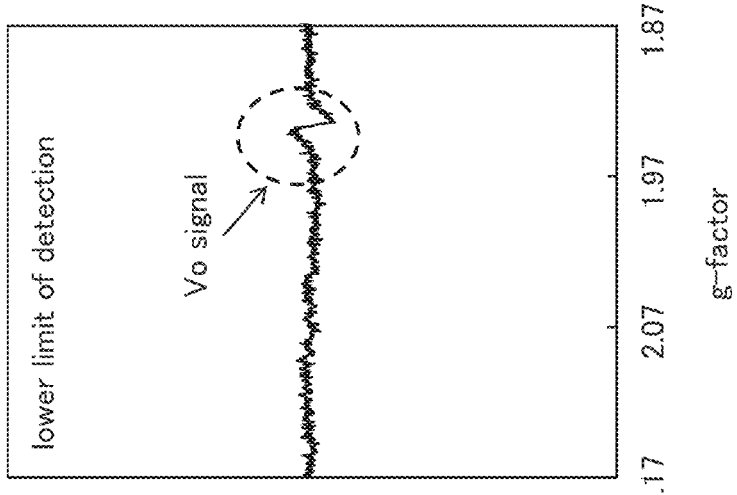
FIGS. 46A to 46C show ESR measurement results.
Figure 46B:
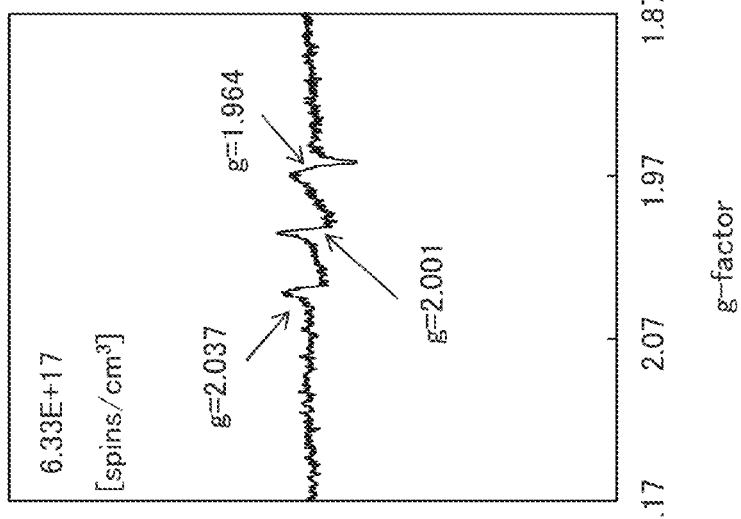
Figure 46C:
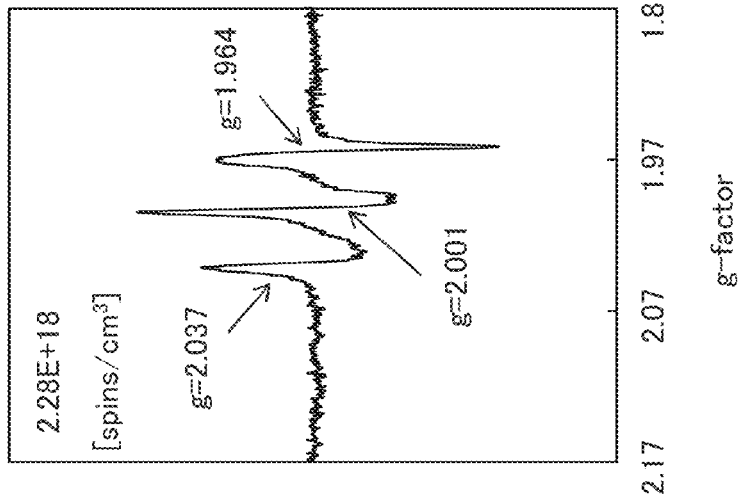

Samples B1, B4, and B5 were measured by ESR measurement. FIGS. 46A, 46B, and 46C show the ESR measurement results of Samples B4, B1, and B5, respectively. The conditions of the ESR measurement were the same as those of ESR measurement performed on Samples B1, B2, and B3.

As shown in FIGS. 46A and 46B, the spin densities of signals attributed to $NO_x$ are higher in Sample B4, which was used for comparison, than in Sample B1, and thus oxide insulating film of Samples B4 has a large number of defects. As shown in FIG. 46C, in Sample B5, which was used for comparison, the spin densities of signals attributed to $NO_x$ are lower than or equal to the lower limit of detection, and a signal attributed to $V_oH$ that appears at a g (g-factor) of 1.93 is observed.

Example 4

In this example, examination results of the $I_d$-$V_g$ characteristics and the reliability of fabricated transistors are described.

<Fabrication Methods 1 of Samples>

As Samples C1 to C3 of this example, transistors having the same structure as that of the transistor 10a in FIGS. 3A and 3B described in Embodiment 1 were fabricated.

<Sample C1>

First, a glass substrate was used as the substrate 11, and the gate electrode 13 was formed over the substrate 11.

The gate electrode 13 was formed in the following manner: a 100-nm-thick tungsten film was formed by a sputtering method, a mask was formed over the tungsten film by a photolithography process, and the tungsten film was partly etched using the mask.

Next, the gate insulating film 15 was formed over the gate electrode 13.

As the gate insulating film 15, a stack including a 400-nm-thick silicon nitride film and a 50-nm-thick silicon oxynitride film was used.

Note that the silicon nitride film was formed to have a three-layer structure of a first silicon nitride film, a second silicon nitride film, and a third silicon nitride film.

The first silicon nitride film was formed to a thickness of 50 nm under the following conditions: silane at a flow rate of 200 sccm, nitrogen at a flow rate of 2000 sccm, and an ammonia gas at a flow rate of 100 sccm were supplied to a treatment chamber of a plasma CVD apparatus as a source gas; the pressure in the treatment chamber was controlled to 100 Pa; and power of 2000 W was supplied with the use of a 27.12 MHz high-frequency power source.

The second silicon nitride film was formed to a thickness of 300 nm under the following conditions: silane at a flow rate of 200 sccm, nitrogen at a flow rate of 2000 sccm, and an ammonia gas at a flow rate of 2000 sccm were supplied to the treatment chamber of the plasma CVD apparatus as a source gas; the pressure in the treatment chamber was controlled to 100 Pa; and power of 2000 W was supplied with the use of a 27.12 MHz high-frequency power source.

The third silicon nitride film was formed to a thickness of 50 nm under the following conditions: silane at a flow rate of 200 sccm and nitrogen at a flow rate of 5000 sccm were supplied to the treatment chamber of the plasma CVD apparatus as a source gas; the pressure in the treatment chamber was controlled to 100 Pa; and power of 2000 W was supplied with the use of a 27.12 MHz high-frequency power source. Note that the first silicon nitride film, the second silicon nitride film, and the third silicon nitride film were each formed at a substrate temperature of 350° C.

The silicon oxynitride film was formed under the following conditions: silane at a flow rate of 20 sccm and dinitrogen monoxide at a flow rate of 3000 sccm were supplied to the treatment chamber of the plasma CVD apparatus as a source gas; the pressure in the treatment chamber was controlled to 40 Pa; and power of 100 W was supplied with the use of a 27.12 MHz high-frequency power source. Note that the silicon oxynitride film was formed at a substrate temperature of 350° C.

Next, the oxide semiconductor film 17 was formed to overlap with the gate electrode 13 with the gate insulating film 15 positioned therebetween.

Here, a 35-nm-thick oxide semiconductor film was formed over the gate insulating film 15 by a sputtering method, a mask was formed over the oxide semiconductor film by a photolithography process, and part of the oxide semiconductor film was etched with the use of the mask, whereby the oxide semiconductor film 17 (S2-IGZO in FIG. 47) was formed.

The oxide semiconductor film 17 was formed under the following conditions: an In—Ga—Zn oxide sputtering target containing In, Ga, and Zn at an atomic ratio of 1:1:1 was used; oxygen at a flow proportion of 50% was supplied as a sputtering gas into a treatment chamber of a sputtering apparatus; the pressure in the treatment chamber was controlled to 0.6 Pa; and direct-current power of 2.5 kW was supplied. Note that the oxide semiconductor film was formed at a substrate temperature of 170° C.

Next, heat treatment was performed at 450° C. in a nitrogen atmosphere for one hour, and after that, another heat treatment was performed in a mixed gas of nitrogen and oxygen at 450° C. for one hour.

Next, the pair of electrodes 19 and 20 in contact with the oxide semiconductor film 17 were formed.

First, a conductive film was formed over the gate insulating film and the oxide semiconductor film. As the conductive film, a 400-nm-thick aluminum film was formed over a 50-nm-thick tungsten film, and a 100-nm-thick titanium film was formed over the aluminum film. Then, a mask was formed over the conductive film by a photolithography process, and the conductive film was partly etched using the mask. Through the above steps, the pair of electrodes 19 and 20 were formed.

Next, the substrate was transferred to a treatment chamber in a reduced pressure and heated at 220° C. Then, the oxide semiconductor film 17 was exposed to oxygen plasma that was generated in a dinitrogen monoxide atmosphere by supply of a high-frequency power of 150 W to an upper electrode in the treatment chamber with the use of a 27.12 MHz high-frequency power source.

After that, the protective film 21 was formed over the oxide semiconductor film 17 and the pair of electrodes 19 and 20. In this case, the protective film 21 was formed to have a three-layer structure of a first oxide insulating film (P1-SiON in FIG. 47), a second oxide insulating film (P2-SiON in FIG. 47), and a nitride insulating film.

The 50-nm-thick first oxide insulating film was formed by a plasma CVD method under the following conditions: silane at a flow rate of 50 sccm and dinitrogen monoxide at a flow rate of 2000 sccm were used as a source gas; the pressure in the treatment chamber was 20 Pa; the substrate temperature was 220° C.; and a high-frequency power of 100 W was supplied to parallel-plate electrodes.

The formation conditions of the first oxide insulating film of Sample C1 is the same as those of the first oxide insulating film of Sample B1 described in Example 3.

The 400-nm-thick second oxide insulating film was formed by a plasma CVD method under the following conditions: silane at a flow rate of 160 sccm and dinitrogen monoxide at a flow rate of 4000 sccm were used as a source gas, the pressure in the treatment chamber was 200 Pa, the substrate temperature was 220° C., and a high-frequency power of 1500 W was supplied to parallel-plate electrodes. Under the above conditions, it is possible to form a silicon oxynitride film that contains oxygen at a higher proportion than oxygen in the stoichiometric composition so that part of oxygen is released by heating.

Next, heat treatment was performed to release water, nitrogen, hydrogen, and the like from the first oxide insulating film and the second oxide insulating film and to supply part of oxygen contained in the second oxide insulating film into the oxide semiconductor film. Here, the heat treatment was performed at 350° C. in a mixed atmosphere of nitrogen and oxygen for one hour.

Then, a 100-nm-thick nitride insulating film was formed over the second oxide insulating film. The nitride insulating film was formed by a plasma CVD method under the following conditions: silane at a flow rate of 50 sccm, nitrogen at a flow rate of 5000 sccm, and an ammonia gas at a flow rate of 100 sccm were used as a source gas; the pressure in the treatment chamber was 100 Pa; the substrate temperature was 350° C.; and a high-frequency power of 1000 W was supplied to parallel-plate electrodes.

Next, a planarization film was formed (not illustrated) over the protective film 21. Here, the protective film 21 was coated with a composition, and exposure and development were performed, so that a planarization film having an opening through which the pair of electrodes are partly exposed was formed. Note that as the planarization film, a 1,5-µm-thick acrylic resin was formed. Then, heat treatment was performed. The heat treatment was performed in a nitrogen atmosphere at 250° C. for one hour.

Then, an opening was formed in part of the protective film 21 so that the opening reached one of the pair of electrodes 19 and 20. The opening was formed by etching part of the protective film 21 using the planarization film as a mask.

Next, a pixel electrode was formed over the planarization film so that the pixel electrode was electrically connected to one of the pair of electrodes 19 and 20 through the opening formed in parts of the protective film 21 and the planarization film.

Here, as the pixel electrode, a conductive film of an indium oxide-tin oxide compound (ITO-$SiO_2$) containing silicon oxide was formed by a sputtering method. Note that the composition of a target used for forming the conductive film was $In_2O_3$:$SnO_2$:$SiO_2$=85:10:5 [wt %]. After that, heat treatment was performed at 250° C. in a nitrogen atmosphere for one hour.

Through the above process, Sample C1 of this example was fabricated.

<Sample C2>

Sample C2 was fabricated under the same conditions as those of Sample C1 except for the formation pressure of the first oxide insulating film.

In Sample C2, the first oxide insulating film was formed by a plasma CVD method under the following conditions: silane at a flow rate of 50 sccm and dinitrogen monoxide at a flow rate of 2000 sccm were used as a source gas; the pressure in the treatment chamber was 100 Pa; the substrate temperature was 220° C.; and a high-frequency power of 100 W was supplied to parallel-plate electrodes.

The formation conditions of the first oxide insulating film of Sample C2 is the same as those of the first oxide insulating film of Sample B2 described in Example 3.

<Sample C3>

Sample C3, which was used for comparison, was fabricated under the same conditions as those of Sample C1 except for the formation pressure of the first oxide insulating film.

In Sample C3, the first oxide insulating film was formed by a plasma CVD method under the following conditions: silane with a flow rate of 50 sccm and dinitrogen monoxide with a flow rate of 2000 sccm were used as a source gas; the pressure in the treatment chamber was 200 Pa; the substrate temperature was 220° C.; and a high-frequency power of 100 W was supplied to parallel-plate electrodes.

The formation conditions of the first oxide insulating film of Sample C3 is the same as those of the first oxide insulating film of Sample B3 described in Example 3.

<$I_d$-$V_g$ Characteristics>

Next, initial $I_d$-$V_g$ characteristics of the transistors included in Samples C1 to C3 were measured. Here, changes in characteristics of current flowing between a source and a drain (hereinafter referred to as drain current: $I_d$), that is, $I_d$-$V_g$ characteristics were measured under the following conditions: the substrate temperature was 25° C., the potential difference between the source and the drain (hereinafter referred to as drain voltage: $V_d$) was 1 V or 10 V, and the potential difference between the source and the gate electrodes (hereinafter referred to as gate voltage: $V_g$) was changed from −15 V to 15 V.

Figure 47:
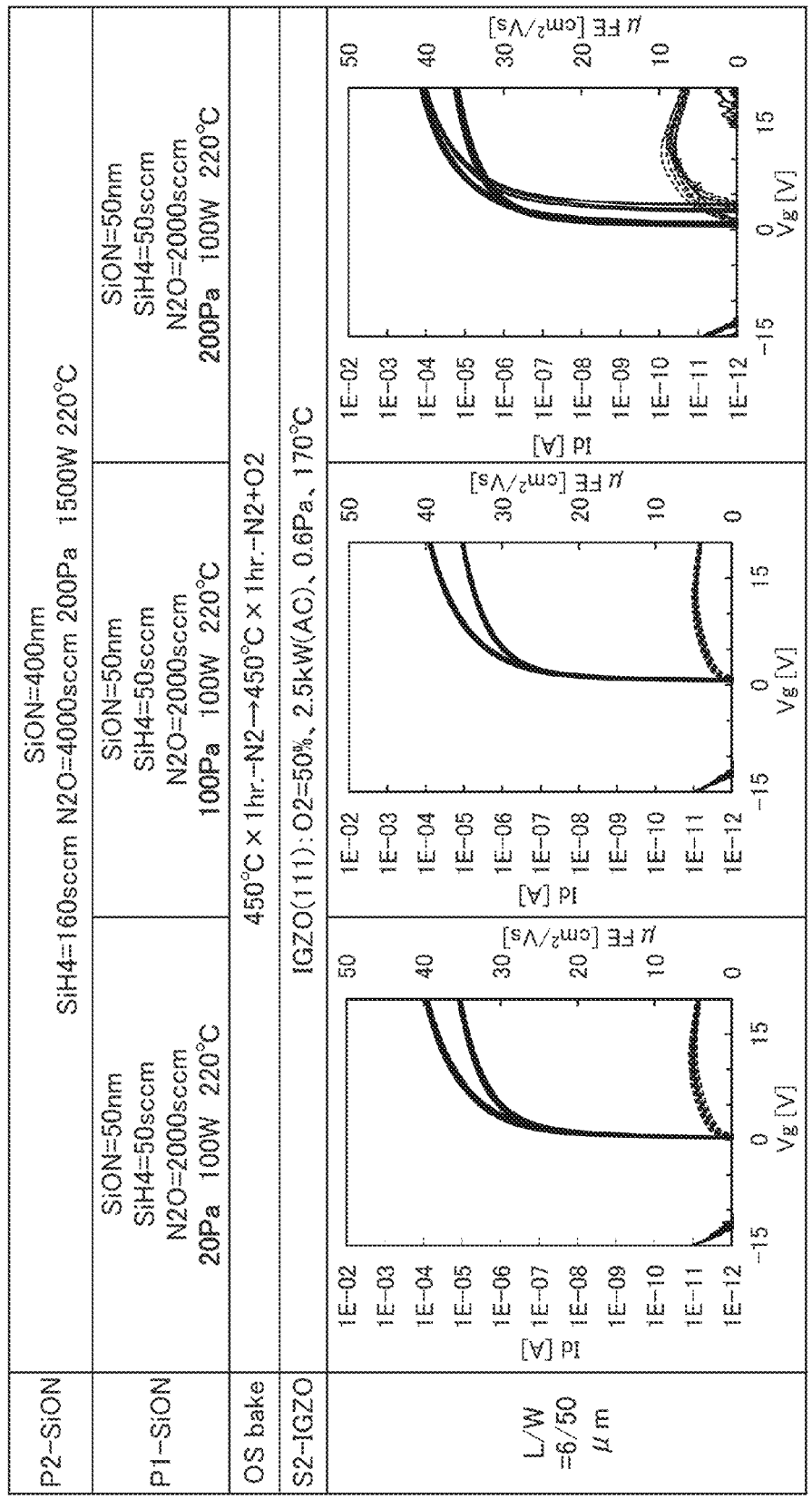
FIG. 47 shows Vg-Id characteristics of a transistor.

FIG. 47 shows $I_d$-$V_g$ characteristics of Samples C1 to C3. FIG. 47 shows the results of transistors each having a channel length L of 6 μm and a channel width W of 50 μm. In FIG. 47, the horizontal axis, the first vertical axis, and the second vertical axis represent gate voltage $V_g$, drain current $I_d$, and field-effect mobility, respectively. Here, to show field-effect mobility in a saturation region, field-effect mobility calculated when $V_d$=10 V is shown.

As shown in FIG. 47, Samples C1 and C2 have excellent initial $I_d$-$V_g$ characteristics. In contrast, Sample C3, which was used for comparison and in which the formation pressure of the first oxide insulating film was 200 Pa, has variations in $I_d$-$V_g$ characteristics.

<Gate BT Stress Test>

Next, a gate BT stress test (GBT) and a gate BT photostress test (PGBT) were performed on Samples C1 to C3.

First, a gate BT stress test and a gate BT photostress test were performed.

A measurement method of the gate BT stress test is described. First, initial $I_d$-$V_g$ characteristics of the transistor were measured as described above.

Next, the substrate temperature was kept constant at a given temperature (hereinafter referred to as stress temperature), the pair of electrodes serving as a source electrode and a drain electrode of the transistor was set at the same potential, and the gate electrode was supplied with a potential different from that of the pair of electrodes for a certain period of time (hereinafter referred to as stress time). Next, the substrate temperature was set as appropriate, and the electrical characteristics of the transistor were measured. As a result, a difference in threshold voltage and a difference in shift value between before and after the gate BT stress test can be obtained as the amount of change in the electrical characteristics.

Note that a stress test where negative voltage is applied to a gate electrode is called negative gate BT stress test (dark negative stress); whereas a stress test where positive voltage is applied is called positive gate BT stress test (dark positive stress). Note that a stress test where negative voltage is applied to a gate electrode while light emission is performed is called negative gate BT photostress test (negative photostress); whereas a stress test where positive voltage is applied while light emission is performed is called positive gate BT photostress test (positive photostress).

Here, the gate BT stress conditions were as follows: stress temperature was 60° C., stress time was 3600 seconds, −30 V or +30 V was applied to the gate electrode, and 0 V was applied to the pair of electrodes serving as the source electrode and the drain electrode. The electric field intensity applied to the gate insulating film was 0.66 MV/cm.

Under the same conditions as those of the above gate BT stress test, the gate BT photostress test was performed where the transistor was irradiated with white light with 10000 lx using an LED. Note that the $V_g$-$I_d$ characteristics of the transistor were measured at a temperature of 60° C. after each of the BT stress tests.

Figure 48:
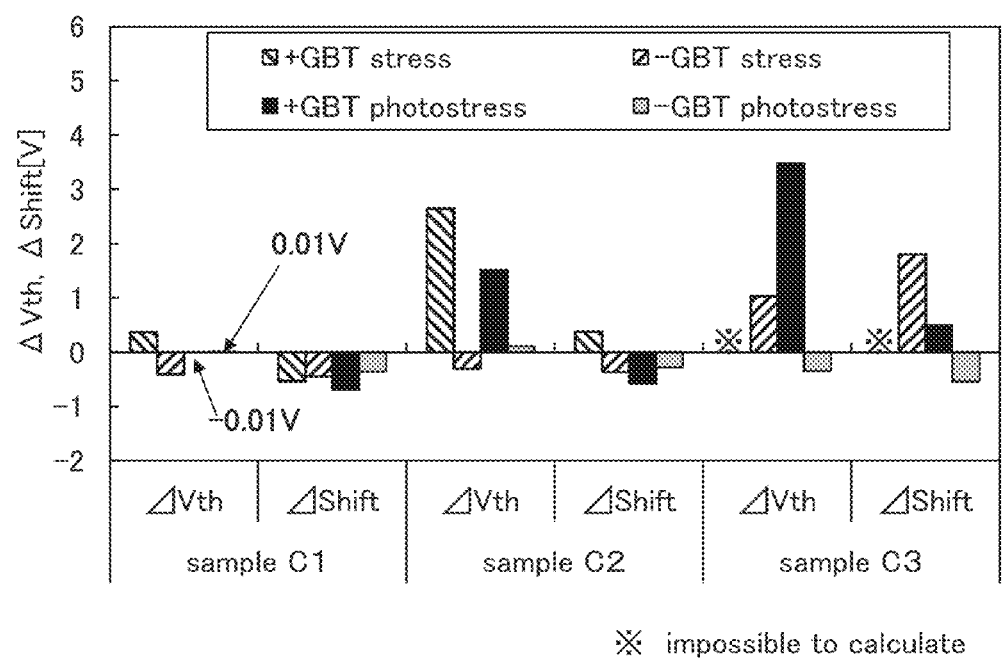
FIG. 48 shows the amount of change in the threshold voltage and the amount of change in the shift value of transistors after gate BT stress tests and after gate BT photostress tests.

FIG. 48 shows a difference between threshold voltage in the initial characteristics and threshold voltage after the BT stress test (i.e., the amount of change in threshold voltage ($\Delta V_{th}$)) and a difference in shift value (i.e., the amount of change in the shift value (∆Shift)) of respective transistors included in Samples C1 to C3.

Here, a threshold voltage and a shift value in this specification are described. Threshold voltage $V_{th}$ is defined as, in the $I_d$-$V_g$ curve where the horizontal axis represents gate voltage $V_g$ [V] and the vertical axis represents the square root of drain current $I_d$ ($I_d^{1/2}$) [$A^{1/2}$], gate voltage at the intersection point of the line of $I_d^{1/2}$=0 ($V_g$ axis) and the tangent to the curve at a point where the slope of the curve is the steepest. Note that here, the threshold voltage is calculated with a drain voltage $V_d$ of 10 V.

Furthermore, shift value Shift in this specification is defined as, in the $I_d$-$V_g$ curve where the horizontal axis represents the gate voltage $V_g$ [V] and the vertical axis represents the logarithm of the drain current $I_d$ [A], gate voltage at the intersection point of the line of $I_d$=1.0×10$^{-12}$ [A] and the tangent to the curve at a point where the slope of the curve is the steepest. Note that here, the shift value is calculated with a drain voltage $V_d$ of 10 V.

From FIG. 48, the amount of change in the threshold voltage and the amount of change in the shift value were smaller in Samples C1 and C2 than in Sample C3, which was used for comparison. In particular, in Sample C1, the amount of change in the threshold voltage and the amount of change in the shift value were small in the positive gate BT photostress test and the negative gate BT photostress test.

<Fabrication Methods 2 of Samples>

Next, Samples C4 and C5 were fabricated: the formation pressure of the first oxide insulating film was fixed at the pressure of Sample C1, which obtained the excellent $I_d$-$V_g$ characteristics and excellent results in the gate BT stress test, and the flow ratio of the deposition gas was changed. The $I_d$-$V_g$ characteristics and reliability of Samples C4 and C5 were measured. The fabrication methods of Samples C4 and C5 are shown below.

<Sample C4>

Sample C4 was fabricated under the same conditions as those of Sample C1 except for the flow ratio of the deposition gas for the first oxide insulating film.

In Sample C4, the first oxide insulating film was formed by a plasma CVD method under the following conditions: silane at a flow rate of 20 sccm and dinitrogen monoxide at a flow rate of 2000 sccm were used as a source gas; the pressure in the treatment chamber was 100 Pa; the substrate temperature was 220° C.; and a high-frequency power of 100 W was supplied to parallel-plate electrodes. In other words, when the flow rate of silane was 1, the flow rate of dinitrogen monoxide was 100.

The formation conditions of the first oxide insulating film of Sample C4 is the same as those of the first oxide insulating film of Sample B4 described in Example 3.

<Sample C5>

Sample C5, which was used for comparison, was fabricated under the same conditions as those of Sample C1 except for the flow ratio of the deposition gas for the first oxide insulating film.

In Sample C5, the first oxide insulating film was formed by a plasma CVD method under the following conditions: silane at a flow rate of 100 sccm and dinitrogen monoxide at a flow rate of 2000 sccm were used as a source gas; the pressure in the treatment chamber was 200 Pa; the substrate temperature was 220° C.; and a high-frequency power of 100 W was supplied to parallel-plate electrodes. In other words, when the flow rate of silane was 1, the flow rate of dinitrogen monoxide was 20.

The formation conditions of the first oxide insulating film of Sample C5 is the same as those of the first oxide insulating film of Sample B5 described in Example 3.

<$I_d$-$V_g$ Characteristics>

Next, initial $I_d$-$V_g$ characteristics of the transistors included in Samples C1, C4, and C5 were measured. Here, changes in drain current $I_d$, that is, $I_d$-$V_g$ characteristics were measured under the following conditions: the substrate temperature was 25° C., the drain voltage $V_d$ was 1 V or 10 V, and the gate voltage $V_g$ was changed from −15 V to 15 V.

Figure 49:
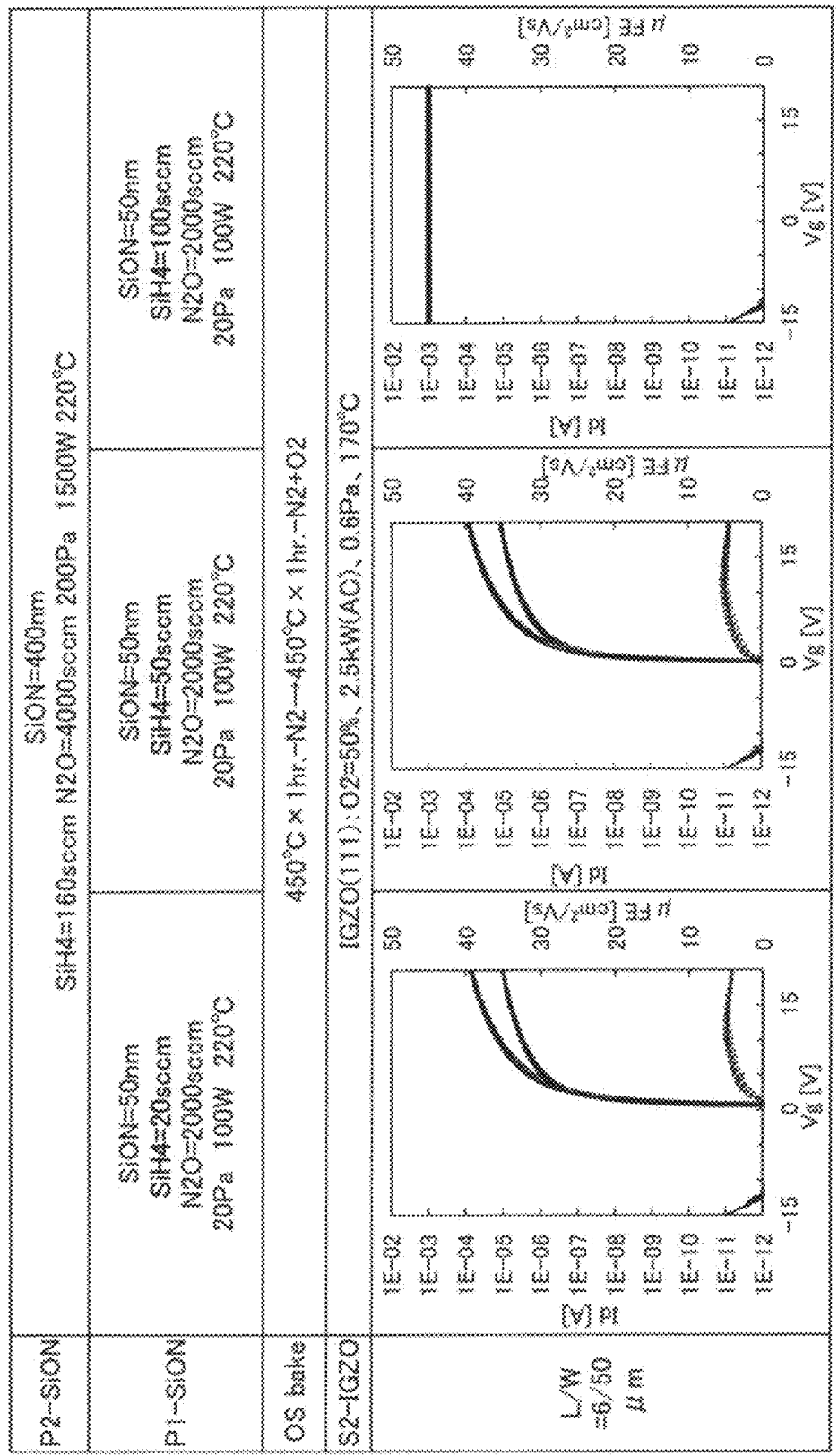
FIG. 49 shows Vg-Id characteristics of a transistor.

FIG. 49 shows $I_d$-$V_g$ characteristics of Samples C1, C4, and C5. FIG. 49 shows the results of transistors having a channel length L of 6 μm and a channel width W of 50 μm. In FIG. 49, the horizontal axis, the first vertical axis, and the second vertical axis represent gate voltage $V_g$, drain current $I_d$, and field-effect mobility, respectively. Here, to show field-effect mobility in a saturation region, field-effect mobility calculated when $V_d$=10 V is shown.

As shown in FIG. 49, Samples C1 and C4 have excellent initial $I_d$-$V_g$ characteristics. In contrast, in Sample C5, which was used for comparison, the on-off ratio of the drain current is not obtained; thus, the transistor characteristics are not obtained. In consideration of the results of Sample B5 described in Example 3, this is probably because the oxide semiconductor film contains a large number of oxygen vacancies.

<Gate BT Stress Test>

Next, a gate BT stress test and a gate BT photostress test were performed on Samples C1, C4, and C5.

Figure 50:
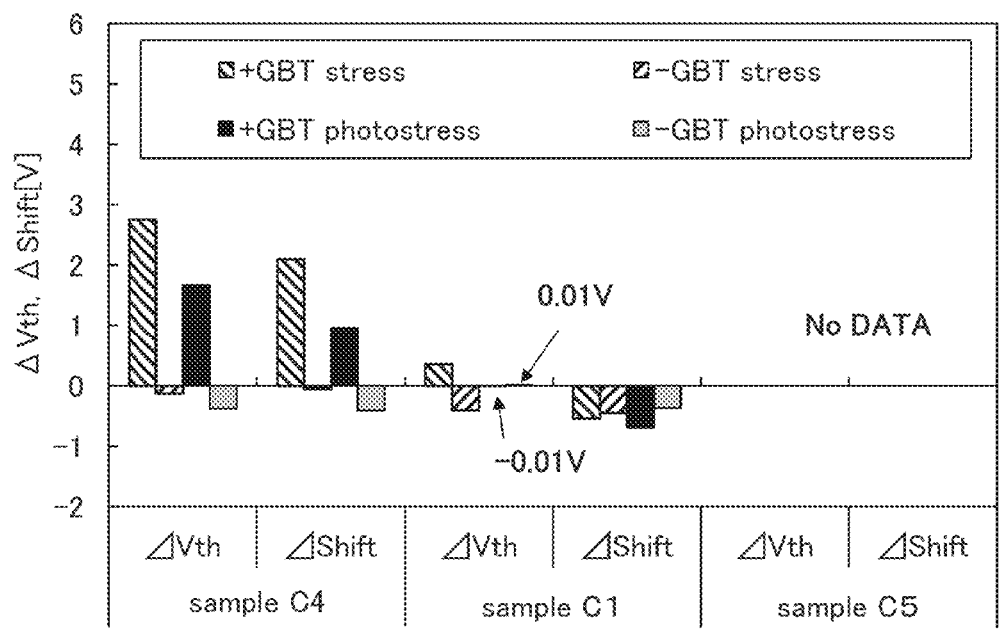
FIG. 50 shows the amount of change in the threshold voltage and the amount of change in the shift value of transistors after gate BT stress tests and after gate BT photostress tests.

Specifically, a positive gate BT stress test (dark positive stress), a negative gate BT stress test (dark negative stress), a positive gate BT photostress test (positive photostress), and a negative gate BT photostress test (negative photostress) were performed. FIG. 50 shows the difference between the initial threshold voltage and the threshold voltage after the gate BT stress test (i.e., the amount of change in the threshold voltage ($\Delta V_{th}$)) and the difference between the initial shift value and the shift value after the gate BT stress test (i.e., the amount of change in the shift value (ΔShift)) of transistors of Samples C1, C4, and C5.

As shown in FIG. 50, the amount of change in the threshold voltage and the amount of change in the shift value were greater in Sample C4, which was used for comparison and in which the flow ratio of dinitrogen monoxide to silane was 100 in forming the first oxide insulating film, than in Sample C1 of one embodiment of the present invention in which the flow ratio of dinitrogen monoxide to silane was 40.

According to Example 3 and this example, the oxide insulating film in contact with the oxide semiconductor film in Sample C1 has a small spin density, in other words, a small number of defects, and thus the amount of change in the threshold voltage and the amount of change in the shift value of the transistor are small.

<Fabrication Methods 3 of Samples>

Next, Samples C6 and C7 were fabricated by changing at least one of the flow ratio of the deposition gas, the pressure, and the formation temperature. The $I_d$-$V_g$ characteristics and reliability of Samples C6 and C7 were measured. The fabrication methods of Samples C6 and C7 are shown below.

<Sample C6>

Sample C6, which was used for comparison, was fabricated under the same conditions as those of Sample C1 except for the flow ratio of the deposition gas for the first oxide insulating film.

In Sample C6, the first oxide insulating film was formed by a plasma CVD method under the following conditions: silane at a flow rate of 30 sccm and dinitrogen monoxide at a flow rate of 4000 sccm were used as a source gas; the pressure in the treatment chamber was 40 Pa; the substrate temperature was 220° C.; and a high-frequency power of 100 W was supplied to parallel-plate electrodes. In other words, when the flow rate of silane was 1, the flow rate of dinitrogen monoxide was 133.

<Sample C7>

Sample C7, which was used for comparison, was fabricated under the same conditions as those of Sample C1 except for the flow ratio of the deposition gas for the first oxide insulating film.

In Sample C7, the first oxide insulating film was formed by a plasma CVD method under the following conditions: silane at a flow rate of 20 sccm and dinitrogen monoxide at a flow rate of 3000 sccm were used as a source gas; the pressure in the treatment chamber was 200 Pa; the substrate temperature was 350° C.; and a high-frequency power of 100 W was supplied to parallel-plate electrodes. In other words, when the flow rate of silane was 1, the flow rate of dinitrogen monoxide was 150.

<Gate BT Stress Test>

Next, a gate BT stress test and a gate BT photostress test were performed on Samples C6 and C7. Here, the description of the test results is omitted.

A sample having a structure similar to that described in Example 3 was fabricated using the same conditions as those of the oxide semiconductor film, the first oxide insulating film, and the second oxide insulating film of Sample C6. This sample is referred to as Sample B6. A sample having a structure described in Example 3 was fabricated using the same conditions as those the oxide semiconductor film, the first oxide insulating film, and the second oxide insulating film of Sample C7. This sample is referred to as Sample B7. ESR measurement was performed also in Samples B6 and B7, and the spin densityof signals attributed to $NO_x$ was obtained. Here, the description of the measurement results of ESR is omitted.

<Amount of Change in Spin Density and Amount of Change in Threshold Voltage of Oxide Insulating Film>

Figure 51:
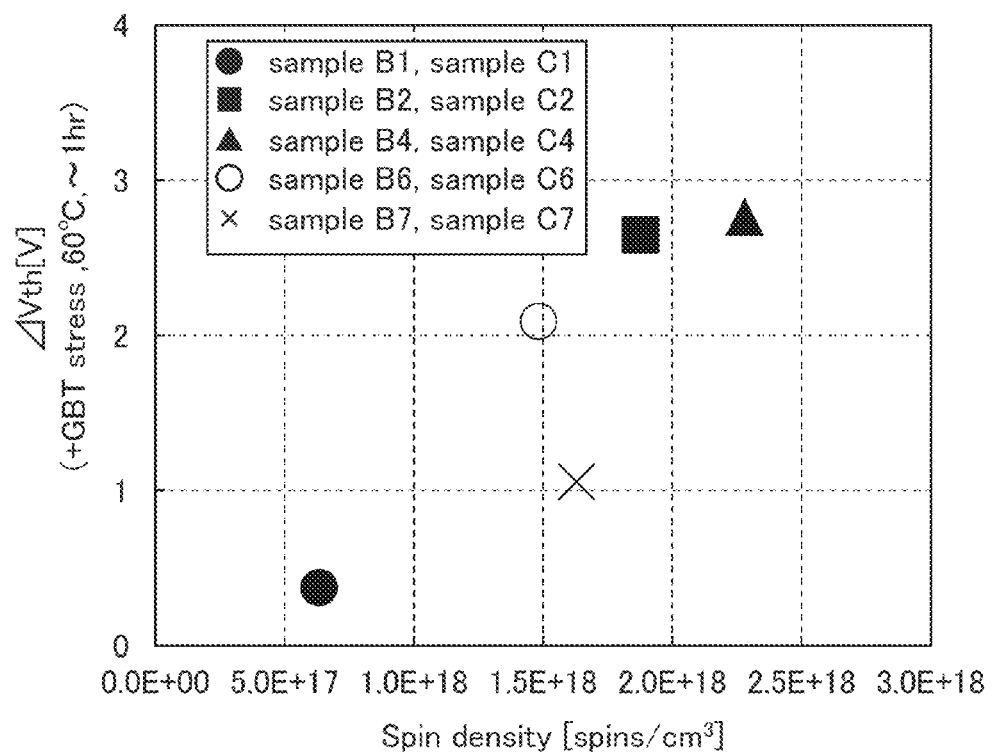
FIG. 51 shows the amount of change in spin density and the amount of change in threshold voltage.

FIG. 51 shows the spin density of the samples obtained in Example 3 and the amount of change in the threshold voltage of the samples obtained in Example 4. Here, the horizontal axis indicates the spin densities of Samples B1, B2, B4, B6, and B7, and the vertical axis indicates the amount of change in the threshold voltage due to a negative gate BT stress test (dark negative stress) of Samples C1, C2, C4, C6, and C7.

FIG. 51 shows that when the spin density of each sample is small, the amount of change in threshold voltage is small. In Samples B1, B2, B4, B6, B7, C1, C2, C4, C6, and C7, the formation conditions of the oxide semiconductor film and the second oxide insulating film were the same, and when the spin density of signals attributed to $NO_x$ of the first oxide insulating film is lower than, typically, $1\times10^{18}$ spins/$cm^3$, the amount of change in the threshold voltage was small.

Example 5

Described in this example is the diffusion of oxygen in an oxide insulating film that is in contact with an oxide semiconductor film and has a stacked-layer structure like the oxide insulating film described in Modification example 1 in Embodiment 1. In this example, the oxygen concentration was measured by SSDP-SIMS (SIMS measurement from the substrate side) to describe the diffusion of oxygen.

<Sample D1>

A method for fabricating Sample D1 is described.

First, a 100-nm-thick oxide semiconductor film (IGZO in FIGS. 52A and 52B) was formed over a glass substrate (Glass in FIGS. 52A and 52B) by a sputtering method using an In—Ga—Zn oxide sputtering target where In:Ga:Zn=1:1:1 (atomic ratio) and using oxygen and argon as sputtering gases.

Next, a first oxide insulating film (SiON in FIGS. 52A and 52B) and a second oxide insulating film (SP-SiO$_x$ in FIGS. 52A and 52B) were formed over the oxide semiconductor film. As the second oxide insulating film, a silicon oxide film containing oxygen at a higher proportion than oxygen in the stoichiometric composition was formed.

Here, as the first oxide insulating film, a 30-nm-thick silicon oxynitride film was formed by a plasma CVD method under the following conditions: silane at a flow rate of 30 sccm and dinitrogen monoxide at a flow rate of 4000 sccm were used as a source gas, the pressure in the treatment chamber was 200 Pa, the substrate temperature was 220° C., and a high-frequency power of 150 W was supplied to parallel-plate electrodes.

As the second oxide insulating film, a 100-nm-thick silicon oxide film containing $^{18}$O was formed by a sputtering method in which a silicon wafer was placed in a treatment chamber of a sputtering apparatus, and $^{18}$O (an isotope of $^{16}$O) with a flow rate of 300 sccm as a source gas was supplied to the treatment chamber.

Through the above process, Sample D1 was fabricated.

<Sample D2>

A method for fabricating Sample D2 is described.

Sample D1 was heated at 350° C. in an atmosphere of a mixed gas containing nitrogen and oxygen for one hour.

Through the above process, Sample D2 was fabricated.

<SIMS Analysis>

Next, the concentration profiles of $^{18}$O contained in the first oxide insulating films SiON and the oxide semiconductor films IGZO of Samples D1 and D2 were measured by SIMS. Here, the concentration of $^{18}$O was measured from the glass substrate side to the second oxide insulating film.

Figure 52A:
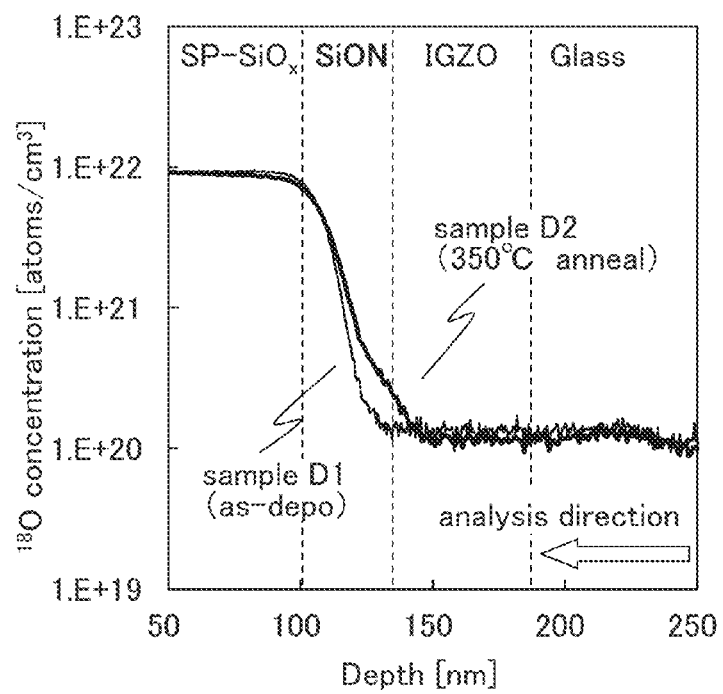
FIGS. 52A and 52B show results of SIMS analysis.
Figure 52B:
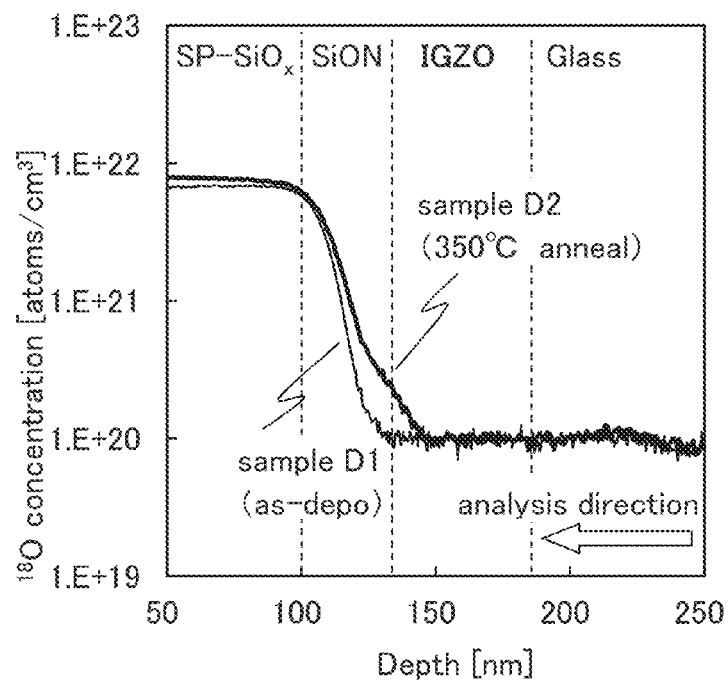

FIGS. 52A and 52B each show the concentration profiles of $^{18}$O that were obtained by the SIMS measurement. The first oxide insulating film SiON was quantified and the results are shown in FIG. 52A, and the oxide semiconductor film IGZO was quantified and the results are shown in FIG. 52B. In FIGS. 52A and 52B, thin solid line and the bold solid line indicate the measurement results of Samples D1 and D2, respectively.

As shown in FIG. 52A, the concentration of $^{18}$O increases in the first oxide insulating film SiON in Sample D2. As shown in FIG. 52B, the concentration of $^{18}$O increases in the oxide semiconductor film IGZO on the first oxide insulating film SiON side in Sample D2.

The above results indicate that oxygen is diffused by heat treatment from the second oxide insulating film SP-SiO$_x$ through the first oxide insulating film SiON to the oxide semiconductor film IGZO.

Example 6

Described in this example is heat treatment and the number of oxygen vacancies in an oxide insulating film that is in contact with an oxide semiconductor film and has a stacked-layer structure like the oxide insulating film described in Modification example 1 in Embodiment 1. In this example, the number of oxygen vacancies in the oxide semiconductor film is described using the measurement results of ESR.

<Sample E1>

A method for fabricating Sample E1 is described.

First, a 35-nm-thick oxide semiconductor film was formed over a quartz substrate by a sputtering method using an In—Ga—Zn oxide sputtering target where In:Ga:Zn=1:1:1 (the ratio of the number of atoms) and using a sputtering gas of oxygen and argon.

Next, heat treatment was performed at 450° C. in a nitrogen atmosphere for one hour, and then another heat treatment was performed at 450° C. in a mixed gas of nitrogen and oxygen for one hour.

Next, a first oxide insulating film and a second oxide insulating film were formed over the oxide semiconductor film. As the second oxide insulating film, a silicon oxynitride film containing oxygen at a higher proportion than oxygen in the stoichiometric composition was formed.

Here, as the first oxide insulating film, a 50-nm-thick silicon oxynitride film was formed. The first oxide insulating film was formed by a plasma CVD method under the following conditions: silane at a flow rate of 30 sccm and dinitrogen monoxide at a flow rate of 4000 sccm were used as a source gas, the pressure in the treatment chamber was 40 Pa, the substrate temperature was 220° C., and a high-frequency power of 150 W was supplied to parallel-plate electrodes.

As the second oxide insulating film, a 400-nm-thick silicon oxynitride film was formed. The second oxide insulating film was formed by a plasma CVD method under the following conditions: silane at a flow rate of 160 sccm and dinitrogen monoxide at a flow rate of 4000 sccm were used as a source gas, the pressure in the treatment chamber was 200 Pa, the substrate temperature was 220° C., and a high-frequency power of 1500 W was supplied to parallel-plate electrodes.

Through the above process, Sample E1 was fabricated.

<Sample E2>

A method for forming Sample E2 is described.

Sample E1 was heated at 350° C. in an atmosphere of a mixed gas containing nitrogen and oxygen for one hour.

Through the above process, Sample E2 was formed.

<ESR Measurement>

Next, Samples E1 and E2 were measured by ESR measurement. In the ESR measurement performed at a predetermined temperature, a value of a magnetic field (H$_0$) where a microwave is absorbed is used for an equation g=hv/βH$_0$; thus, a parameter "g-factor" can be obtained. Note that the frequency of the microwave is denoted by v, and the Planck constant and the Bohr magneton are denoted by, respectively, h and β that are both constants.

Here, the ESR measurement was performed under the following conditions. Here, the ESR measurement was performed under the following conditions: the measurement temperature was room temperature (25° C.), the high-frequency power (power of microwaves) of 8.9 GHz was 20 mW, and the direction of a magnetic field was parallel to a surface of each sample. Note that the lower limit of detection of the spin density of a signal attributed to V$_o$H in the IGZO film, which appeared at a g (g-factor) of 1.93, was 1×10$^{17}$ spins/cm$^3$.

Figure 53A:
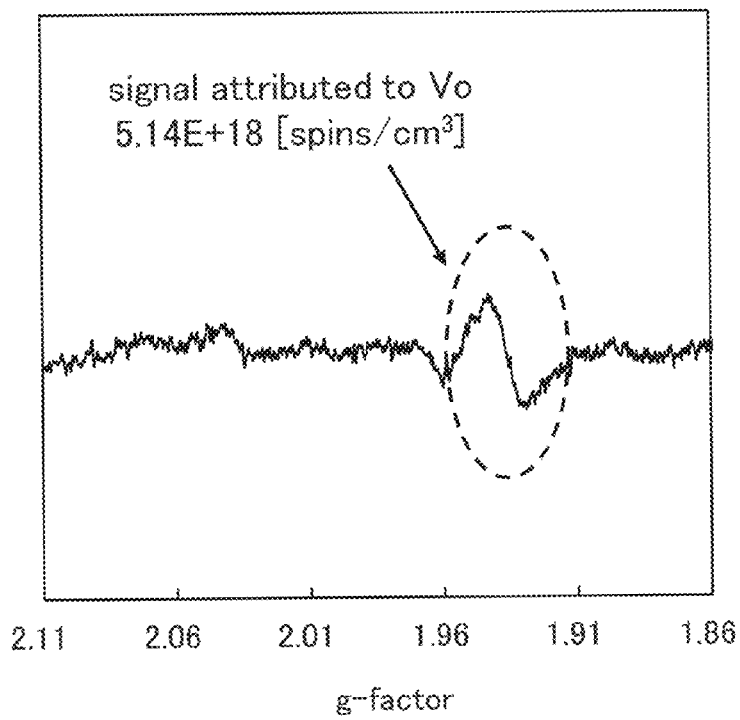
FIGS. 53A and 53B show ESR measurement results.
Figure 53B:
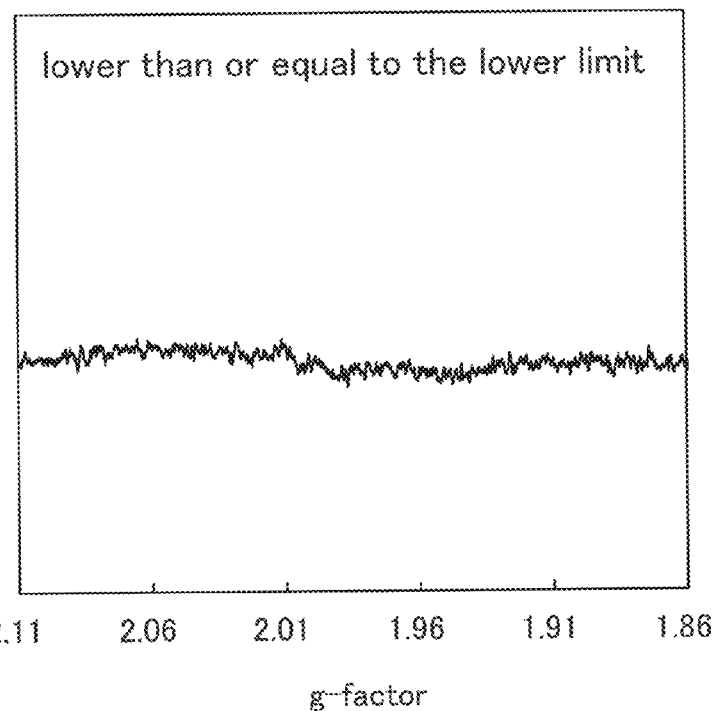

FIGS. 53A and 53B show ESR spectra obtained by ESR measurement. FIGS. 53A and 53B show ESR spectra of the oxide semiconductor films of Samples E1 and E2, respectively.

As shown in FIG. 53A, in Sample E1, a signal attributed to $V_oH$ appears at a g (g-factor) of 1.93. The number of spins absorbed at a g (g-factor) of 1.93 is $5.14\times10^{18}$ spins/cm$^3$. This means that the oxide semiconductor film contains $V_oH$.

In contrast, as shown in FIG. 53B, in Sample E2, a signal attributed to $V_oH$ appearing at a g (g-factor) of 1.93 is not observed.

The above results confirmed that $V_oH$ in the oxide semiconductor film can be reduced by heat treatment. Furthermore, the results described in Example 5 reveal that oxygen contained in the oxide insulating film containing oxygen at a higher proportion than oxygen in the stoichiometric composition is diffused to the oxide semiconductor film by heat treatment. This means that when oxygen is diffused to the oxide semiconductor film by heat treatment, $V_oH$ in the oxide semiconductor film can be reduced.

Example 7

In this example, oxidizing power of plasma caused when an oxide insulating film was exposed to plasma generated by using dinitrogen monoxide or oxygen as an oxidizing gas is described.

First, a method of fabricating each sample is described.

A 100-nm-thick silicon oxynitride film was formed as an oxide insulating film containing nitrogen over a quartz substrate. Then, the silicon oxynitride film was exposed to plasma that was generated in an oxidizing gas atmosphere. Conditions of the formation of the silicon oxynitride film and conditions of plasma treatment are described below.

The silicon oxynitride film was formed under the conditions as follows: the quartz substrate was placed in a treatment chamber of a plasma CVD apparatus; silane with a flow rate of 1 sccm and dinitrogen monoxide with a flow rate of 800 sccm that were used as a source gas were supplied to the treatment chamber; the pressure in the treatment chamber was controlled to 40 Pa: and the power of 150 W was supplied with the use of a 60 MHz high-frequency power source. Further, the temperature of the quartz substrate at the formation of the silicon oxynitride film was 400° C. Note that the plasma CVD apparatus used in this example is a parallel plate plasma CVD apparatus in which the electrode area is 615 cm$^2$, and the power per unit area (power density) into which the supplied power is converted is 0.24 W/cm$^2$.

Plasma was generated in such a manner that dinitrogen monoxide or oxygen with a flow rate of 900 sccm was supplied to the treatment chamber, the pressure in the treatment chamber was controlled to 200 Pa, and power of 900 W (1.46 W/cm$^2$) was supplied with the use of a 60 MHz high-frequency power source. Further, the temperature of the quartz substrate at the time of plasma generation was 200° C. Here, a sample that was exposed to plasma generated in a dinitrogen monoxide atmosphere is referred to as Sample F1. In addition, a sample that was exposed to plasma generated in an oxygen atmosphere is referred to as Sample F2.

Next, TDS analyses were performed on Samples F1 and F2.

The peaks of the curves shown in the results obtained from TDS analyses appear due to release of atoms or molecules contained in the analyzed samples (in this example, Samples F1 and F2) to the outside. The total amount of the atoms or molecules released to the outside corresponds to the integral value of the peak. Thus, with the degree of the peak intensity, the number of the atoms or molecules contained in the silicon oxynitride film can be evaluated.

Figure 54A:
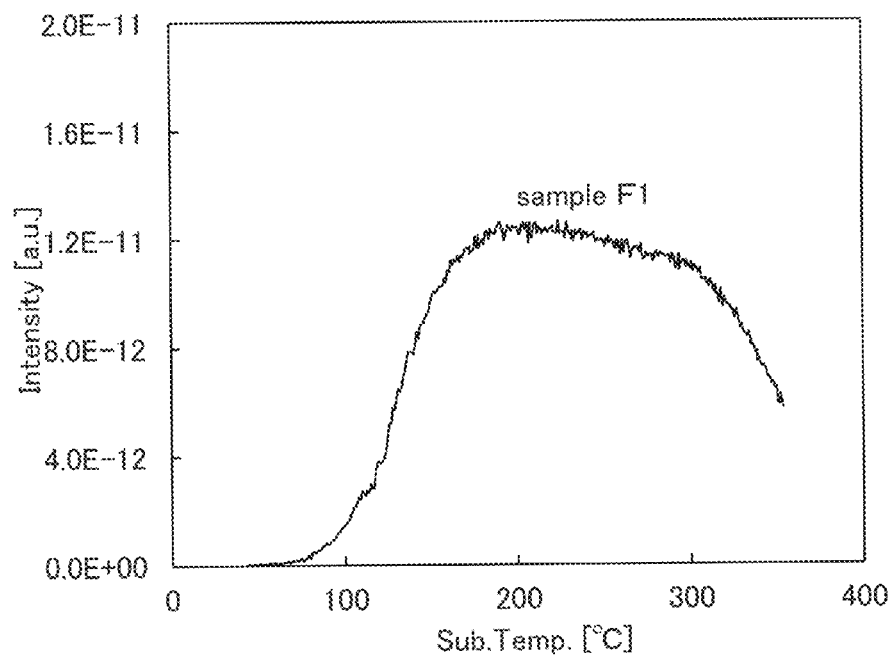
FIGS. 54A and 54B show results of TDS analysis.
Figure 54B:
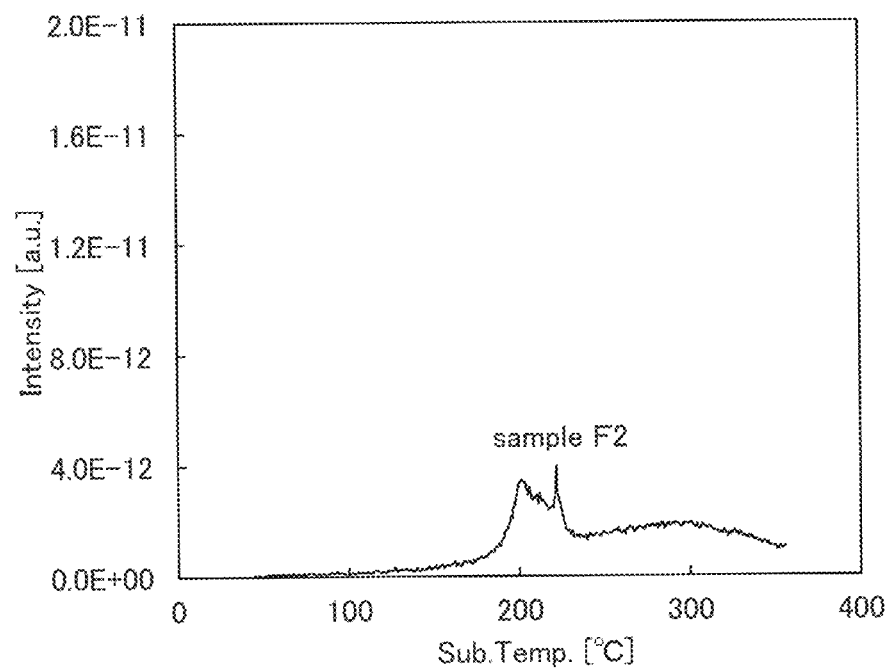

FIGS. 54A and 54B show the results of the TDS analyses on Samples F1 and F2. FIGS. 54A and 54B are each a graph showing the number of released oxygen molecules versus the substrate temperature.

FIGS. 54A and 54B demonstrate that the silicon oxynitride film that was exposed to plasma generated in a dinitrogen monoxide atmosphere has higher TDS intensity of oxygen molecules than the silicon oxynitride film that was exposed to plasma generated in an oxygen atmosphere. As described above, plasma generated in a dinitrogen monoxide atmosphere has stronger oxidizing power than plasma generated in an oxygen atmosphere and enables formation of a film containing excess oxygen, from which oxygen is released easily by heating.

Accordingly, in the case where an oxide insulating film is formed over an oxide semiconductor film by a plasma CVD method, a film containing excess oxygen, from which oxygen can be released by heating, can be formed by using a deposition gas containing silicon and dinitrogen monoxide as a source gas. Note that when dinitrogen monoxide is used as a source gas, nitrogen is contained in the oxide insulating film; therefore, an oxide insulating film containing nitrogen and excess oxygen can be obtained.

This application is based on Japanese Patent Application serial no. 2013-173958 filed with Japan Patent Office on Aug. 23, 2013, the entire contents of which are hereby incorporated by reference.

What is claimed is:

1. A semiconductor device comprising:
   a gate insulating film;
   an oxide semiconductor film; and
   a protective film,
   wherein the oxide semiconductor film is provided between the gate insulating film and the protective film,
   wherein at least one of the gate insulating film and the protective film has a spin density obtained by an electron spin resonance spectrum, and
   wherein the spin density is higher than or equal to $1\times10^{17}$ spins/cm$^3$ and lower than $1\times10^{18}$ spins/cm$^3$.

2. The semiconductor device according to claim 1, wherein the spin density is attributed to nitrogen oxide.

3. The semiconductor device according to claim 2, wherein the nitrogen oxide is nitrogen monoxide or nitrogen dioxide.

4. The semiconductor device according to claim 1, further comprising a gate electrode,
   wherein the gate electrode is under the gate insulating film.

5. The semiconductor device according to claim 1, further comprising a gate electrode,
   wherein the gate electrode is over the gate insulating film.

6. The semiconductor device according to claim 1, further comprising a pair of electrodes,
   wherein the pair of electrodes are provided between the oxide semiconductor film and the protective film.

7. The semiconductor device according to claim 1, further comprising a pair of electrodes,
   wherein the pair of electrodes are provided between the oxide semiconductor film and the gate insulating film.

8. The semiconductor device according to claim 1, wherein the oxide semiconductor film comprises indium, gallium, and zinc.

9. The semiconductor device according to claim 1, wherein the oxide semiconductor film comprises indium, tin, and zinc.

10. A semiconductor device comprising:
a gate insulating film;
an oxide semiconductor film; and
a protective film,
wherein the oxide semiconductor film is provided between the gate insulating film and the protective film, and
wherein at least one of the gate insulating film and the protective film has a spin density obtained by an electron spin resonance spectrum of lower than $1\times10^{18}$ spins/cm$^3$,
wherein the electron spin resonance spectrum comprises a first signal, a second signal, and a third signal,
wherein a first signal appears at a g-factor of greater than or equal to 2.037 and smaller than or equal to 2.039,
wherein a second signal appears at a g-factor of greater than or equal to 2.001 and smaller than or equal to 2.003, and
wherein a third signal appears at a g-factor of greater than or equal to 1.964 and smaller than or equal to 1.966.

11. The semiconductor device according to claim 10, wherein a split width of the first and second signals and a split width of the second and third signals are each 5 mT.

12. The semiconductor device according to claim 10, wherein the spin density is higher than or equal to $1\times10^{17}$ spins/cm$^3$ and lower than $1\times10^{18}$ spins/cm$^3$.

13. The semiconductor device according to claim 10, wherein the spin density is attributed to nitrogen oxide.

14. The semiconductor device according to claim 13, wherein the nitrogen oxide is nitrogen monoxide or nitrogen dioxide.

15. The semiconductor device according to claim 10, further comprising a gate electrode,
wherein the gate electrode is under the gate insulating film.

16. The semiconductor device according to claim 10, further comprising a gate electrode,
wherein the gate electrode is over the gate insulating film.

17. The semiconductor device according to claim 10, further comprising a pair of electrodes,
wherein the pair of electrodes are provided between the oxide semiconductor film and the protective film.

18. The semiconductor device according to claim 10, further comprising a pair of electrodes,
wherein the pair of electrodes are provided between the oxide semiconductor film and the gate insulating film.

19. The semiconductor device according to claim 10, wherein the oxide semiconductor film comprises indium, gallium, and zinc.

20. The semiconductor device according to claim 10, wherein the oxide semiconductor film comprises indium, tin, and zinc.

* * * * *